United States Patent
Takahashi et al.

(10) Patent No.: US 10,991,761 B2
(45) Date of Patent: Apr. 27, 2021

(54) THREE-DIMENSIONAL CROSS-POINT MEMORY DEVICE CONTAINING INTER-LEVEL CONNECTION STRUCTURES AND METHOD OF MAKING THE SAME

(71) Applicant: SANDISK TECHNOLOGIES LLC, Addison, TX (US)

(72) Inventors: Yuji Takahashi, San Jose, CA (US); Wei Kuo Shih, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/410,376

(22) Filed: May 13, 2019

(65) Prior Publication Data
US 2020/0365654 A1    Nov. 19, 2020

(51) Int. Cl.
*H01L 23/528* (2006.01)
*H01L 27/24* (2006.01)
(Continued)

(52) U.S. Cl.
CPC .......... *H01L 27/249* (2013.01); *H01L 23/528* (2013.01); *H01L 23/5226* (2013.01);
(Continued)

(58) Field of Classification Search
CPC ............. H01L 45/1233; H01L 27/2481; H01L 45/144; H01L 27/11582; H01L 45/06;
(Continued)

(56) References Cited

U.S. PATENT DOCUMENTS

| | | |
|---|---|---|
| 6,531,727 B2 | 3/2003 | Forbes et al. |
| 6,559,491 B2 | 5/2003 | Forbes et al. |

(Continued)

OTHER PUBLICATIONS

Notification of Transmittal of the International Search Report and Written Opinion of the International Search Authority or International Patent Application No. PCT/US2020/020966, dated Jul. 3, 2020, 11 pages.

(Continued)

*Primary Examiner* — Cuong B Nguyen
*Assistant Examiner* — Samuel Park
(74) *Attorney, Agent, or Firm* — The Marbury Law Group PLLC

(57) ABSTRACT

First electrically conductive lines, first pillar structures, second electrically conductive lines, second pillar structures, third electrically conductive lines, third pillar structures, fourth electrically conductive lines, and fourth pillar structures are formed over a substrate. Each pillar structure includes a memory element. Interconnection structures are formed on the first electrically conductive lines. The first electrically conductive lines may have thinned segments located outside the area of the arrays of memory elements, and the interconnection structures may be formed on the thinned segments. Alternatively or additionally, the interconnection structures may include a vertical stack of a first conductive via structure contacting a respective one of the first electrically conductive lines, a conductive pad structure, and a second conductive via structure. Fifth electrically conductive lines may be formed on top surfaces of the second two-dimensional array of memory elements and on top surface of the interconnection structures.

7 Claims, 79 Drawing Sheets

(51) Int. Cl.
*H01L 45/00* (2006.01)
*H01L 23/522* (2006.01)

(52) U.S. Cl.
CPC .......... *H01L 27/2427* (2013.01); *H01L 45/06* (2013.01); *H01L 45/1233* (2013.01); *H01L 45/1253* (2013.01); *H01L 45/1683* (2013.01); *H01L 45/144* (2013.01)

(58) Field of Classification Search
CPC ....... H01L 2924/00014; H01L 27/2409; H01L 45/146; H01L 45/04; H01L 27/11575; H01L 27/2427; H01L 45/141; H01L 45/08; H01L 27/0688; H01L 27/11565; H01L 27/2436; H01L 45/1226; H01L 23/5226; H01L 45/1206; H01L 45/147; H01L 45/1675; H01L 27/2454; H01L 21/76805; H01L 27/101; H01L 27/11529; H01L 27/249; H01L 45/1683; H01L 23/528; H01L 45/1253; H01L 45/085; H01L 27/1157; H01L 27/11573; H01L 27/11556; H01L 27/2463; H01L 45/16
See application file for complete search history.

(56) References Cited

U.S. PATENT DOCUMENTS

| | | |
|---|---|---|
| 6,709,926 B2 | 3/2004 | Chidambarrao et al. |
| 6,777,292 B2 | 8/2004 | Lee et al. |
| 6,781,187 B2 | 8/2004 | Owa |
| 6,818,491 B2 | 11/2004 | Lee et al. |
| 6,870,759 B2 | 3/2005 | Tsang |
| 6,873,010 B2 | 3/2005 | Chidambarrao et al. |
| 6,890,812 B2 | 5/2005 | Forbes et al. |
| 6,909,639 B2 | 6/2005 | Park et al. |
| 6,995,057 B2 | 2/2006 | Forbes et al. |
| 6,998,664 B2 | 2/2006 | Vollrath et al. |
| 7,005,350 B2 | 2/2006 | Walker et al. |
| 7,015,525 B2 | 3/2006 | Forbes et al. |
| 7,221,588 B2 | 5/2007 | Fasoli et al. |
| 7,365,355 B2 | 4/2008 | Parkinson |
| 7,402,855 B2 | 7/2008 | Kurjanowicz |
| 7,446,355 B2 | 11/2008 | Lin et al. |
| 7,497,007 B2 | 3/2009 | Wang et al. |
| 7,499,315 B2 | 3/2009 | Lowrey et al. |
| 7,505,321 B2 | 3/2009 | Scheuerlein et al. |
| 7,508,714 B2 | 3/2009 | Fasoli et al. |
| 7,510,930 B2 | 3/2009 | Lee et al. |
| 7,642,138 B2 | 1/2010 | Kurjanowicz |
| 7,679,137 B2 | 3/2010 | Lee et al. |
| 7,684,245 B2 | 3/2010 | Schumann et al. |
| 7,706,178 B2 | 4/2010 | Parkinson |
| 7,715,228 B2 | 5/2010 | Deak |
| 7,719,082 B2 | 5/2010 | Aratani et al. |
| 7,755,162 B2 | 7/2010 | Kurjanowicz et al. |
| 7,795,090 B2 | 9/2010 | Lin et al. |
| 7,839,674 B2 | 11/2010 | Lowrey et al. |
| 7,848,155 B2 | 12/2010 | Kim et al. |
| 7,861,401 B2 | 1/2011 | Wang et al. |
| 7,864,568 B2 | 1/2011 | Fujisaki et al. |
| 7,986,498 B2 | 7/2011 | Wang et al. |
| 8,026,574 B2 | 9/2011 | Kurjanowicz et al. |
| 8,097,498 B2 | 1/2012 | Purayath et al. |
| 8,283,751 B2 | 10/2012 | Kurjanowicz |
| 8,310,864 B2 | 11/2012 | Lung et al. |
| 8,338,224 B2 | 12/2012 | Yoon et al. |
| 8,497,182 B2 | 7/2013 | Lung |
| 8,598,653 B2 | 12/2013 | Juengling |
| 8,884,357 B2 | 11/2014 | Wang et al. |
| 8,884,397 B2 | 11/2014 | Aratani et al. |
| 8,923,050 B2 | 12/2014 | Cernea et al. |
| 8,952,470 B2 | 2/2015 | Lupino et al. |
| 8,981,325 B2 | 3/2015 | Aratani et al. |
| 9,076,962 B2 | 7/2015 | Hong et al. |
| 9,099,532 B2 | 8/2015 | Sel et al. |
| 9,105,468 B2 | 8/2015 | Rabkin et al. |
| 9,123,572 B2 | 9/2015 | Kurjanowicz |
| 9,123,890 B2 | 9/2015 | Matamis et al. |
| 9,165,933 B2 | 10/2015 | Rabkin et al. |
| 9,236,568 B2 | 1/2016 | Ling |
| 9,290,199 B2 | 3/2016 | Bando et al. |
| 9,412,821 B2 | 8/2016 | Simsek-Ege et al. |
| 9,437,813 B2 | 9/2016 | Matamis et al. |
| 9,443,907 B2 | 9/2016 | Rabkin et al. |
| 9,466,644 B2 | 10/2016 | Matamis et al. |
| 9,524,980 B2 | 12/2016 | Lue |
| 9,653,617 B2 | 5/2017 | Zhou et al. |
| 9,698,156 B2 | 7/2017 | Lue |
| 9,755,140 B2 | 9/2017 | Lim et al. |
| 9,853,053 B2 | 12/2017 | Lupino et al. |
| 10,164,172 B2 | 12/2018 | Hong et al. |
| 10,199,434 B1 | 2/2019 | Lee et al. |
| 10,211,218 B2 | 2/2019 | Lue |
| 2002/0109173 A1 | 8/2002 | Forbes et al. |
| 2002/0109176 A1 | 8/2002 | Forbes et al. |
| 2002/0191453 A1 | 12/2002 | Owa |
| 2002/0196690 A1 | 12/2002 | Matsumoto |
| 2003/0218199 A1 | 11/2003 | Forbes et al. |
| 2003/0224573 A1 | 12/2003 | Chidambarrao et al. |
| 2004/0007721 A1 | 1/2004 | Forbes et al. |
| 2004/0027894 A1 | 2/2004 | Lee et al. |
| 2004/0029335 A1 | 2/2004 | Lee et al. |
| 2004/0075111 A1 | 4/2004 | Chidambarrao et al. |
| 2004/0124466 A1 | 7/2004 | Walker et al. |
| 2004/0125629 A1 | 7/2004 | Scheuerlein et al. |
| 2004/0196711 A1 | 10/2004 | Vollrath et al. |
| 2004/0213048 A1 | 10/2004 | Park et al. |
| 2004/0264239 A1 | 12/2004 | Tsang |
| 2005/0122779 A1 | 6/2005 | Fasoli et al. |
| 2005/0183945 A1 | 8/2005 | Nagashima |
| 2005/0190617 A1 | 9/2005 | Forbes et al. |
| 2005/0226036 A1 | 10/2005 | Aratani et al. |
| 2005/0258027 A1 | 11/2005 | Nagashima |
| 2006/0097342 A1 | 5/2006 | Parkinson |
| 2006/0097343 A1 | 5/2006 | Parkinson |
| 2006/0171194 A1 | 8/2006 | Lowrey et al. |
| 2006/0244099 A1 | 11/2006 | Kurjanowicz |
| 2006/0249370 A1 | 11/2006 | Nagashima |
| 2007/0015293 A1 | 1/2007 | Wang et al. |
| 2007/0084716 A1 | 4/2007 | Nagashima |
| 2007/0084717 A1 | 4/2007 | Nagashima |
| 2007/0131538 A1 | 6/2007 | Nagashima |
| 2007/0161205 A1 | 7/2007 | Lin et al. |
| 2007/0217263 A1 | 9/2007 | Fasoli et al. |
| 2007/0244756 A1 | 9/2007 | Lee et al. |
| 2007/0246755 A1 | 10/2007 | Lee et al. |
| 2007/0257331 A1 | 11/2007 | Kurjanowicz et al. |
| 2007/0264772 A1 | 11/2007 | Lee et al. |
| 2008/0038879 A1 | 2/2008 | Kurjanowicz et al. |
| 2008/0211539 A1 | 9/2008 | Parkinson |
| 2008/0246098 A1 | 10/2008 | Kurjanowicz |
| 2009/0010073 A1 | 1/2009 | Kim et al. |
| 2009/0011569 A1 | 1/2009 | Lin et al. |
| 2009/0034325 A1 | 2/2009 | Lowrey et al. |
| 2009/0109754 A1 | 4/2009 | Schumann et al. |
| 2009/0161266 A1 | 6/2009 | Wang et al. |
| 2009/0165288 A1 | 7/2009 | Wang et al. |
| 2009/0267047 A1* | 10/2009 | Sasago ................ H01L 27/2409 257/4 |
| 2010/0038616 A1 | 2/2010 | Nagashima et al. |
| 2010/0046282 A1 | 2/2010 | Deak |
| 2010/0061132 A1 | 3/2010 | Fujisaki et al. |
| 2010/0135060 A1 | 6/2010 | Aratani et al. |
| 2010/0178729 A1 | 7/2010 | Yoon et al. |
| 2010/0237512 A1 | 9/2010 | Okukawa et al. |
| 2010/0244115 A1 | 9/2010 | Kurjanowicz et al. |
| 2011/0073825 A1 | 3/2011 | Aratani et al. |
| 2011/0095434 A1 | 4/2011 | Scheuerlein et al. |
| 2011/0147942 A1 | 6/2011 | Yahashi et al. |
| 2011/0305074 A1 | 12/2011 | Lung et al. |
| 2011/0312169 A1 | 12/2011 | Kurjanowicz et al. |
| 2012/0126338 A1 | 5/2012 | Juengling |
| 2012/0261638 A1 | 10/2012 | Sills et al. |

(56) References Cited

U.S. PATENT DOCUMENTS

| | | |
|---|---|---|
| 2012/0267597 A1 | 10/2012 | Lung |
| 2013/0015521 A1 | 1/2013 | Juengling et al. |
| 2013/0241073 A1 | 9/2013 | Hashimoto et al. |
| 2013/0285255 A1 | 10/2013 | Nitta |
| 2013/0306931 A1 | 11/2013 | Lung |
| 2013/0336037 A1 | 12/2013 | Chen et al. |
| 2013/0339571 A1 | 12/2013 | Cernea et al. |
| 2014/0080299 A1 | 3/2014 | Sel et al. |
| 2014/0103471 A1 | 4/2014 | Lupino et al. |
| 2014/0209989 A1 | 7/2014 | Kurjanowicz |
| 2014/0225057 A1 | 8/2014 | Matamis et al. |
| 2014/0227853 A1 | 8/2014 | Matamis et al. |
| 2014/0252454 A1 | 9/2014 | Rabkin et al. |
| 2014/0264244 A1 | 9/2014 | Hong et al. |
| 2015/0069320 A1 | 3/2015 | Rabkin et al. |
| 2015/0249096 A1 | 9/2015 | Lupino et al. |
| 2015/0270280 A1 | 9/2015 | Simsek-Ege et al. |
| 2015/0311256 A1 | 10/2015 | Rabkin et al. |
| 2015/0333105 A1 | 11/2015 | Matamis et al. |
| 2016/0099407 A1 | 4/2016 | Lim et al. |
| 2016/0126311 A1 | 5/2016 | Simsek-Ege et al. |
| 2016/0247565 A1 | 8/2016 | Perner et al. |
| 2016/0260732 A1 | 9/2016 | Lue |
| 2016/0260733 A1 | 9/2016 | Lue |
| 2016/0351722 A1 | 12/2016 | Zhou et al. |
| 2017/0040381 A1 | 2/2017 | Chen et al. |
| 2017/0053934 A1 | 2/2017 | Lue |
| 2017/0294574 A1 | 10/2017 | Hong et al. |
| 2018/0102344 A1 | 4/2018 | Ramachandra et al. |
| 2018/0122825 A1 | 5/2018 | Lupino et al. |
| 2018/0190715 A1 | 7/2018 | Zhang |
| 2018/0293487 A1 | 10/2018 | Copel et al. |
| 2019/0172502 A1* | 6/2019 | Jeong ................. G11C 13/0028 |

OTHER PUBLICATIONS

U.S. Appl. No. 15/898,544, filed Feb. 17, 2018, SanDisk Technologies LLC.

U.S. Appl. No. 15/898,571, filed Feb. 17, 2018, SanDisk Technologies LLC.

U.S. Appl. No. 15/924,944, filed Mar. 19, 2018, SanDisk Technologies LLC.

U.S. Appl. No. 16/021,694, filed Jun. 28, 2018, SanDisk Technologies LLC.

U.S. Appl. No. 16/410,326, filed May 13, 2019, SanDisk Technologies LLC.

* cited by examiner

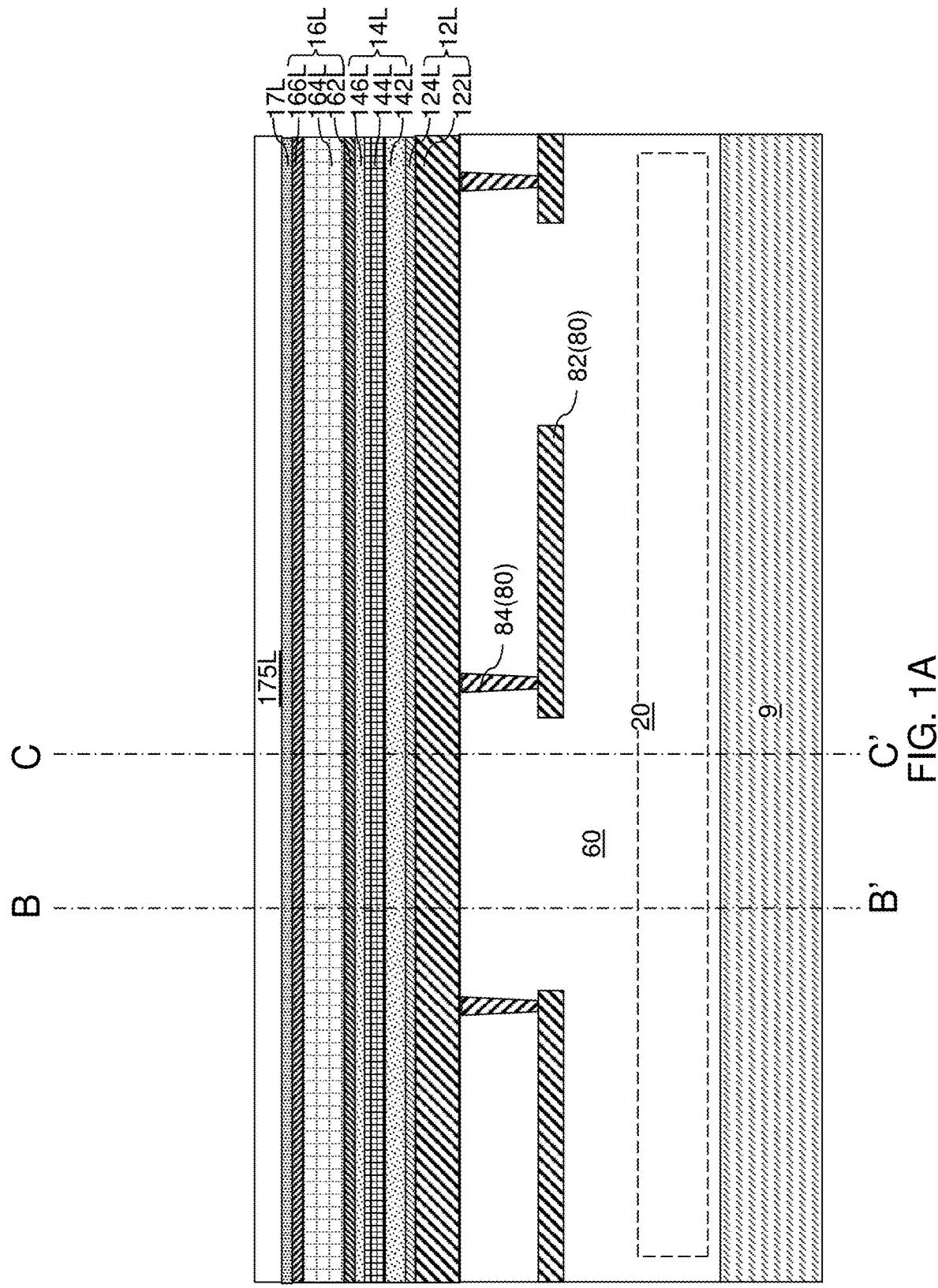

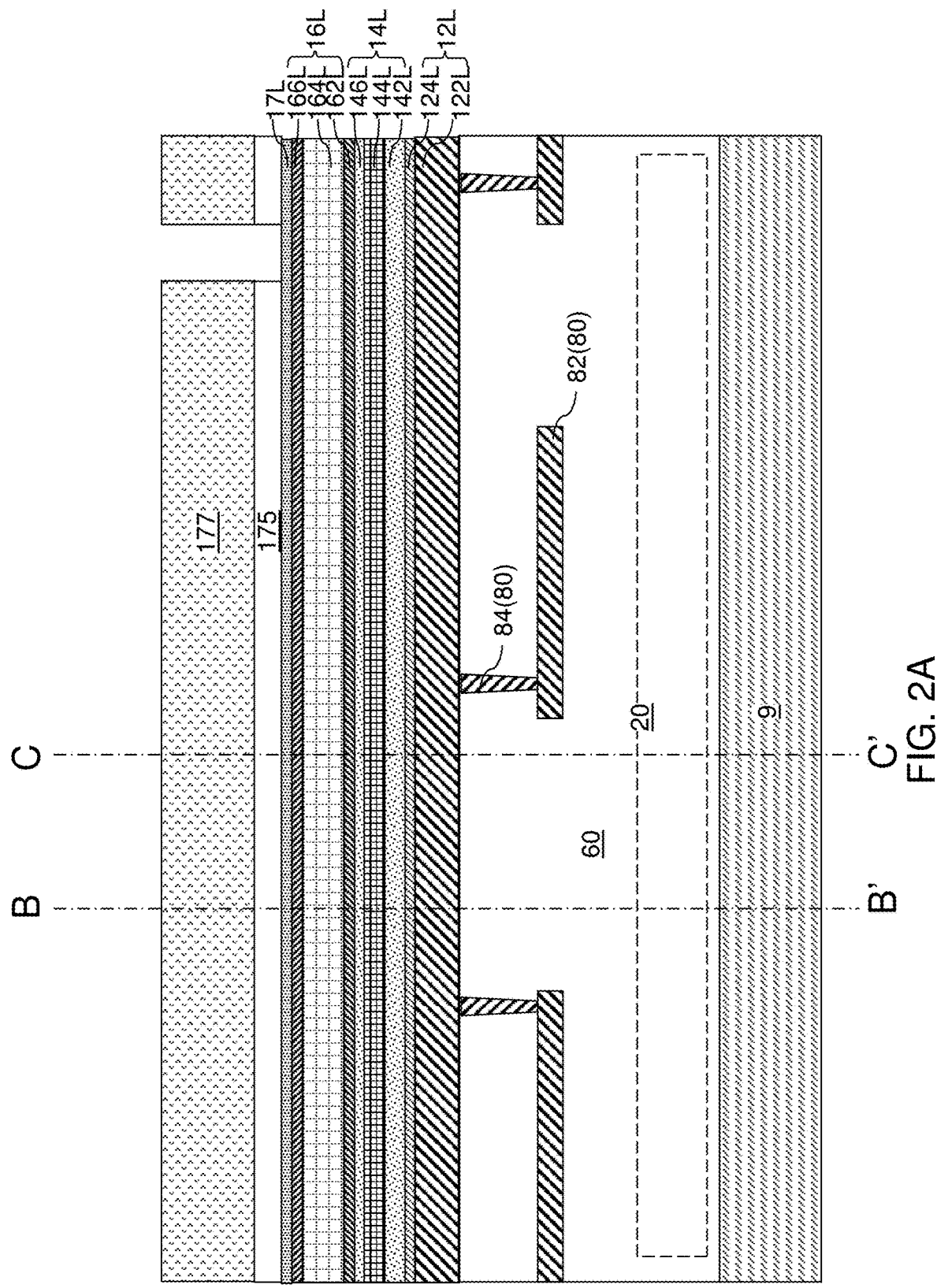

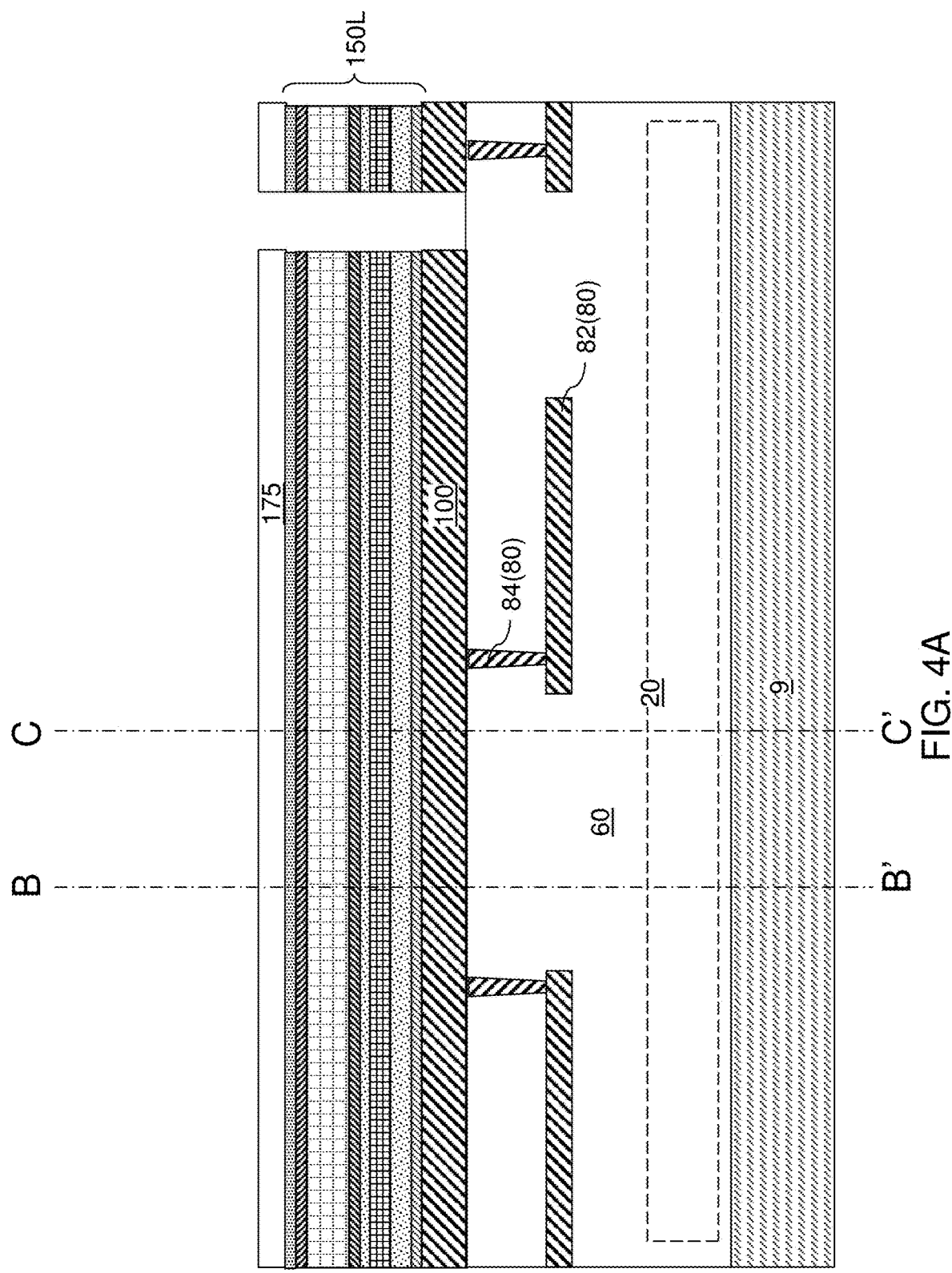

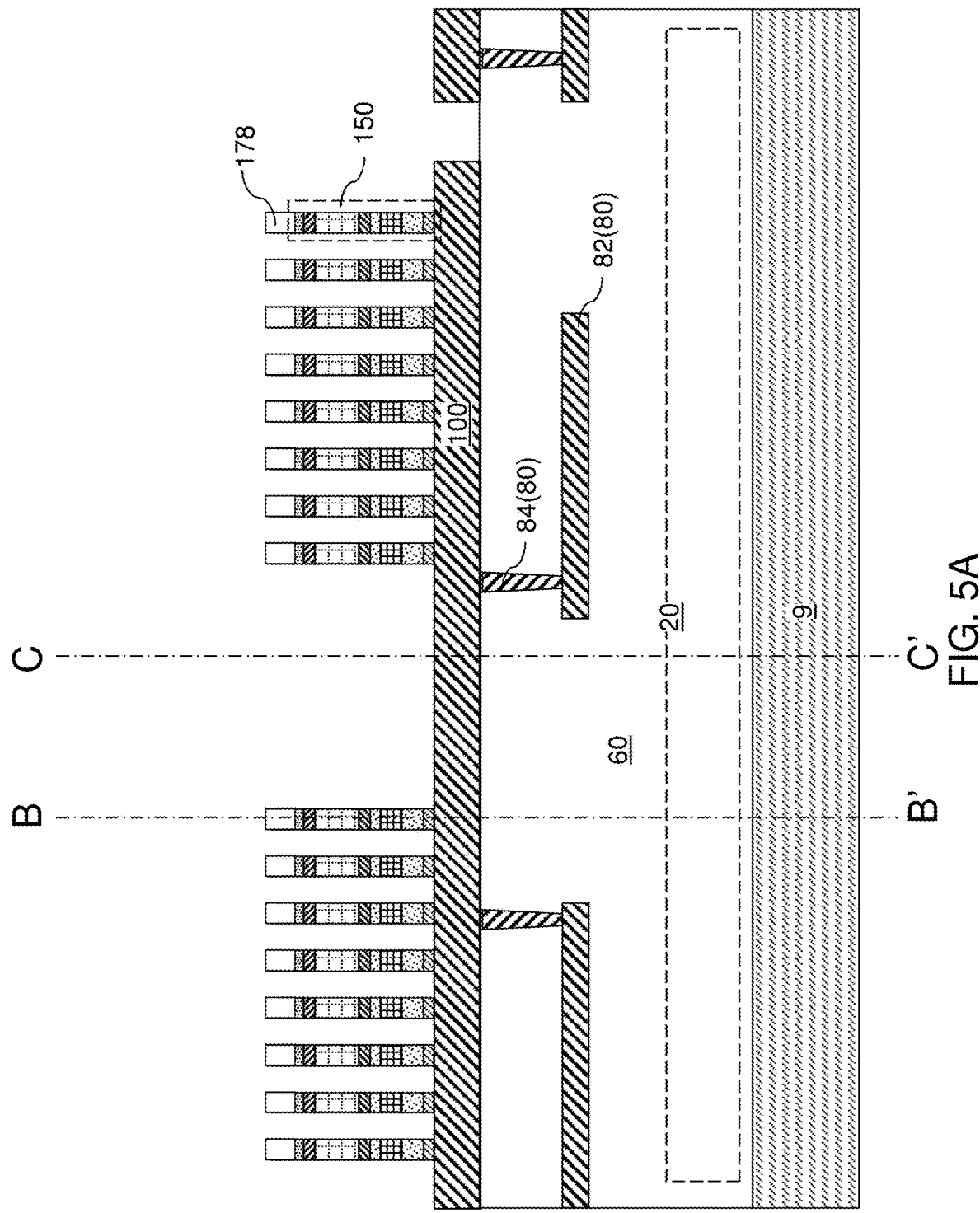

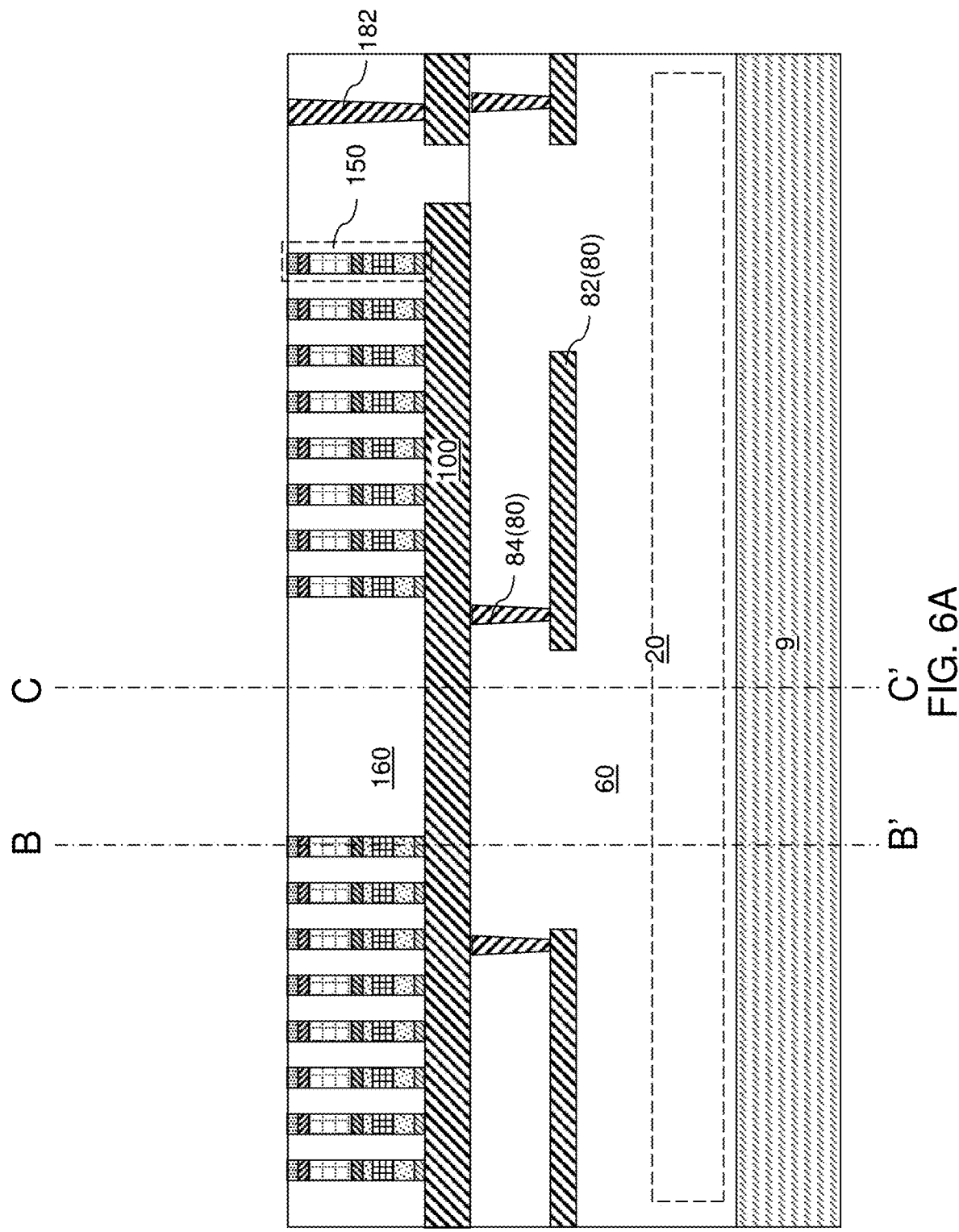

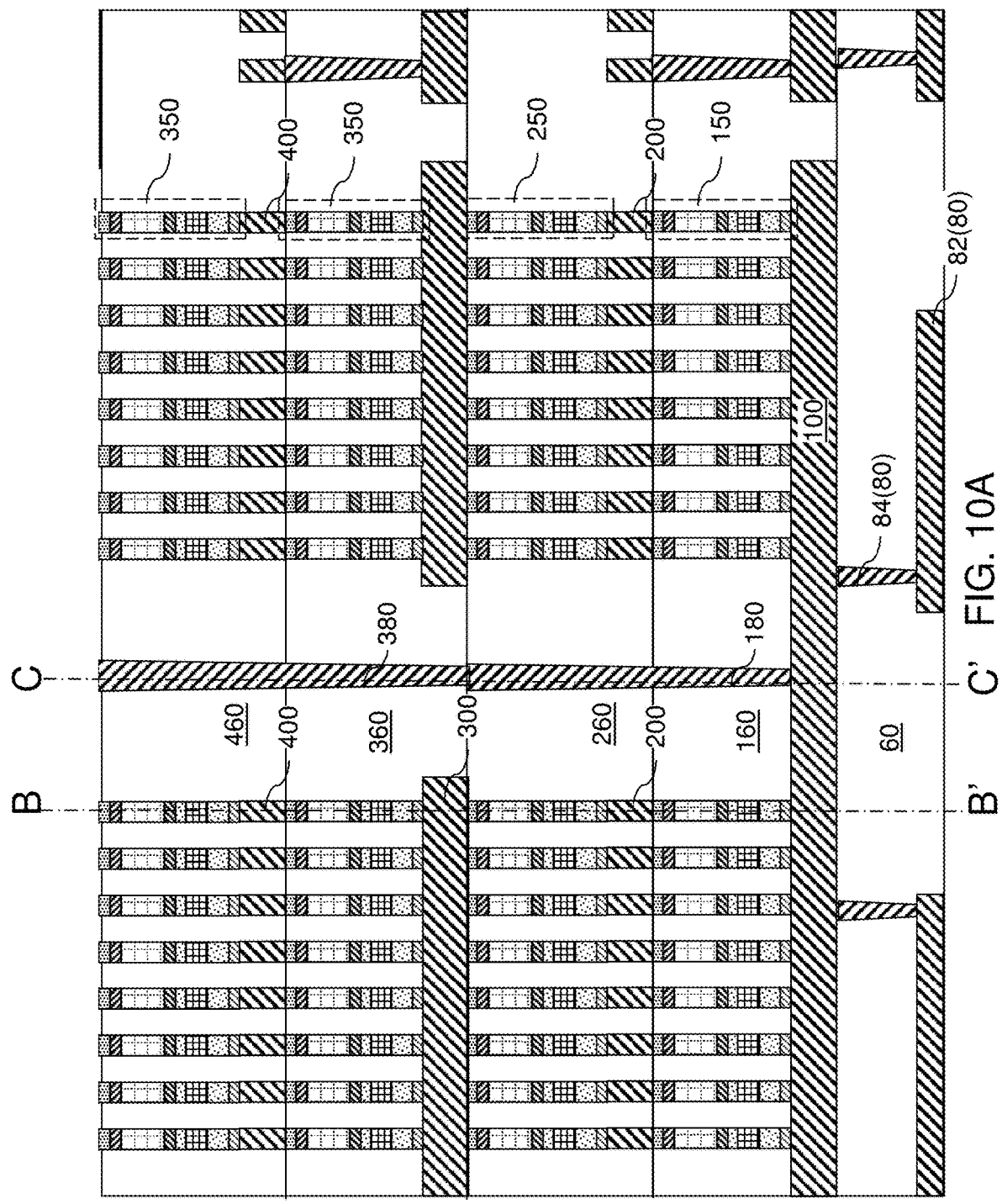

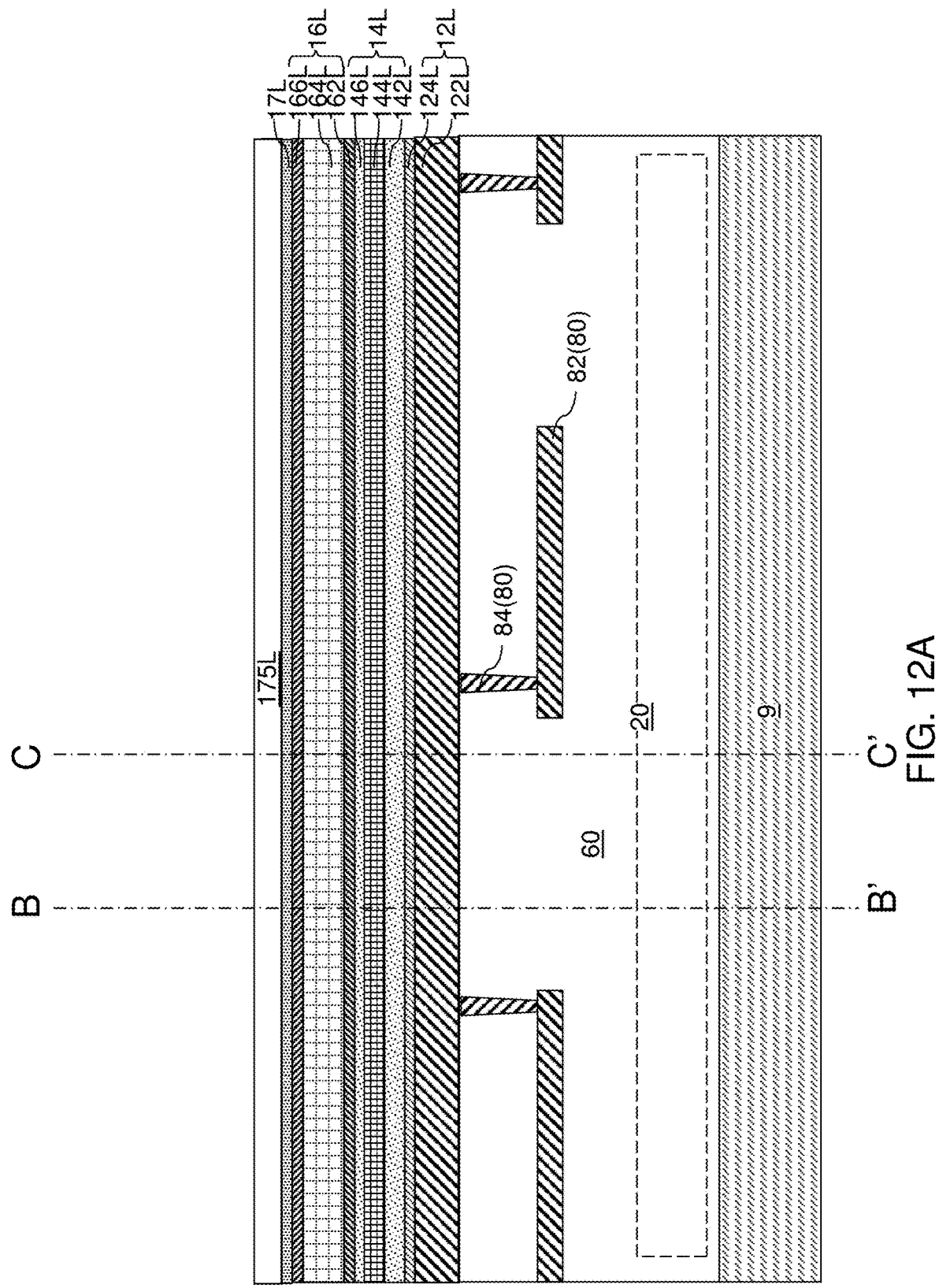

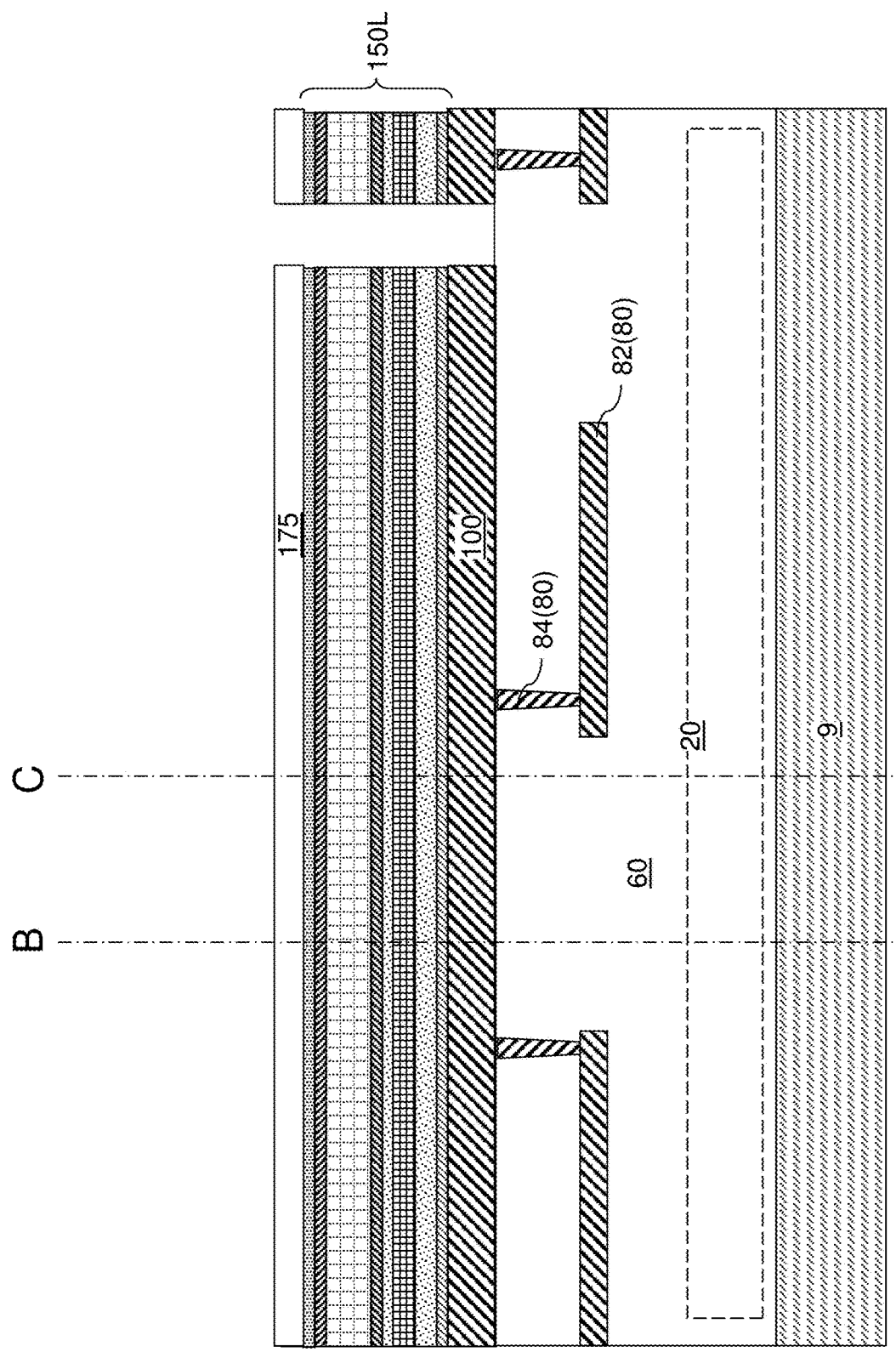

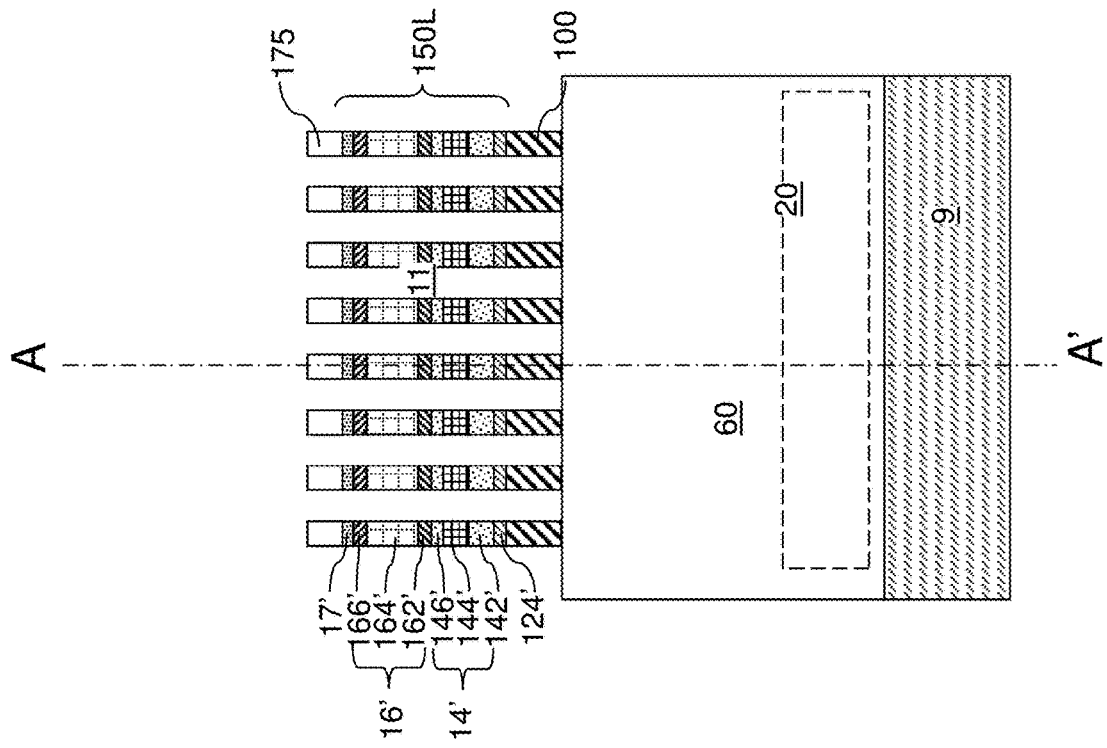
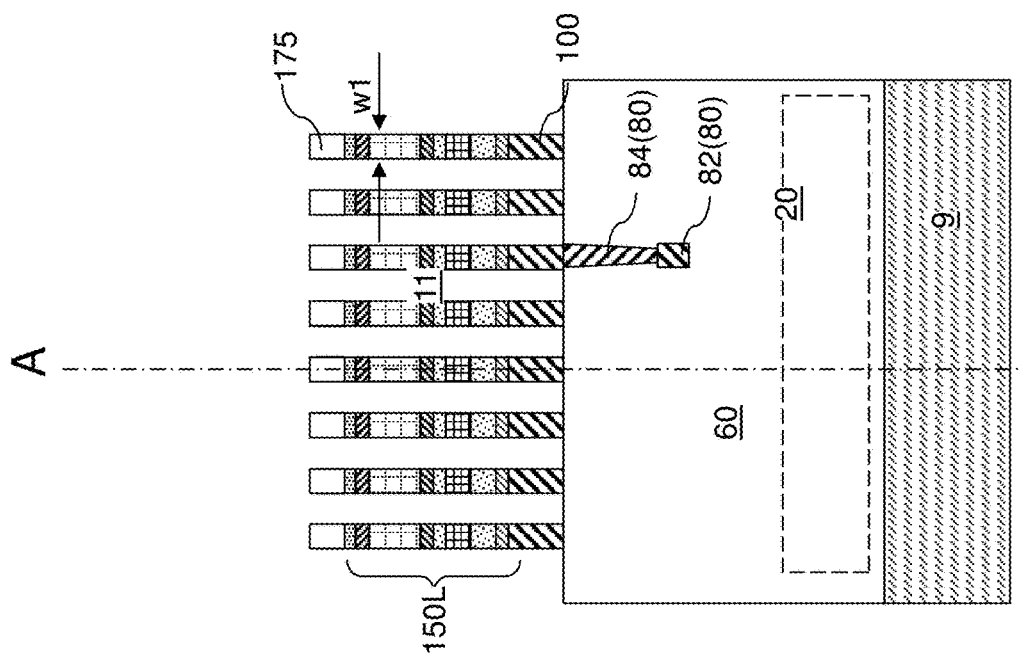
FIG. 13C
FIG. 13B

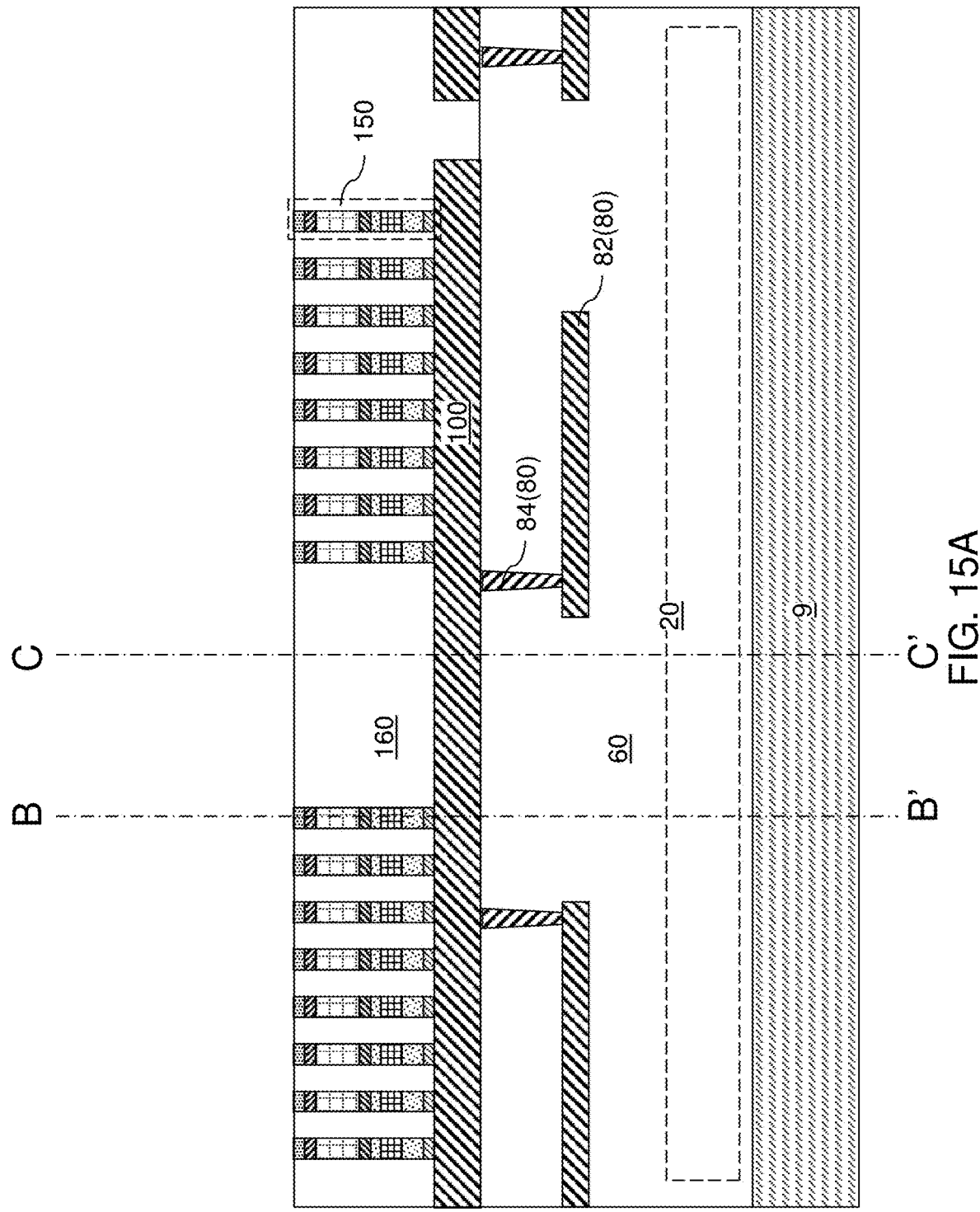

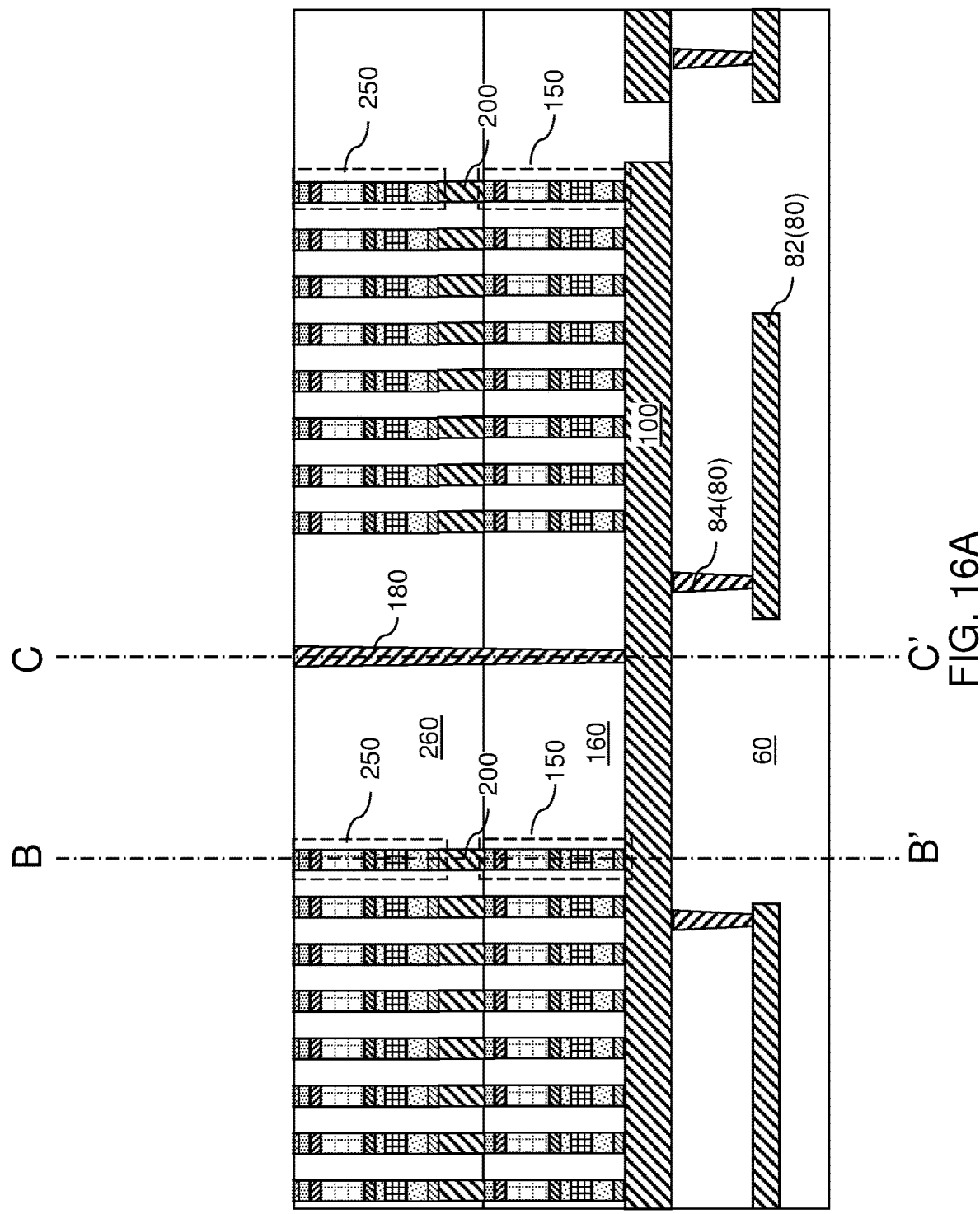

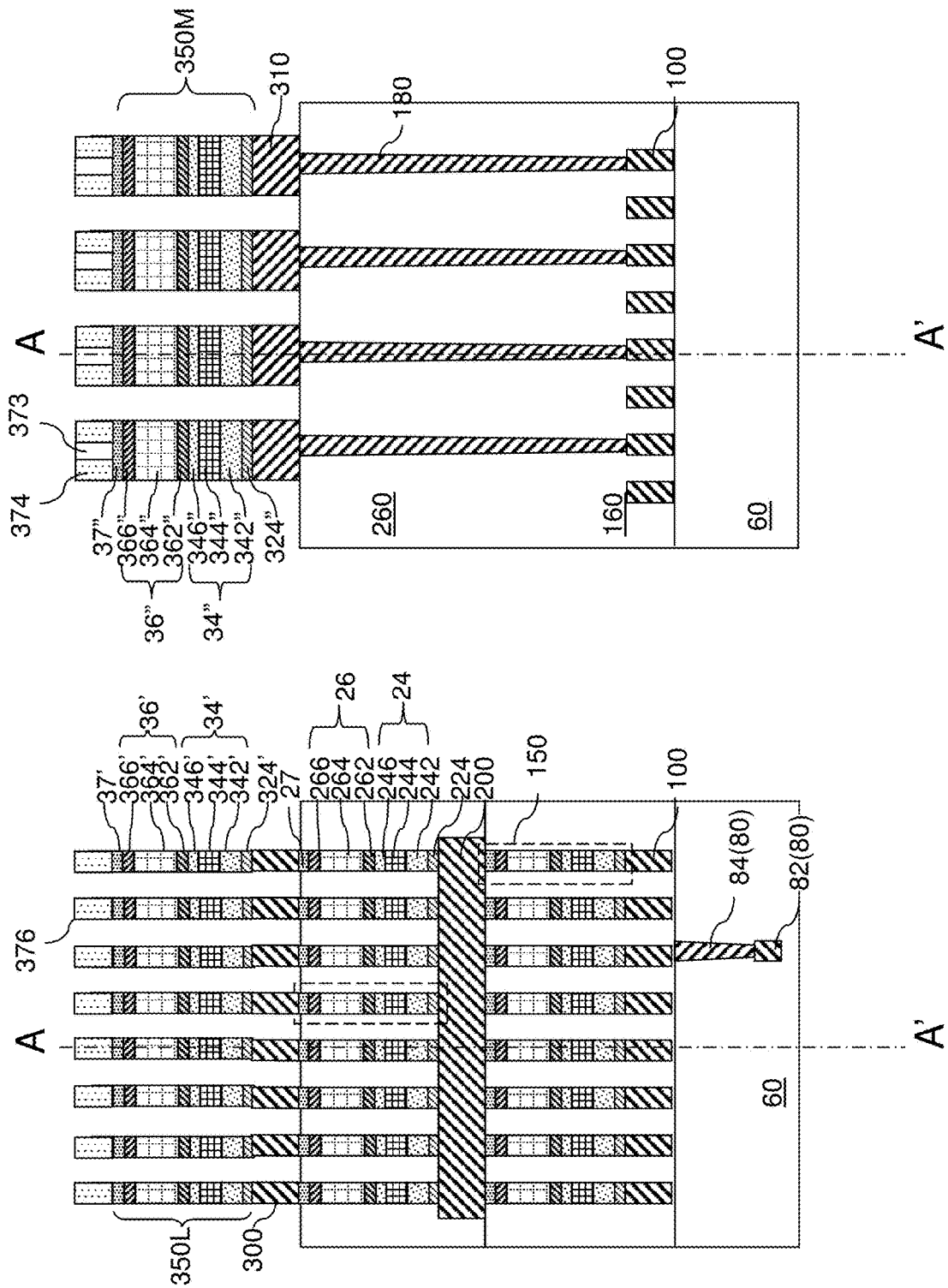

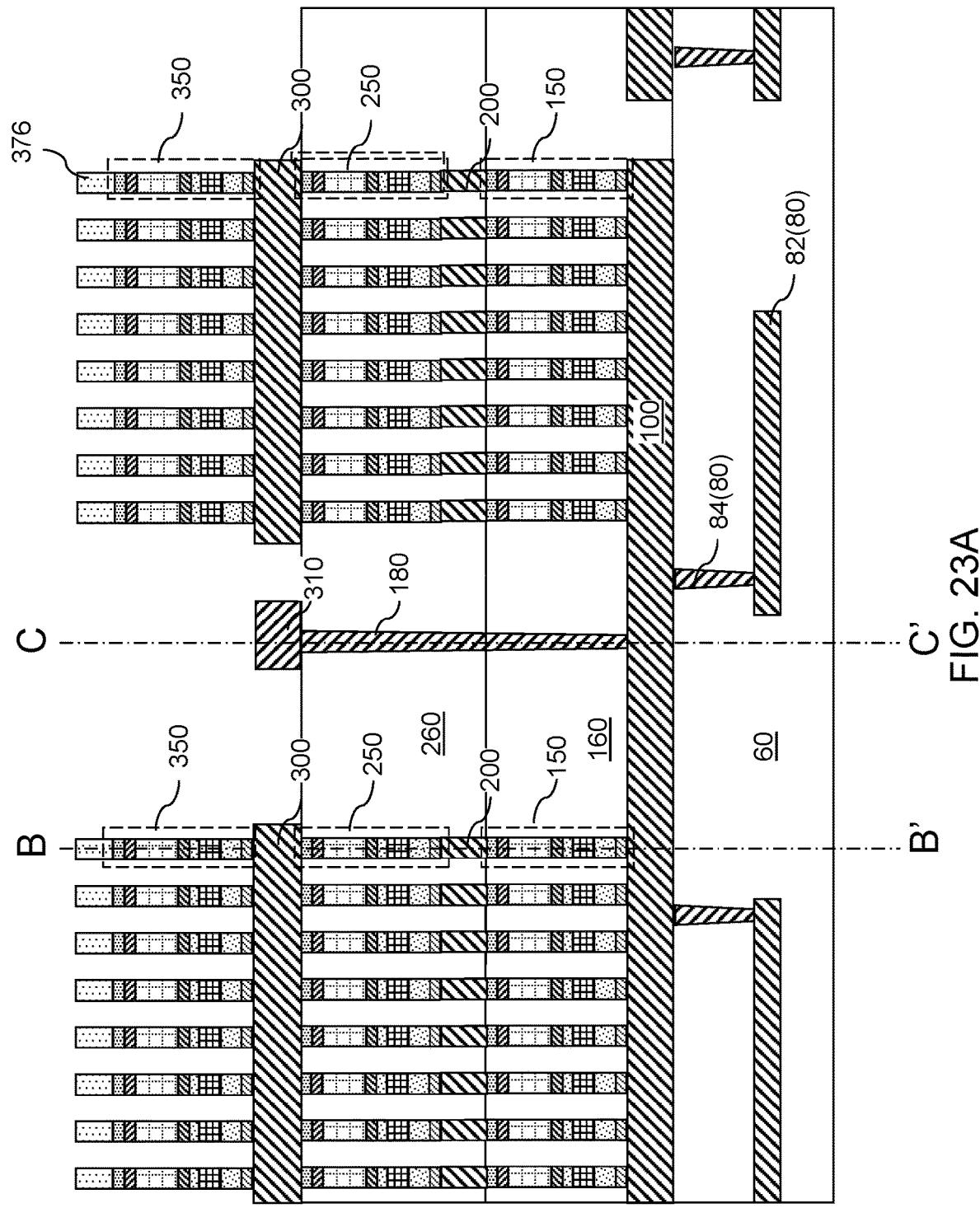

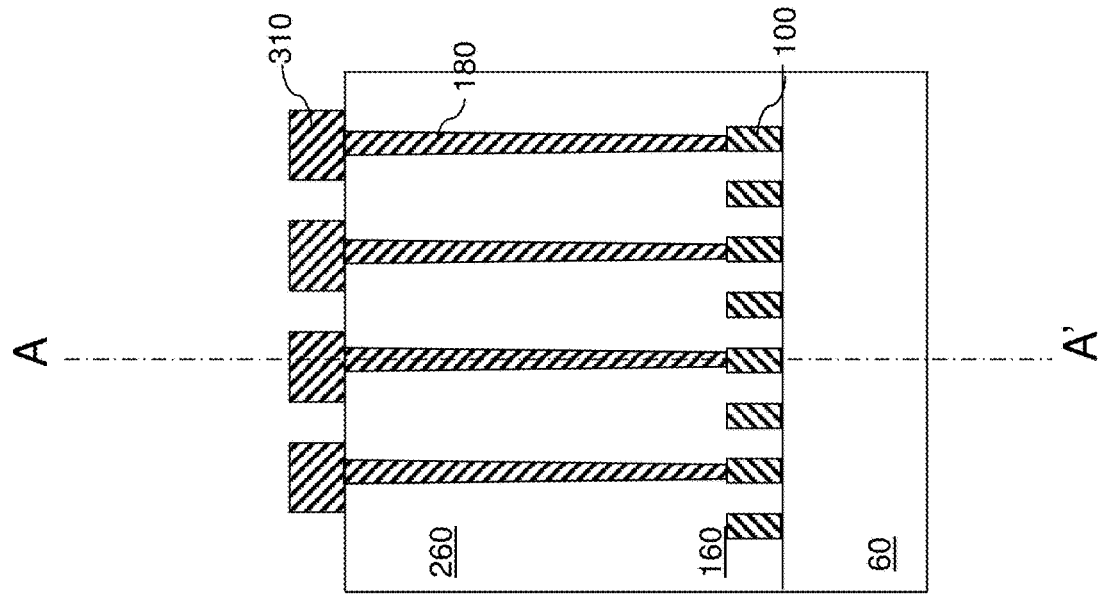
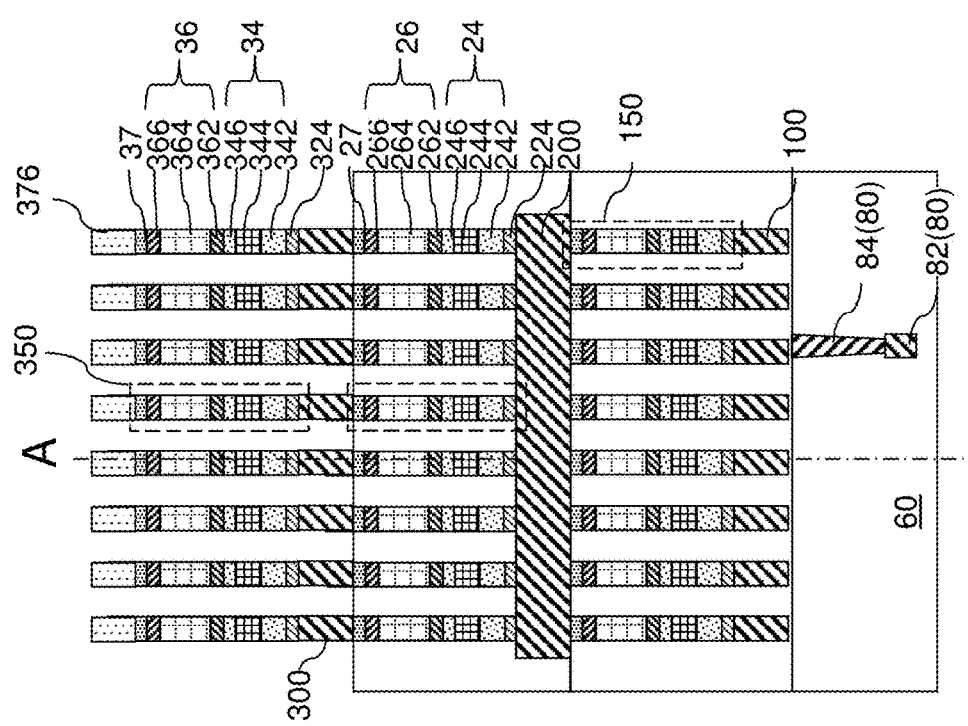

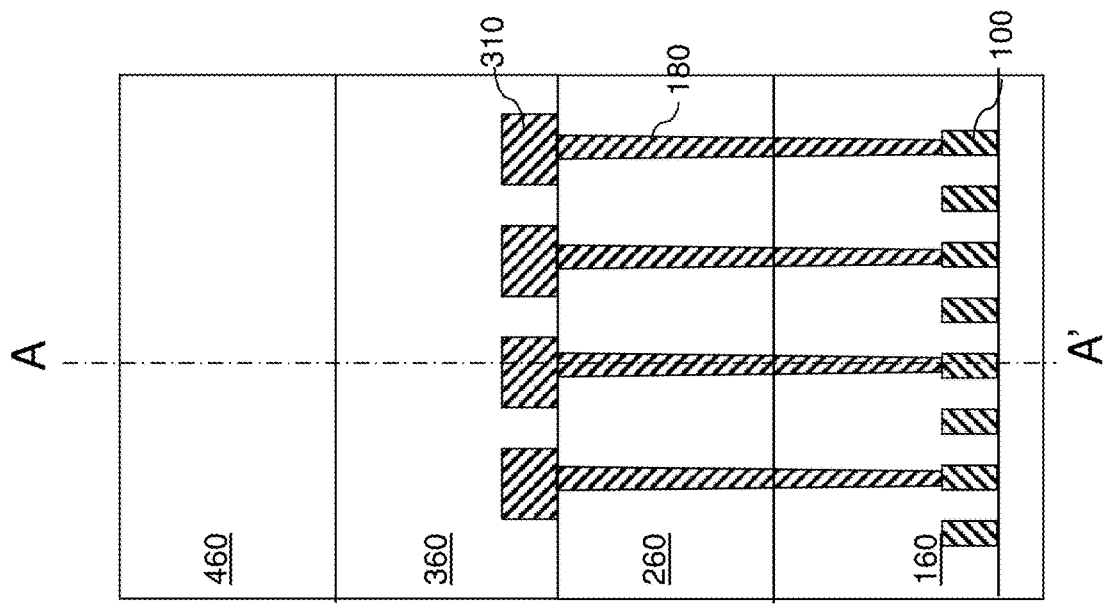
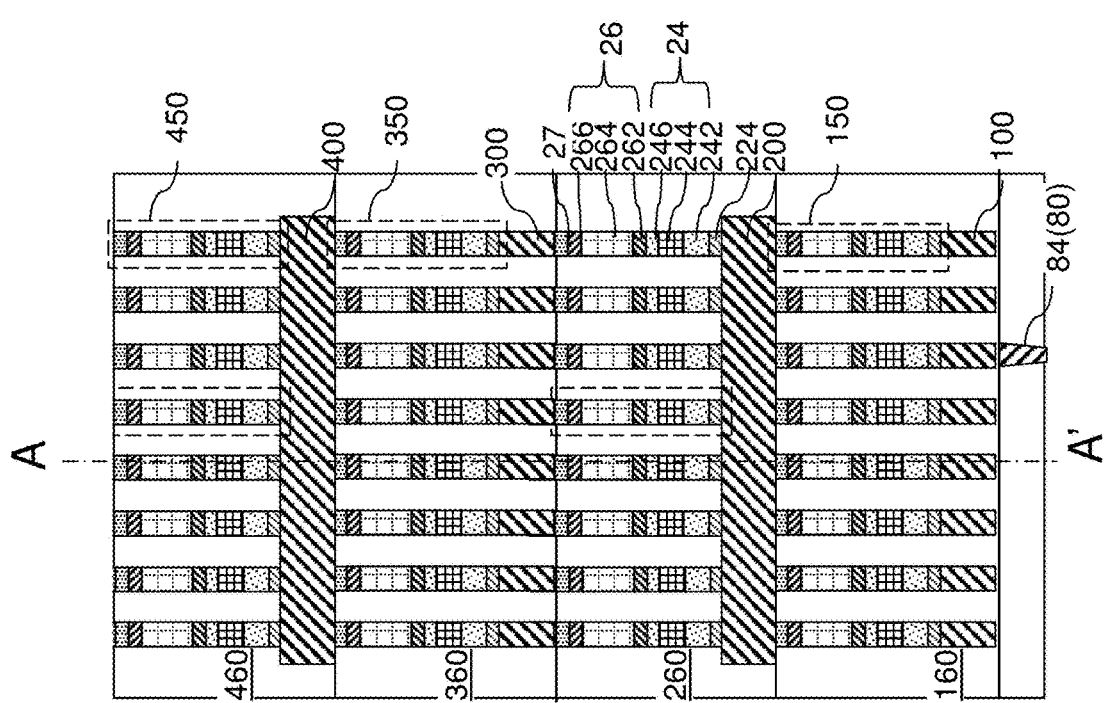

THREE-DIMENSIONAL CROSS-POINT MEMORY DEVICE CONTAINING INTER-LEVEL CONNECTION STRUCTURES AND METHOD OF MAKING THE SAME

FIELD

The present disclosure relates generally to the field of semiconductor devices and specifically to three-dimensional cross-point memory devices including inter-level connection structures and methods of making the same.

BACKGROUND

A cross-point array device is a device in which unit device elements are arranged as a two-dimensional array of a three-dimensional array, and are accessed by a selected pair of access lines located at different levels. The cross-point array device may be configured as a two-dimensional array including two sets of access lines, or may be configured as a three-dimensional array including three or more sets of access lines.

Each unit device element may be accessed by selection of an overlying one of the access lines and an underlying one of the access lines. The access lines are referred to as word lines or bit lines depending on the configuration of a peripheral device connected to the access lines and depending on the configuration of components within each unit device element. In the case of a three-dimensional cross-point array device, access lines at each odd-numbered level may be bit line and access lines at each even-numbered level may be word lines, or vice versa.

SUMMARY

According to an embodiment of the present disclosure, a memory device is provided, which comprises: a vertical stack including first electrically conductive lines, a two-dimensional array of first pillar structures, second electrically conductive lines, a two-dimensional array of second pillar structures, third electrically conductive lines, a two-dimensional array of third pillar structures, fourth electrically conductive lines, a two-dimensional array of fourth pillar structures, and fifth electrically conductive lines, wherein each of the first pillar structures, the second pillar structures, the third pillar structures, and the fourth pillar structures comprises a respective memory element, and the two-dimensional array of first pillar structures overlies top surfaces of first portions of the first electrically conductive lines having a first width; and interconnection structures providing electrically conductive paths between the fifth electrically conductive lines and the first electrically conductive lines, wherein each of the interconnection structures contacts a top surface of a second portion of a respective one of the first electrically conductive lines having a second width that is less than the first width.

According to another aspect of the present disclosure, a method of forming a memory device is provided, which comprises: forming first electrically conductive lines laterally extending along a first horizontal direction over a substrate, wherein the first electrically conductive lines comprises first portions having a first width and second portions having a second width that is less than the first width; forming a vertical stack including second electrically conductive lines, a two-dimensional array of second pillar structures, third electrically conductive lines, a two-dimensional array of third pillar structures, fourth electrically conductive lines, and a two-dimensional array of fourth pillar structures over the two-dimensional array of first pillar structures, wherein each of the first pillar structures, the second pillar structures, the third pillar structures, and the fourth pillar structures comprises a respective memory element; forming interconnection structures on top surfaces of second portions of the first electrically conductive lines; and forming fifth electrically conductive lines on top surfaces of the two-dimensional array of fourth pillar structures and on top surfaces of the interconnection structures.

According to yet another aspect of the present disclosure, a memory device is provided, which comprises: a vertical stack including first electrically conductive lines, a two-dimensional array of first pillar structures, second electrically conductive lines, a two-dimensional array of second pillar structures, third electrically conductive lines, a two-dimensional array of third pillar structures, fourth electrically conductive lines, a two-dimensional array of fourth pillar structures, and fifth electrically conductive lines, wherein each of the first pillar structures, the second pillar structures, the third pillar structures, and the fourth pillar structures comprises a respective memory element; and interconnection structures providing electrically conductive paths between the fifth electrically conductive lines and the first electrically conductive lines, wherein each of the interconnection structures comprises a vertical stack of a first conductive via structure contacting a respective one of the first electrically conductive lines, a conductive pad structure contacting a top surface of the first conductive via structure, and a second conductive via structure contacting the conductive pad structure and a respective one of the fifth electrically conductive lines.

According to still another aspect of the present disclosure, a method of forming a memory device is provided, which comprises: forming a vertical stack over a substrate, wherein the vertical stack includes first electrically conductive lines, a two-dimensional array of first pillar structures, second electrically conductive lines, a two-dimensional array of second pillar structures, third electrically conductive lines, a two-dimensional array of third pillar structures, fourth electrically conductive lines, and a two-dimensional array of fourth pillar structures, wherein each of the first pillar structures, the second pillar structures, the third pillar structures, and the fourth pillar structures comprises a respective memory element and is embedded within a respective dielectric material layer; forming interconnection structures through the dielectric material layers that embed the first pillar structures, the second pillar structures, the third pillar structures, or the fourth pillar structures, wherein each of the interconnection structures comprises a vertical stack of a first conductive via structure contacting a respective one of the first electrically conductive lines, a conductive pad structure contacting a top surface of the first conductive via structure, and a second conductive via structure contacting the conductive pad structure and a respective one of the fifth electrically conductive lines; and forming fifth electrically conductive lines on the two-dimensional array of fourth pillar structures and the interconnection structures.

BRIEF DESCRIPTION OF THE DRAWINGS

FIG. 1A is a vertical cross-sectional view of a first exemplary structure after formation of a first layer stack including a first conductive material layer, a first selector layer, a first phase change memory layer, an optional first barrier layer, and a first hard mask layer according to a first embodiment of the present disclosure.

FIG. 2A is a vertical cross-sectional view of the first exemplary structure after patterning the first hard mask layer into hard mask strips according to the first embodiment of the present disclosure.

FIG. 4A is a vertical cross-sectional view of the first exemplary structure after formation of first stacked rail structures laterally spaced by first trenches according to the first embodiment of the present disclosure.

FIG. 5A is a vertical cross-sectional view of the first exemplary structure after formation of a two-dimensional rectangular array of first pillar structures according to the first embodiment of the present disclosure.

FIG. 6A is a vertical cross-sectional view of the first exemplary structure after formation of the first dielectric material layer according to the first embodiment of the present disclosure.

FIG. 10A is a vertical cross-sectional view of the first exemplary structure after formation of third electrically conductive lines, a two-dimensional rectangular array of third pillar structures, a third dielectric material layer, fourth electrically conductive lines, a two-dimensional array of fourth pillar structures, a fourth dielectric material layer, and second conductive via structures according to the first embodiment of the present disclosure.

FIG. 12A is a vertical cross-sectional view of a second exemplary structure after formation of a first layer stack including a first conductive material layer, a first selector layer, a first phase change memory layer, an optional first barrier layer, and a first hard mask layer according to a second embodiment of the present disclosure.

FIG. 13A is a vertical cross-sectional view of the second exemplary structure after formation of first stacked rail structures laterally spaced by first trenches according to the second embodiment of the present disclosure.

FIG. 13B is a vertical cross-sectional view of the second exemplary structure along the vertical plane B-B' of FIG. 13A.

FIG. 13C is a vertical cross-sectional view of the second exemplary structure along the vertical plane C-C' of FIG. 13A.

FIG. 15A is a vertical cross-sectional view of the second exemplary structure after formation of the first dielectric material layer according to the second embodiment of the present disclosure.

FIG. 16A is a vertical cross-sectional view of the second exemplary structure after formation of second electrically conductive lines, a two-dimensional array of second pillar structures, a second dielectric material layer, and first conductive via structures according to the second embodiment of the present disclosure.

FIG. 22B is a vertical cross-sectional view of the second exemplary structure along the vertical plane B-B' of FIG. 22A.

FIG. 22C is a vertical cross-sectional view of the second exemplary structure along the vertical plane C-C' of FIG. 22A.

FIG. 23A is a vertical cross-sectional view of the second exemplary structure after formation of a two-dimensional rectangular array of third pillar structures according to the second embodiment of the present disclosure.

FIG. 23B is a vertical cross-sectional view of the second exemplary structure along the vertical plane B-B' of FIG. 23A.

FIG. 23C is a vertical cross-sectional view of the second exemplary structure along the vertical plane C-C' of FIG. 23A.

FIG. 24B is a vertical cross-sectional view of the second exemplary structure along the vertical plane B-B' of FIG. 24A.

FIG. 24C is a vertical cross-sectional view of the second exemplary structure along the vertical plane C-C' of FIG. 24A.

DETAILED DESCRIPTION

Figure 1C:
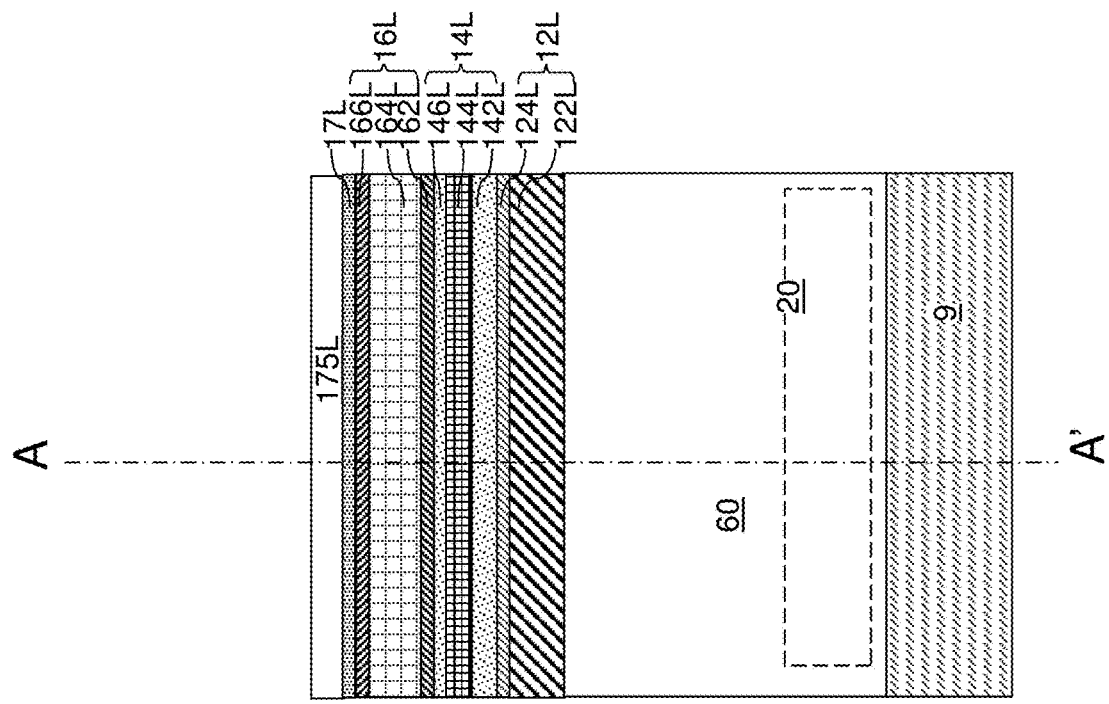
FIG. 1C is a vertical cross-sectional view of the first exemplary structure along the vertical plane C-C' of FIG. 1A.
Figure 1B:
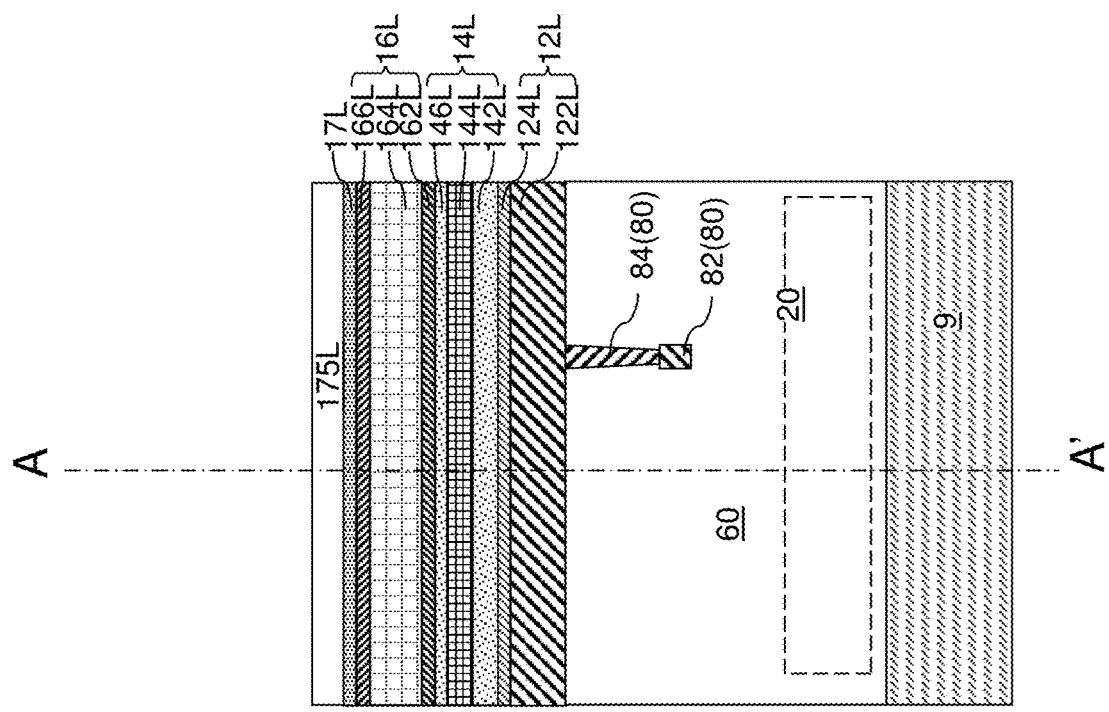
FIG. 1B is a vertical cross-sectional view of the first exemplary structure along the vertical plane B-B' of FIG. 1A.
Figure 1D:
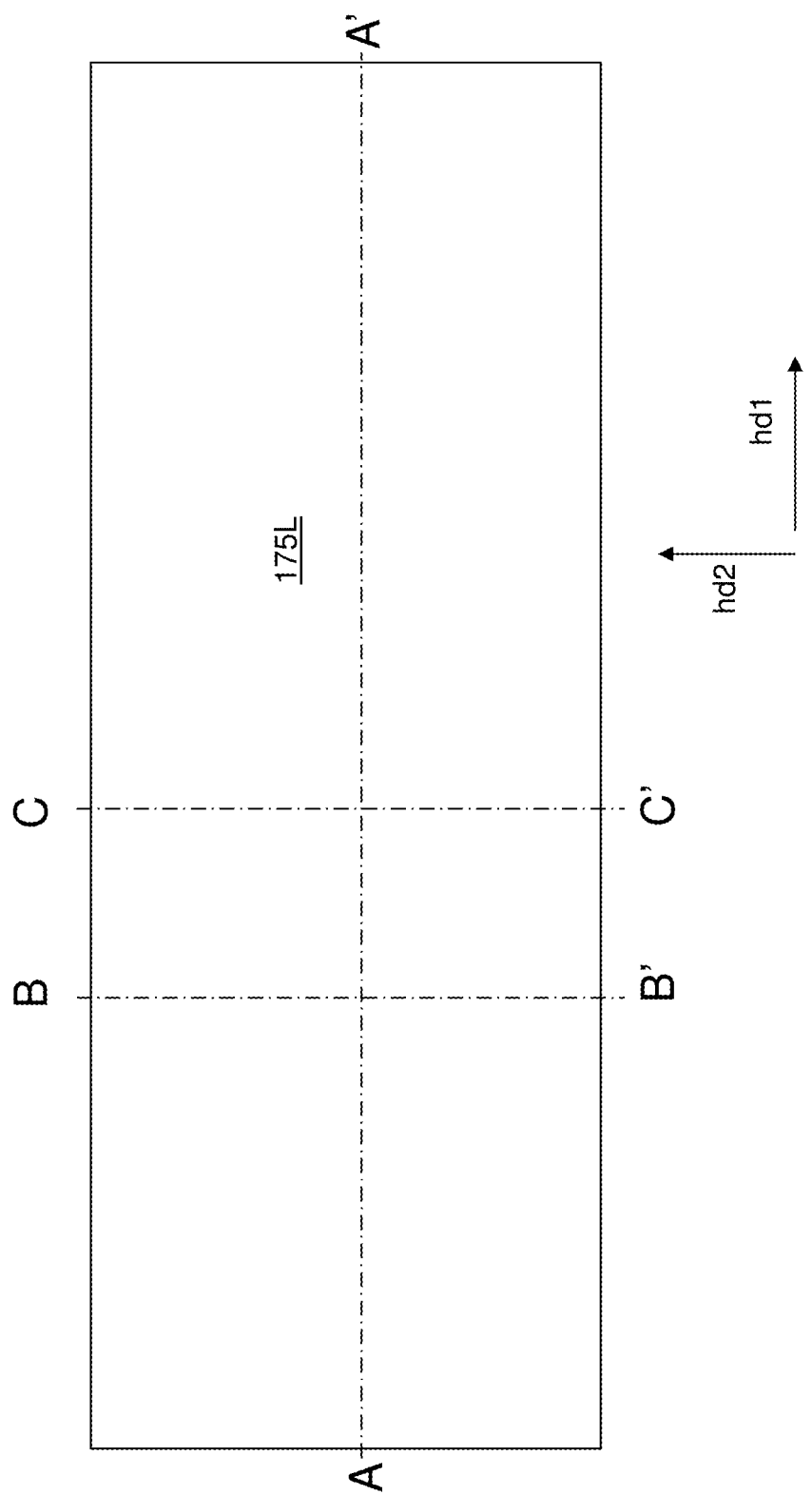
FIG. 1D is a top-down view of the first exemplary structure of FIGS. 1A-1C. The vertical plane A-A' is the plane of the vertical cross-sectional view of FIGS. 1A-1C. The vertical plane B-B' is the plane of the vertical cross-sectional view of FIGS. 1A-1C. The vertical plane C-C' is the plane of the vertical cross-sectional view of FIGS. 1A-1C.
Figure 2C:
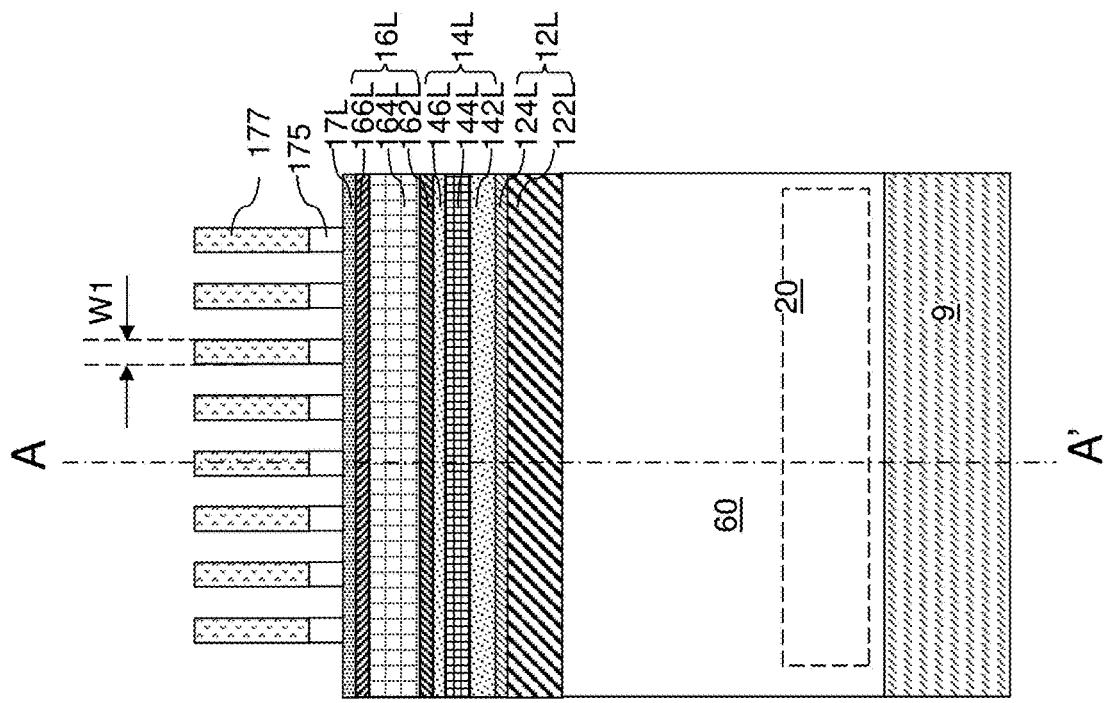
FIG. 2C is a vertical cross-sectional view of the first exemplary structure along the vertical plane C-C' of FIG. 2A.
Figure 2B:
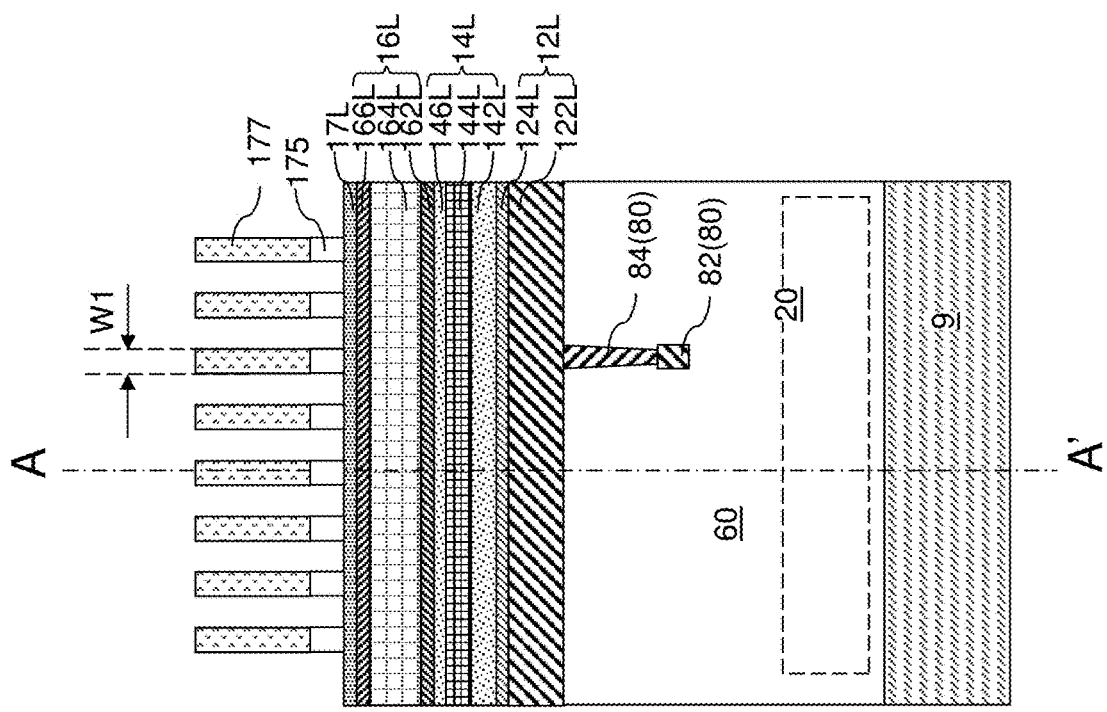
FIG. 2B is a vertical cross-sectional view of the first exemplary structure along the vertical plane B-B' of FIG. 2A.
Figure 2D:
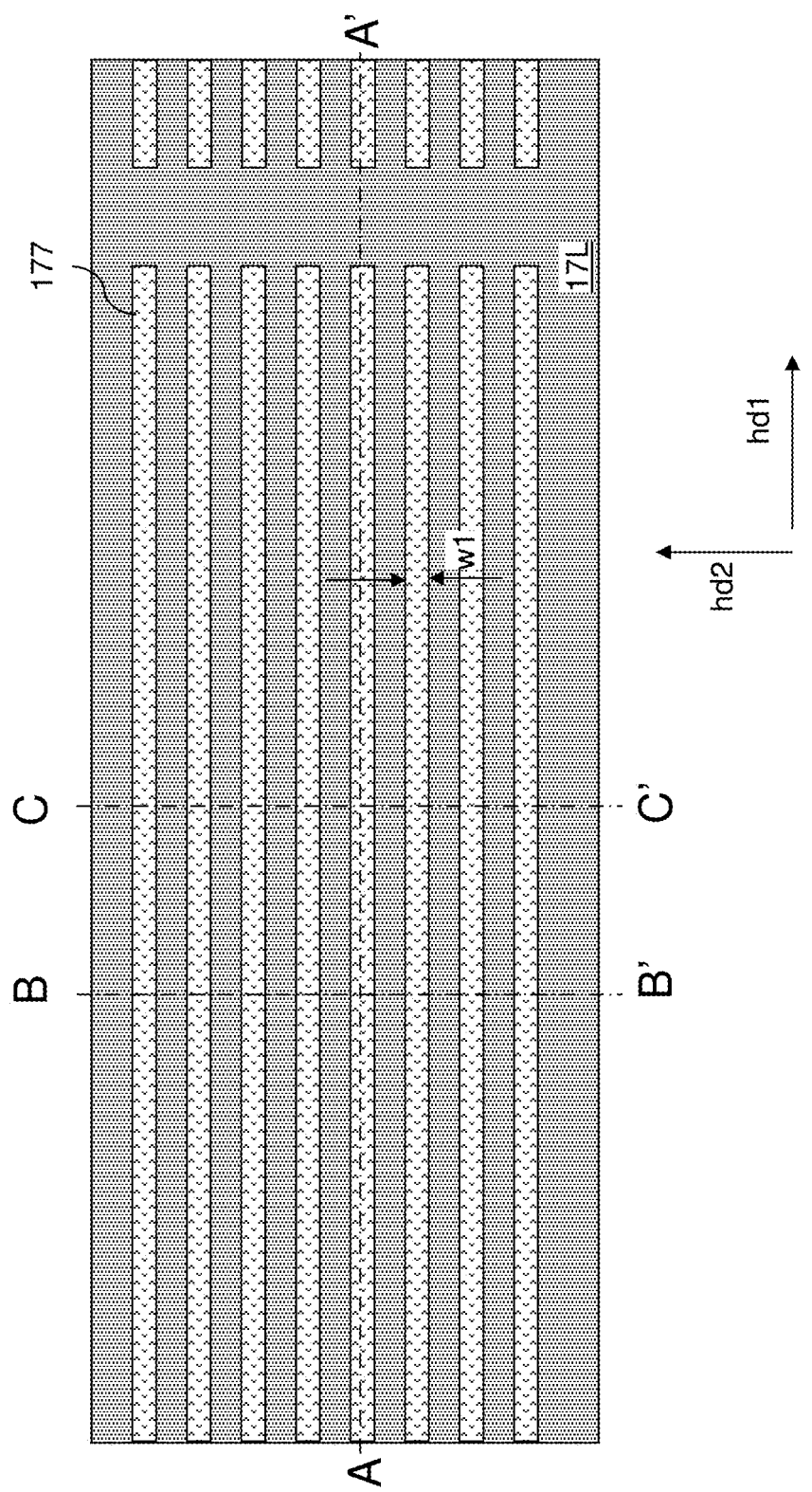
FIG. 2D is a top-down view of the first exemplary structure of FIGS. 2A-2C. The vertical plane A-A' is the plane of the vertical cross-sectional view of FIGS. 2A-2C. The vertical plane B-B' is the plane of the vertical cross-sectional view of FIGS. 2A-2C. The vertical plane C-C' is the plane of the vertical cross-sectional view of FIGS. 2A-2C.

Since a unit device element within a three-dimensional cross-point array device is accessed by a pair of selected access lines within vertically neighboring sets of access lines, activation of multiple bit lines located at different levels does not active more than one unit device element provided only one word line is activated. Likewise, activation of multiple word lines located at different levels does not active more than one unit device element provided only one bit line is activated. Thus, the architecture of a three-dimensional cross-point array device may be greatly simplified if vertically neighboring pairs of bit lines are connected together or if vertically neighboring pairs of word lines are connected together.

In physical hardware, interconnection between access lines that are two levels apart utilizes a vertical interconnection structure including two interconnection via structures that span two device levels. However, formation of such vertical interconnection structures is prone to electrical shorts, dielectric breakdown, and/or increase in parasitic capacitance because of the fine pitch used to form the access lines. Typically, the access lines are formed at a minimum lithographic pitch to increase the device density. Thus, misalignment of the interconnection via structures due to overlay variations may cause various yield issues and reliability issues in the three-dimensional cross-point array device.

In view of the above, the embodiments of the present disclosure are directed to three-dimensional cross-point array memory devices including inter-level connection structures and methods of making the same, the various embodiments of which are described below. The structures and methods of the embodiments of the present disclosure provide reliable inter-level conductive paths that span two device levels for a three-dimensional cross-point array memory device.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are used merely to identify similar elements, and different ordinals may be used across the specification and the claims of the instant disclosure. A same reference numeral refers to a same element or a similar element. Unless otherwise noted, elements with a same reference numeral are presumed to have a same material composition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0\times10^{-6}$ S/cm to $1.0\times10^5$ S/cm. As used herein, a "semiconductor material" refers to a material having electrical conductivity in the range from $1.0\times10^{-6}$ S/cm to $1.0\times10^5$ S/cm in the absence of electrical dopants therein, and is capable of producing a doped material having electrical conductivity in a range from 1.0 S/cm to $1.0\times10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIGS. 1A-1D, a first exemplary structure for forming a three-dimensional phase change memory device is illustrated, which includes a substrate 9. The substrate 9 may include a semiconductor substrate, an insulating substrate, or a conductive substrate, and may have a thickness in a range from 60 microns to 1 mm, although lesser and greater thicknesses may also be used. In embodiments in which the substrate 9 includes a semiconductor substrate, semiconductor devices 20 such as field effect transistors may be formed on a top surface of the substrate 9. In one embodiment, the semiconductor devices 20 may include peripheral circuitry configured to operate a three-dimensional array of memory elements that may be subsequently formed thereupon. In one embodiment, base dielectric material layers 60 having formed therein metal interconnect structures 80 may be formed over the substrate 9. For example, the metal interconnect structures 80 may include base-level metal line structures 82 and base-level metal via structures 84, which may be connected to various nodes of the semiconductor devices 20 underneath.

A first material layer stack (12L, 14L, 16L, 17L, 175L), which is also referred to as a first layer stack or a first vertical stack, may be formed over the substrate 9. As used herein, a "material layer stack" refers to a layer stack including a plurality of material layers. The first material layer stack (12L, 14L, 16L, 17L, 175L) may include material layers for forming a two-dimensional array of device components, which may be memory elements, combinations of a memory element and a selector element, combinations of a memory element, a selector element, and additional component for enhancing the functionality of the memory element and/or the selector element. Generally, the first material layer stack (12L, 14L, 16L, 17L, 175L) may include any material stack that may be subsequently patterned into a two-dimensional array of pillar structures including memory elements and optional selector elements. The first material layer stack (12L, 14L, 16L, 17L, 175L) may include a layer stack for forming phase change memory elements, magnetoresistive memory elements, ferroelectric memory elements, resistive memory elements (e.g., metal oxide memory elements, such as titanium oxide or nickel oxide memory elements) or any other type of memory elements that may be individually accessed in a cross-point array configuration.

For example, the first material layer stack (12L, 14L, 16L, 17L, 175L) may include a first conductive material layer 12L, a first selector layer 14L, a first phase change memory layer 16L, an optional first barrier layer 17L, and a first hard mask layer 175L. Each layer in the first material layer stack (12L, 14L, 16L, 17L, 175L) may be formed as a blanket material layer, i.e., an unpatterned material layer that laterally extend along a first horizontal direction hd1 and a second horizontal direction hd2 that is perpendicular to the first horizontal direction hd1.

The first conductive material layer 12L may include at least one conductive material layer, which may be at least one metallic material layer. For example, the first conductive material layer 12L may include a layer stack, from bottom to top, of a first metal layer 122L (such as a tungsten layer) and a first metal nitride layer 124L (such as a tungsten nitride layer or a titanium nitride layer). The thickness of the first metal layer 122L may be in a range from 21 nm to 100 nm, such as from 30 nm to 70 nm, although lesser and greater thicknesses may also be used. The thickness of the first metal nitride layer 124L may be in a range from 1 nm to 10 nm, such as from 1.5 nm to 5 nm, although lesser and greater thicknesses may also be used.

The first selector layer 14L may include a non-Ohmic material that provides electrical connection or electrical isolation depending on the magnitude and/or the polarity of an externally applied voltage bias thereacross. In one embodiment, the first selector layer 14L includes at least one threshold switch material layer. The at least one threshold switch material layer may include any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) may be non-crystalline (for example, amorphous) in a high resistance state, and may remain non-crystalline (for example, remain amorphous) in a low resistance state during application of a voltage above its threshold voltage across the OTS material. The OTS material may revert back to the high resistance state when the high voltage above its threshold voltage is removed. Throughout the resistive state changes, the ovonic threshold switch material may remain non-crystalline (e.g., amorphous). In one embodiment, the ovonic threshold switch material may comprise layer a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer may include a first ovonic threshold switch material layer 144L which contains any ovonic threshold switch material. In one embodiment, the first ovonic threshold switch material layer 144L may include, and/or may consist essentially of, a GeSeAs compound, a GeSe compound, a SeAs compound, a GeTe compound, or a SiTe compound.

In one embodiment, the material of the first ovonic threshold switch material layer 144L may be selected such that the resistivity of the first ovonic threshold switch material layer 144L decreases at least by two orders of magnitude (i.e., by more than a factor of 100) upon application of an external bias voltage that exceeds a critical bias voltage magnitude (also referred to as threshold voltage). In one embodiment, the composition and the thickness of the first ovonic threshold switch material layer 144L may be selected such that the critical bias voltage magnitude may be in a range from 1 V to 4 V, although lesser and greater voltages may also be used for the critical bias voltage magnitude. The thickness of the first ovonic threshold switch material layer 144L may be, for example, in a range from 5 nm to 50 nm, such as from 10 nm to 30 nm, although lesser and greater thicknesses may also be used.

The first selector layer 14L may include an optional first upper barrier material layer 146L overlying the first ovonic threshold switch material layer 144L and an optional first lower barrier material layer 142L underlying the first ovonic threshold switch material layer 144L. The optional first upper and/or lower barrier material layers (146L, 142L) include a material that suppresses diffusion of the material of the first ovonic threshold switch material layer 144L. For example, the first upper and/or lower barrier material layers (146L, 142L) may include amorphous carbon or diamond-like carbon (DLC). In one embodiment, the first upper barrier material layers 146L may include an upper amorphous carbon layer that contacts a top surface of the first ovonic threshold switch material layer 144L, and the first lower barrier material layer 142L may include a lower amorphous carbon layer that contacts a bottom surface of the first ovonic threshold switch material layer 144L. The thickness of the first upper barrier material layers 146L may be in a range from 4 nm to 40 nm, such as from 8 nm to 21 nm, although lesser and greater thicknesses may also be used. The thickness of the first lower barrier material layer 142L may be in a range from 4 nm to 40 nm, such as from 8 nm to 21 nm, although lesser and greater thicknesses may also be used.

The first phase change memory layer 16L may include a first phase change memory material layer 164L. The first phase change memory material layer 164L may include a phase change memory material. As used herein, a "phase change memory material" refers to a material having at least two different phases providing different resistivity. The at least two different phases may be provided, for example, by controlling the rate of cooling from a heated state to provide an amorphous state having a higher resistivity and a polycrystalline state having a lower resistivity. In this case, the higher resistivity state of the phase change memory material may be achieved by faster quenching of the phase change memory material after heating to an amorphous state, and the lower resistivity state of the phase change memory material may be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer may include, and/or may consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the first phase change memory material layer 164L may be in a range from 1 nm to 60 nm, such as from 3 nm to 40 nm and/or from 10 nm to 25 nm, although lesser and greater thicknesses may also be used.

The first phase change memory layer 16L may optionally include a first lower conductive liner layer 162L underlying the first phase change memory material layer 164L, and may optionally include a first upper conductive liner layer 166L overlying the first phase change memory material layer 164L. The optional first lower conductive liner layer 162L and/or the optional first upper conductive liner layer 166L, if present, include a conductive metallic material. In one embodiment, the first lower conductive liner layer 162L and/or the first upper conductive liner layer 166L may include a conductive metallic nitride such as titanium nitride, tantalum nitride, or tungsten nitride. The thickness of each of the first lower conductive liner layer 162L and the first upper conductive liner layer 166L may be in a range from 1 nm to 10 nm, such as from 1.5 nm to 5 nm, although lesser and greater thicknesses may also be used.

The optional first barrier layer 17L, if present, includes a barrier material, and may be formed on top of the first phase change memory layer 16L. The barrier material may be a material that may prevent diffusion of, and provide effective encapsulation of, the first phase change memory material. In one embodiment, the barrier material may include, and/or may consist essentially of, amorphous carbon. The thickness of the first barrier layer 17L may be in a range from 12 nm to 75 nm, such as from 21 nm to 60 nm, although lesser and grater thicknesses may also be used.

The first hard mask layer 175L may include a hard mask material that may be used as a planarization stopping structure in a subsequent planarization process. The first hard mask layer 175L may include a material selected from a metal, a dielectric material, or a semiconductor material. For example, the first hard mask layer 175L may include silicon nitride, a dielectric metal oxide, or a metal. In one embodiment, the first hard mask layer 175L may include silicon nitride. The thickness of the first hard mask layer 175L may be in a range from 3 nm to 30 nm, such as from 6 nm to 15 nm, although lesser and greater thicknesses may also be used.

Referring to FIGS. 2A-2D, a first photoresist layer 177 may be applied over the first material layer stack (12L, 14L, 16L, 17L, 175L), and may be lithographically patterned to form a line and space pattern. The first photoresist layer 177 may have a plurality of strip portions that laterally extend along a first horizontal direction hd1 and having a uniform pitch along a second horizontal direction hd2 that is perpendicular to the first horizontal direction hd1. The uniform pitch may be, for example, in a range from 30 nm to 600 nm. An anisotropic etch process may be performed to transfer the pattern of the first photoresist layer 177 through the first hard mask layer 175L. The first hard mask layer 175L may be patterned into first hard mask strips 175. In one embodiment, any suitable double patterning method may be used to pattern the first photoresist layer 177 and/or the first hard mask strips 175 in order to obtain a finer pitch and/or strip width. The first hard mask strips 175 may laterally extend along the first horizontal direction hd1 and may have the uniform pitch along the second horizontal direction hd2. In one embodiment, the first hard mask strips 175 may have a uniform width along the second horizontal direction hd2, which is herein referred to as the first width w1. The first width w1 may be in a range from 15 nm to 300 nm, although lesser and greater dimensions may also be used. The first photoresist layer 177 may be subsequently removed, for example, by ashing.

Figure 3A:
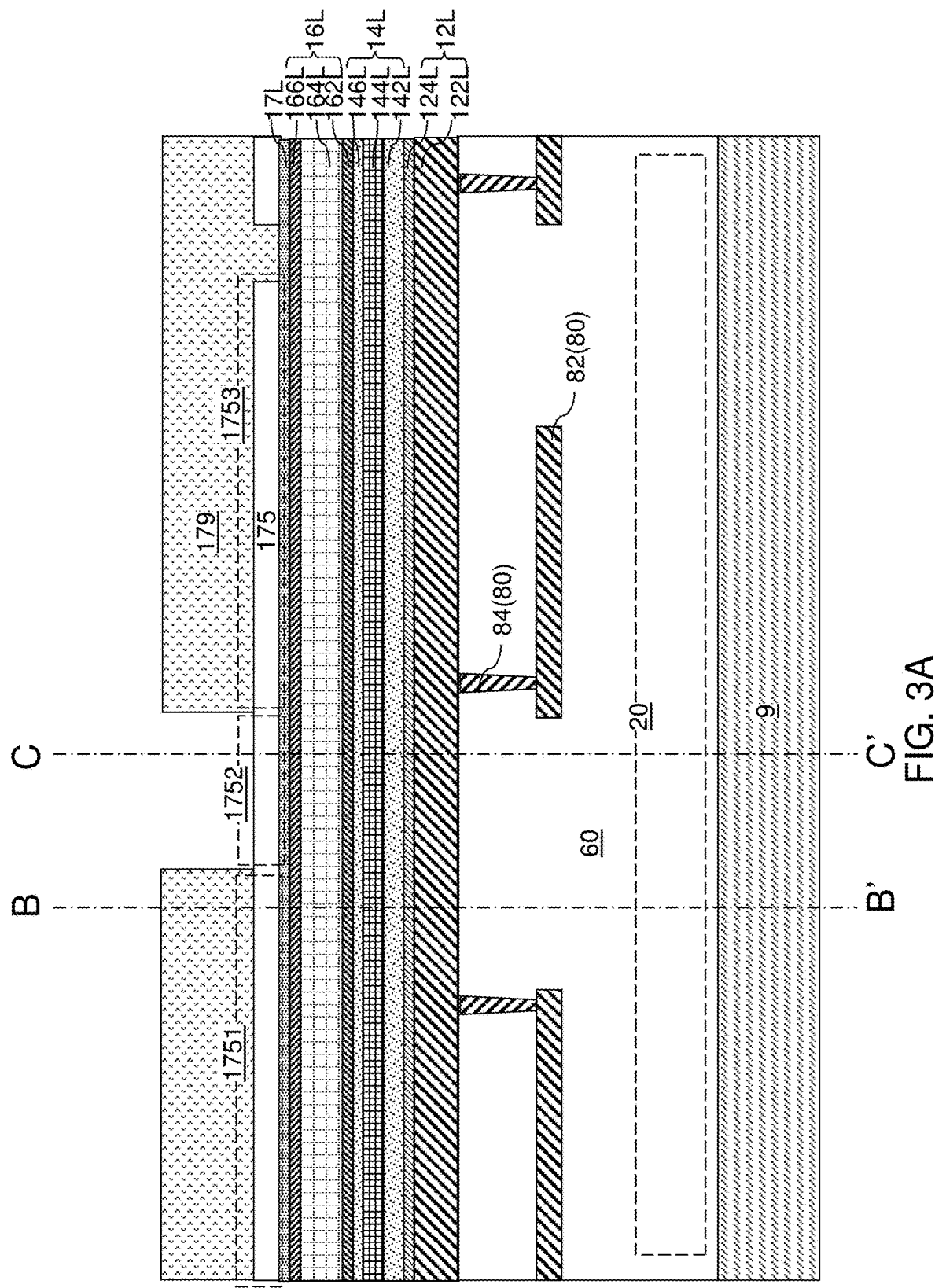
FIG. 3A is a vertical cross-sectional view of the first exemplary structure after covering first portions of the hard mask strips with a masking material layer and slimming second portions of the hard mask strips according to the first embodiment of the present disclosure.
Figure 3C:
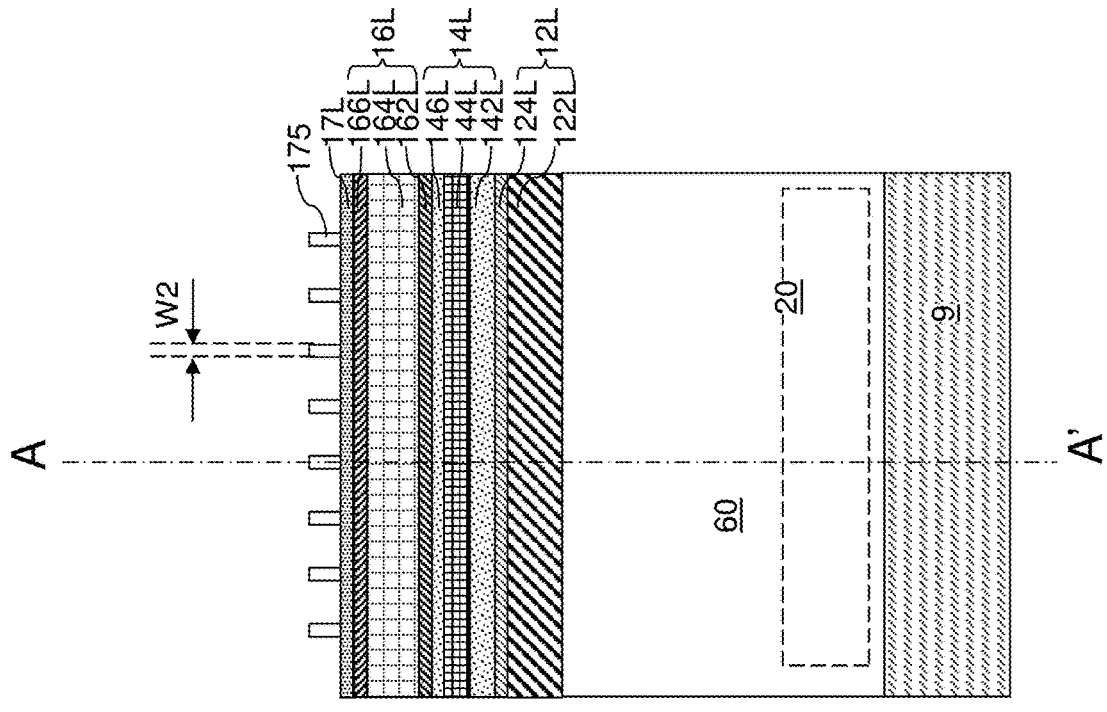
FIG. 3C is a vertical cross-sectional view of the first exemplary structure along the vertical plane C-C' of FIG. 3A.
Figure 3B:
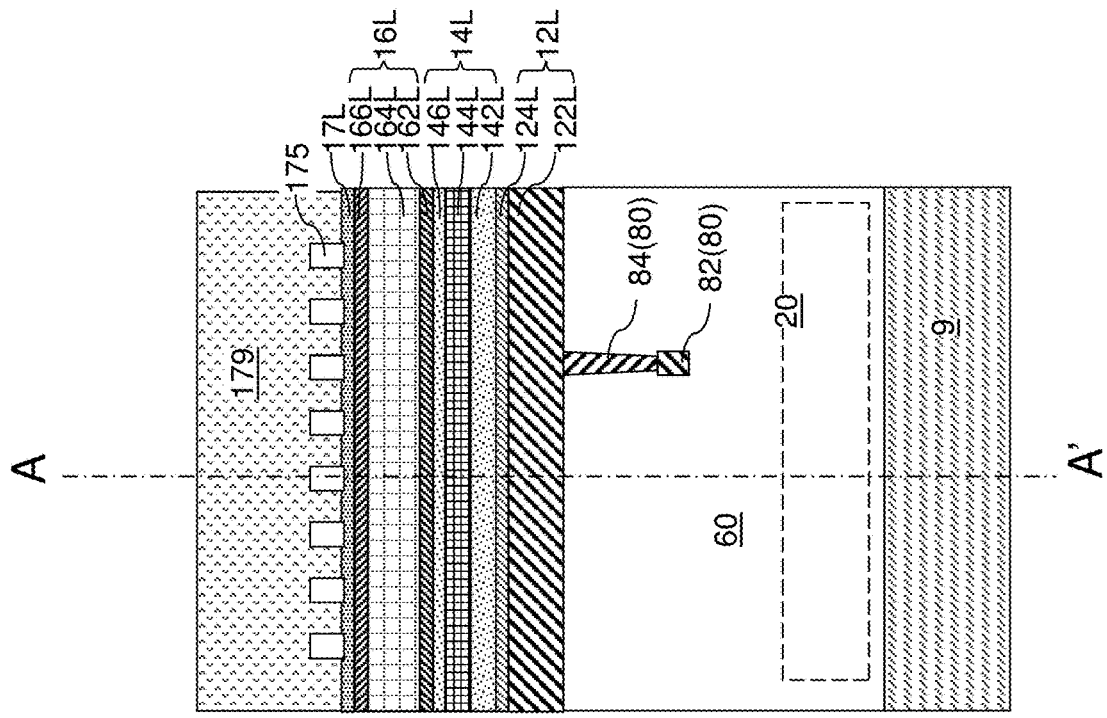
FIG. 3B is a vertical cross-sectional view of the first exemplary structure along the vertical plane B-B' of FIG. 3A.
Figure 3D:
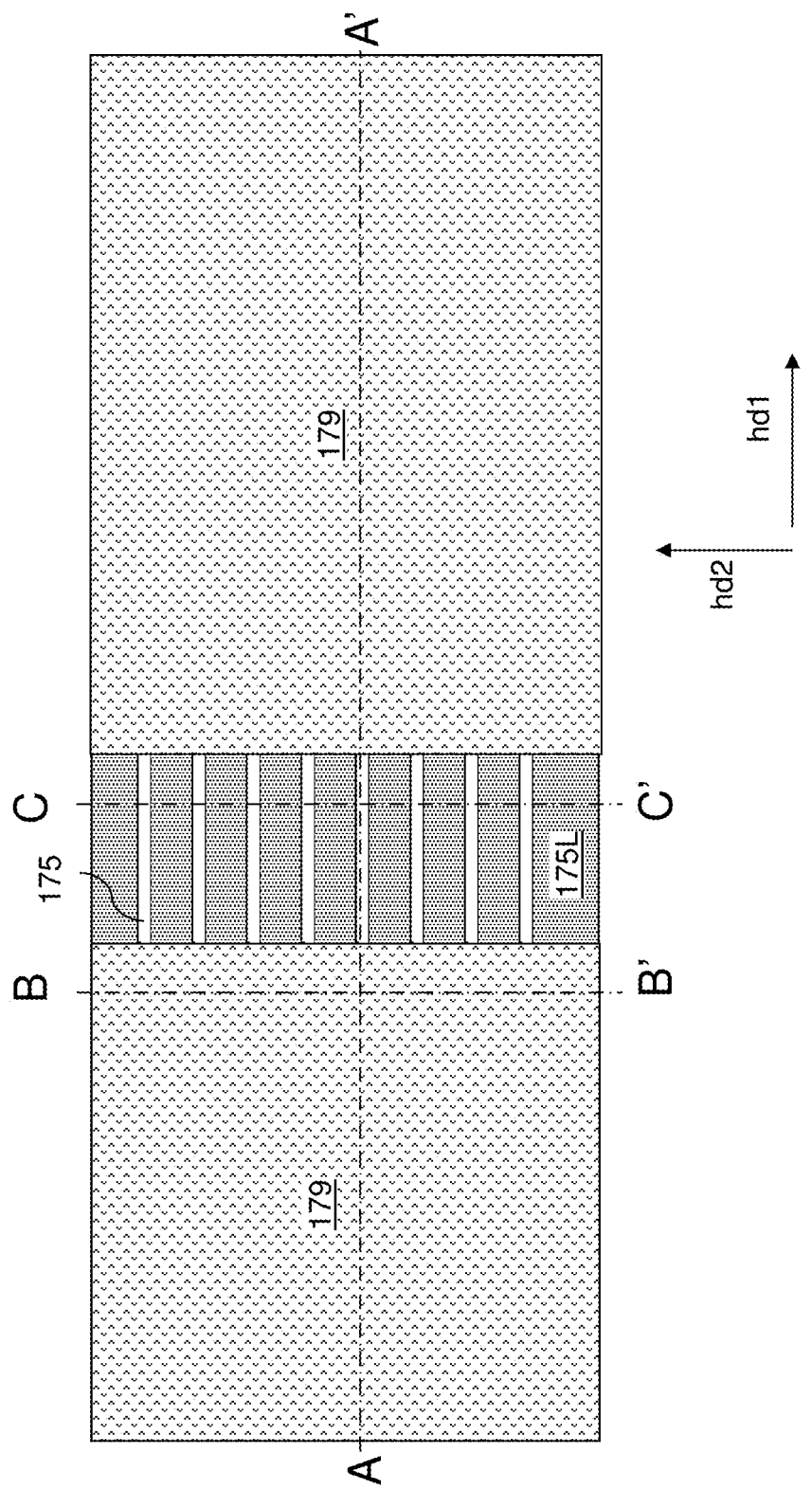
FIG. 3D is a top-down view of the first exemplary structure of FIGS. 3A-3C. The vertical plane A-A' is the plane of the vertical cross-sectional view of FIGS. 3A-3C. The vertical plane B-B' is the plane of the vertical cross-sectional view of FIGS. 3A-3C. The vertical plane C-C' is the plane of the vertical cross-sectional view of FIGS. 3A-3C.
Figure 4C:
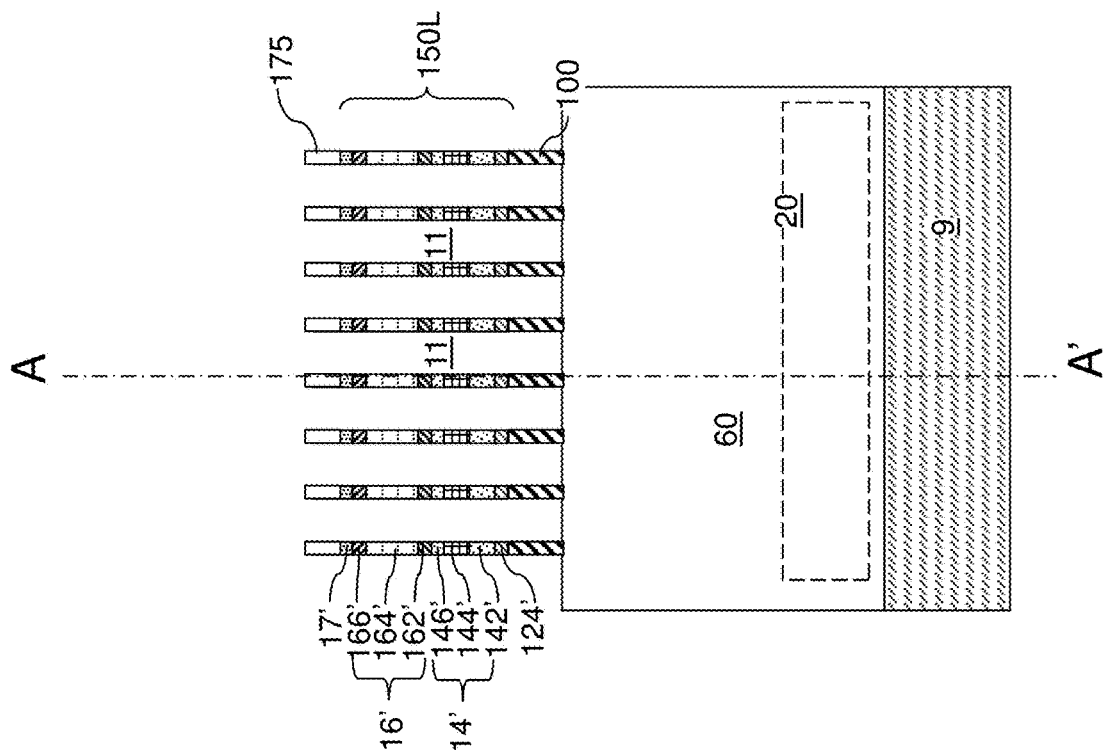
FIG. 4C is a vertical cross-sectional view of the first exemplary structure along the vertical plane C-C' of FIG. 4A.
Figure 4B:
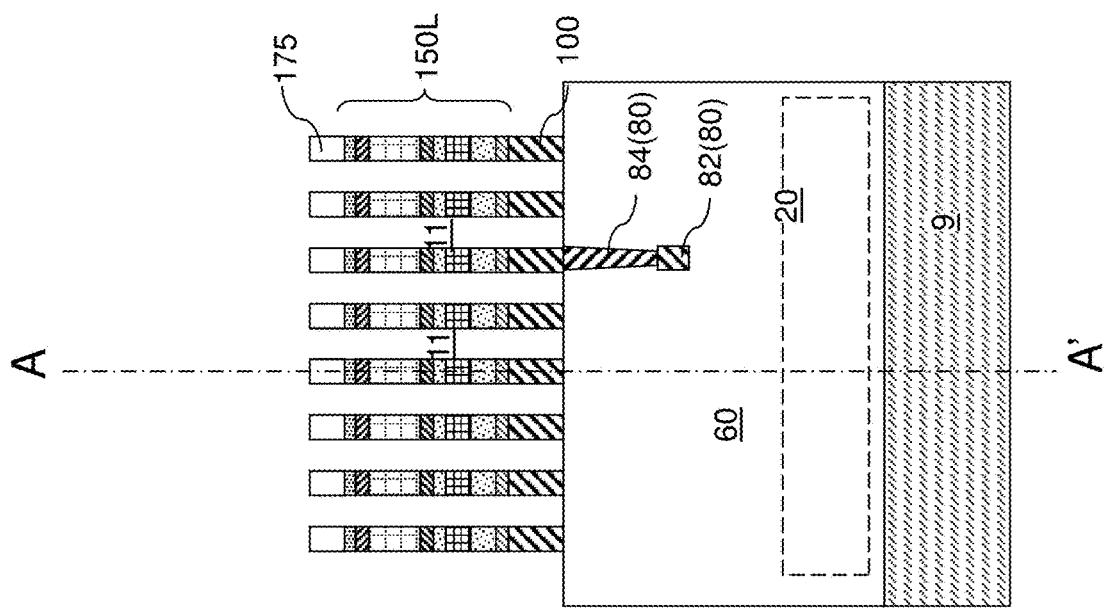
FIG. 4B is a vertical cross-sectional view of the first exemplary structure along the vertical plane B-B' of FIG. 4A.
Figure 4D:
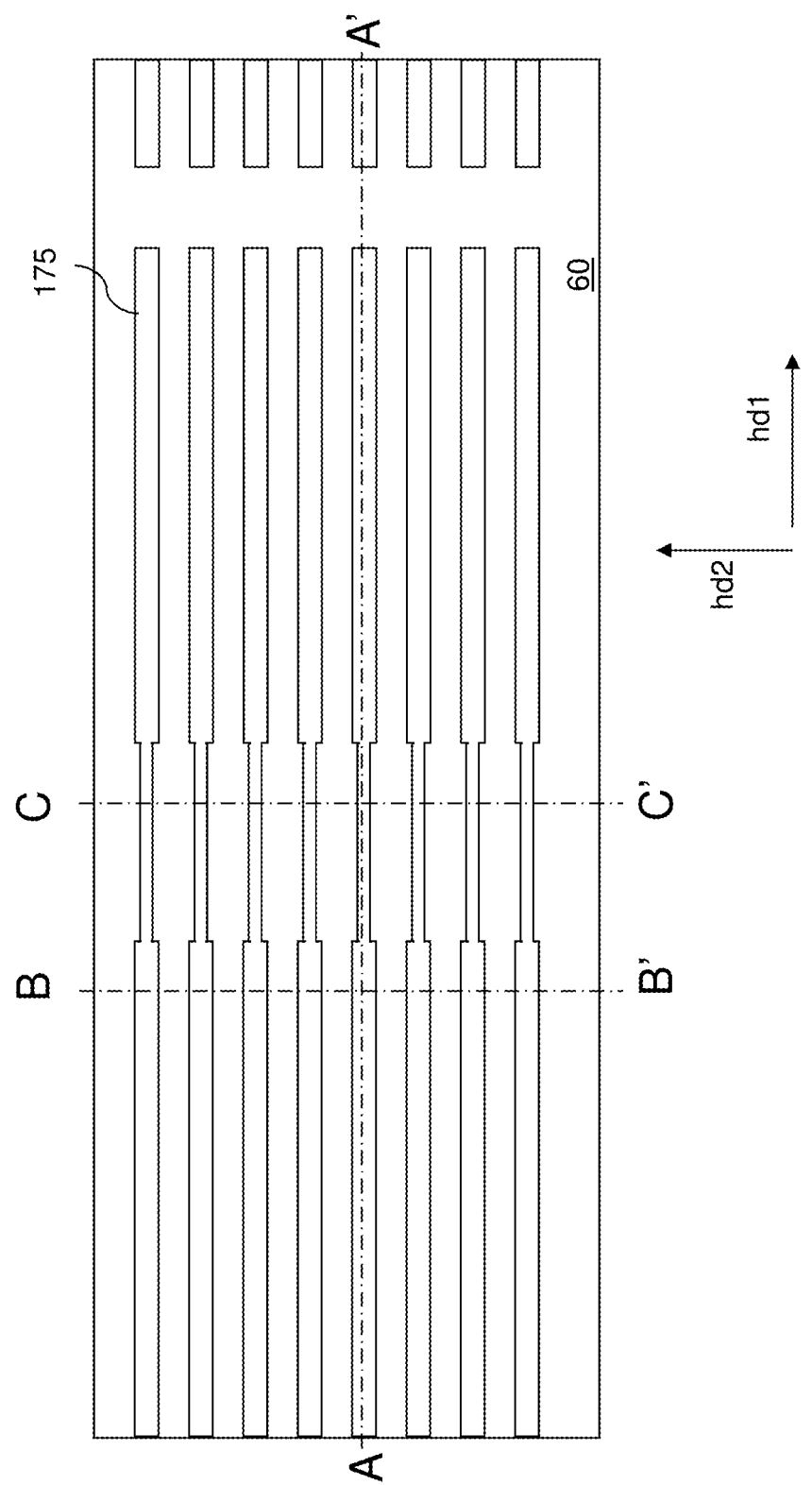
FIG. 4D is a top-down view of the first exemplary structure of FIGS. 4A-4C. The vertical plane A-A' is the plane of the vertical cross-sectional view of FIGS. 4A-4C. The vertical plane B-B' is the plane of the vertical cross-sectional view of FIGS. 4A-4C. The vertical plane C-C' is the plane of the vertical cross-sectional view of FIGS. 4A-4C.
Figure 5C:
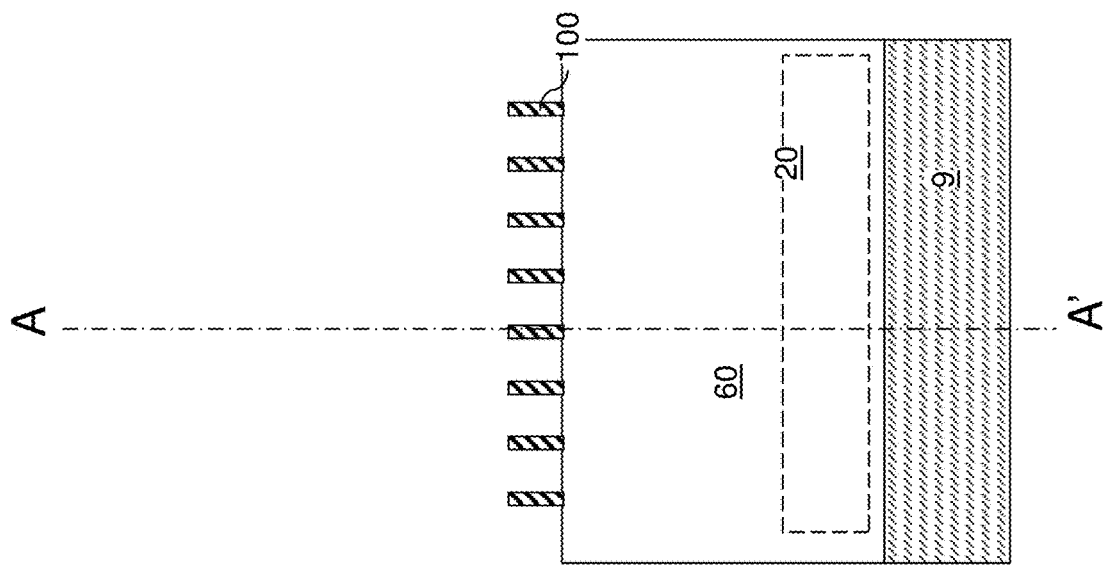
FIG. 5C is a vertical cross-sectional view of the first exemplary structure along the vertical plane C-C' of FIG. 5A.
Figure 5B:
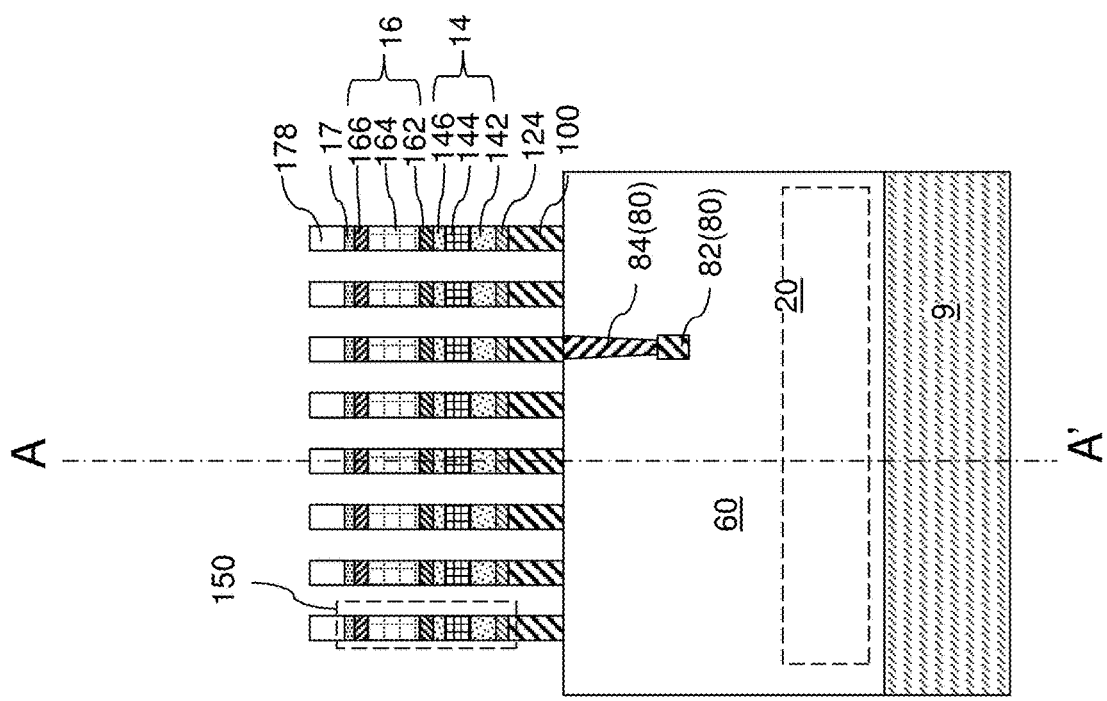
FIG. 5B is a vertical cross-sectional view of the first exemplary structure along the vertical plane B-B' of FIG. 5A.
Figure 5D:
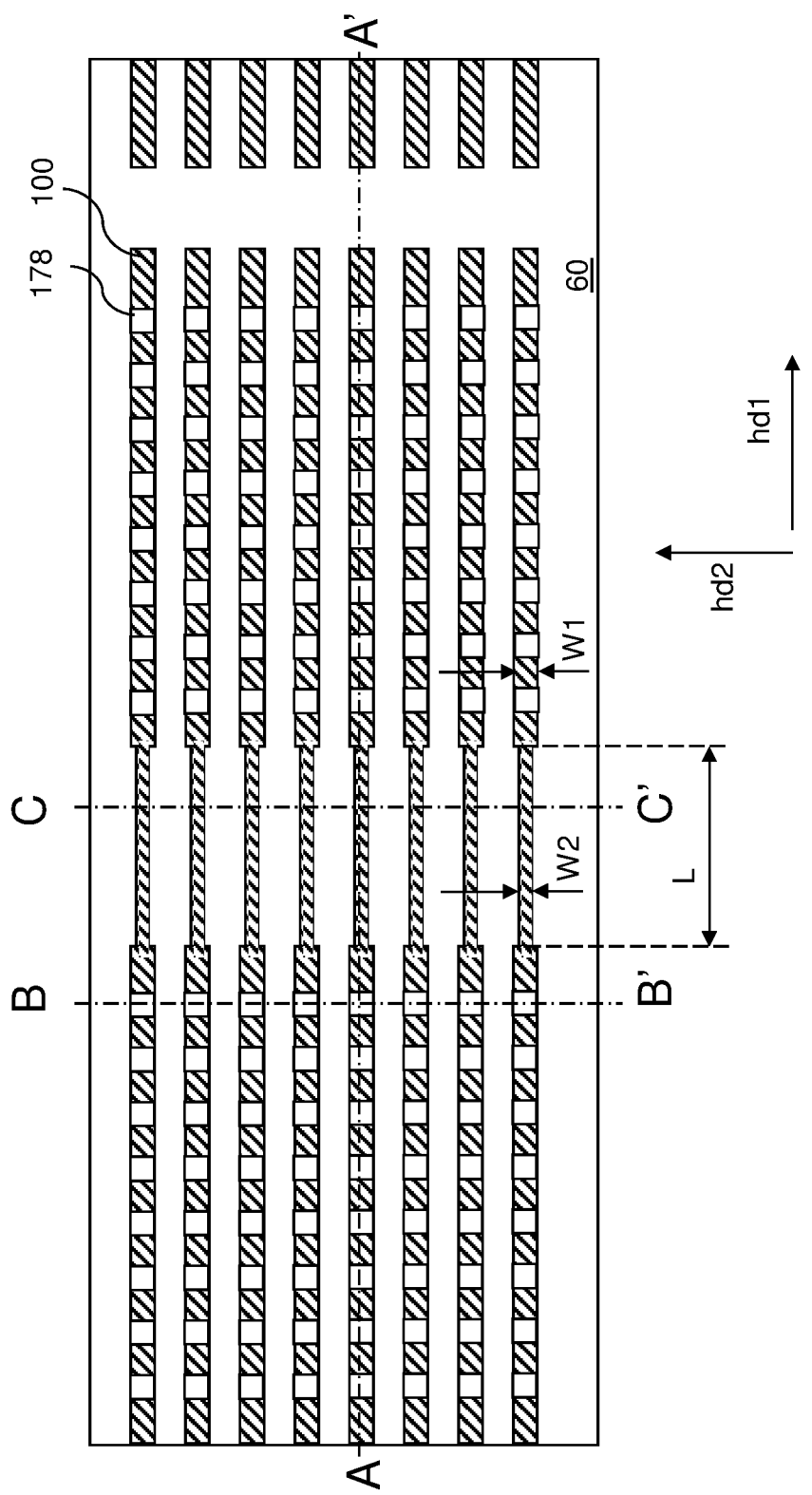
FIG. 5D is a top-down view of the first exemplary structure of FIGS. 5A-5C. The vertical plane A-A' is the plane of the vertical cross-sectional view of FIGS. 5A-5C. The vertical plane B-B' is the plane of the vertical cross-sectional view of FIGS. 5A-5C. The vertical plane C-C' is the plane of the vertical cross-sectional view of FIGS. 5A-5C.
Figure 6C:
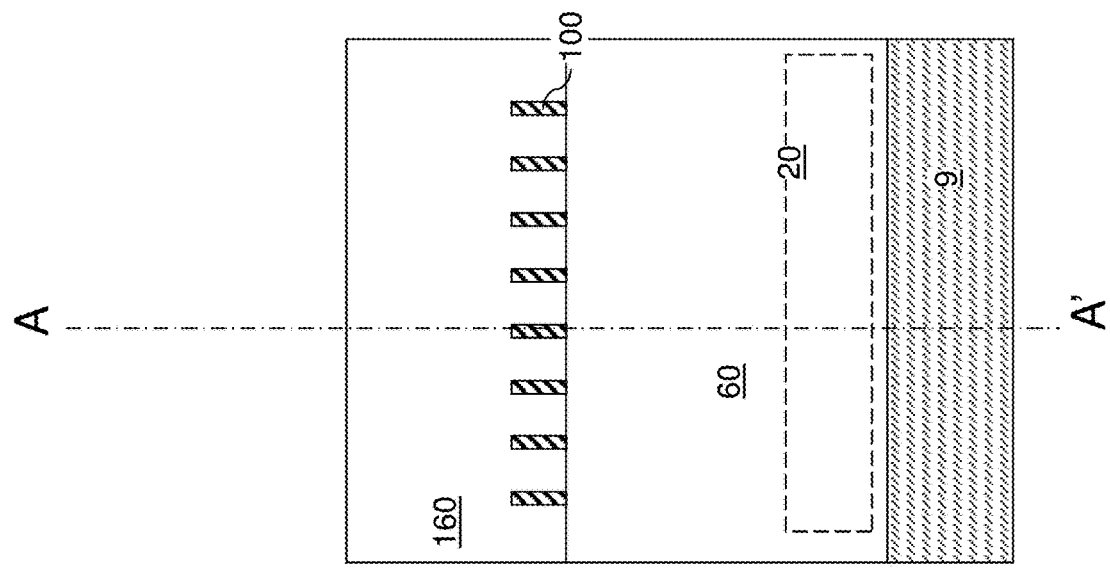
FIG. 6C is a vertical cross-sectional view of the first exemplary structure along the vertical plane C-C' of FIG. 6A.
Figure 6B:
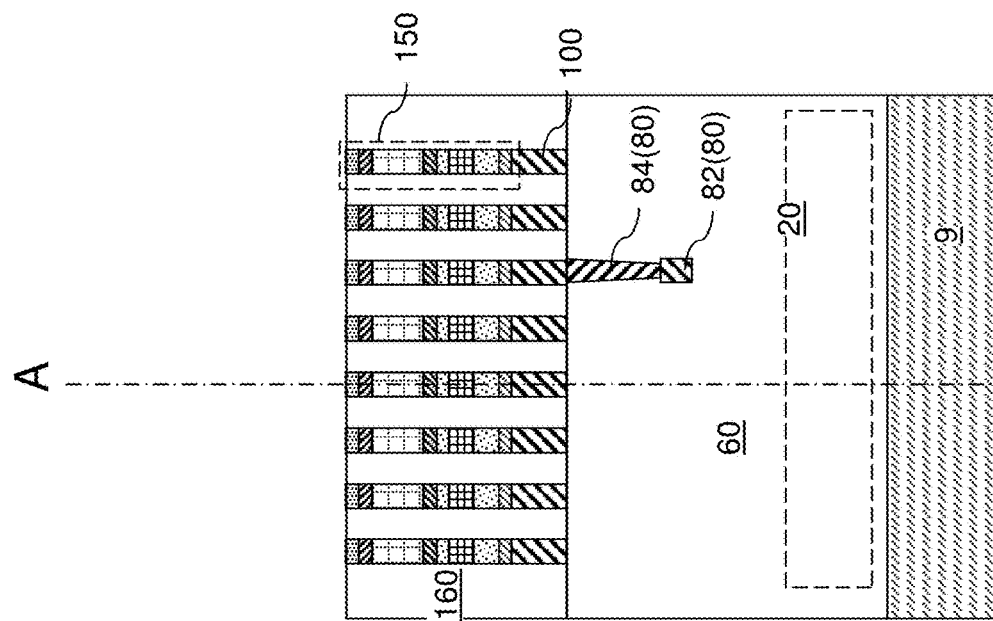
FIG. 6B is a vertical cross-sectional view of the first exemplary structure along the vertical plane B-B' of FIG. 6A.
Figure 6D:
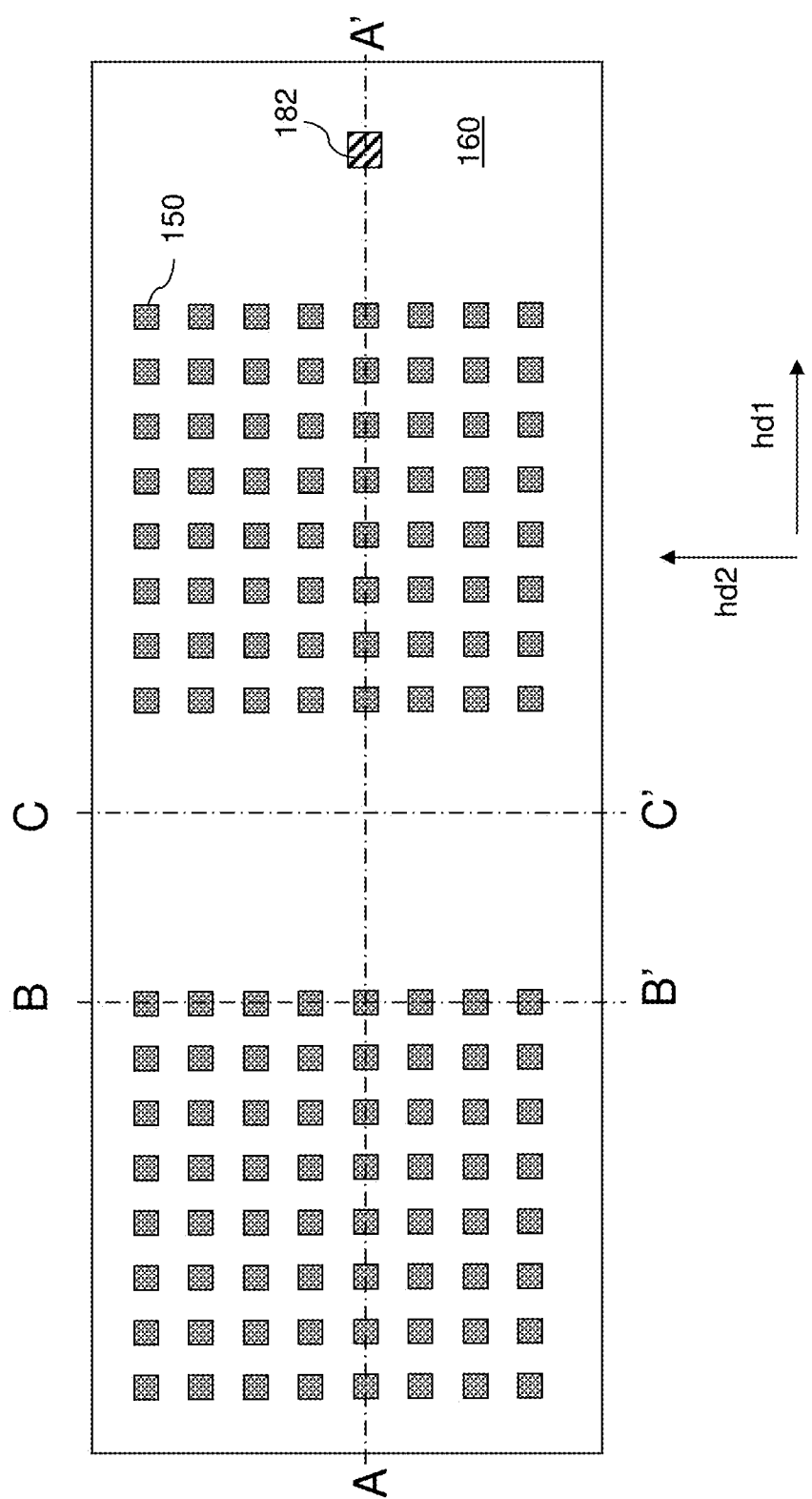
FIG. 6D is a top-down view of the first exemplary structure of FIGS. 6A-6C. The vertical plane A-A' is the plane of the vertical cross-sectional view of FIGS. 6A-6C. The vertical plane B-B' is the plane of the vertical cross-sectional view of FIGS. 6A-6C. The vertical plane C-C' is the plane of the vertical cross-sectional view of FIGS. 6A-6C.
Figure 7A:
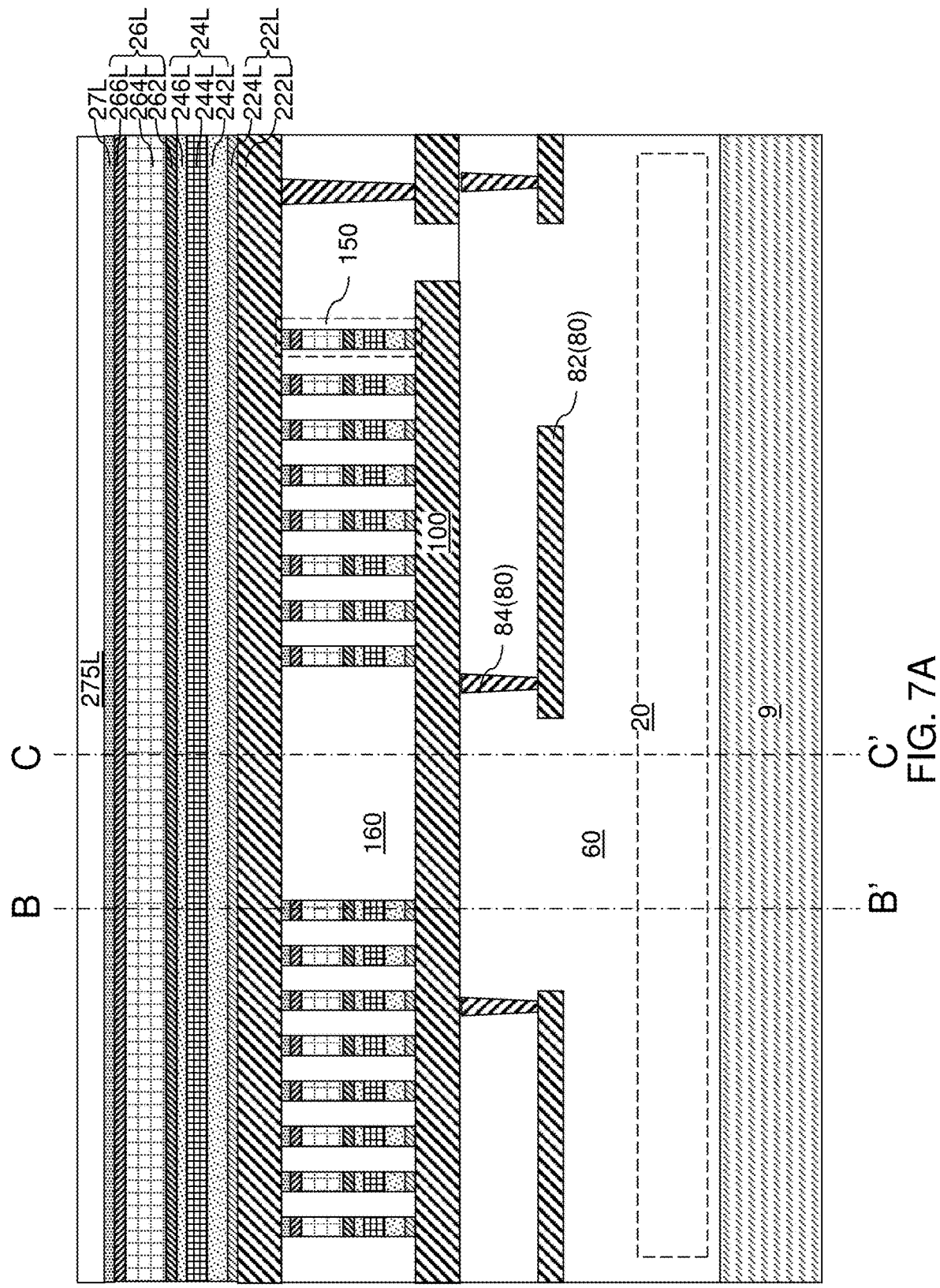
FIG. 7A is a vertical cross-sectional view of the first exemplary structure after formation of a second layer stack including a second conductive material layer, a second selector layer, a second phase change memory layer, an optional second barrier layer, and a second hard mask layer according to the first embodiment of the present disclosure.
Figure 7C:
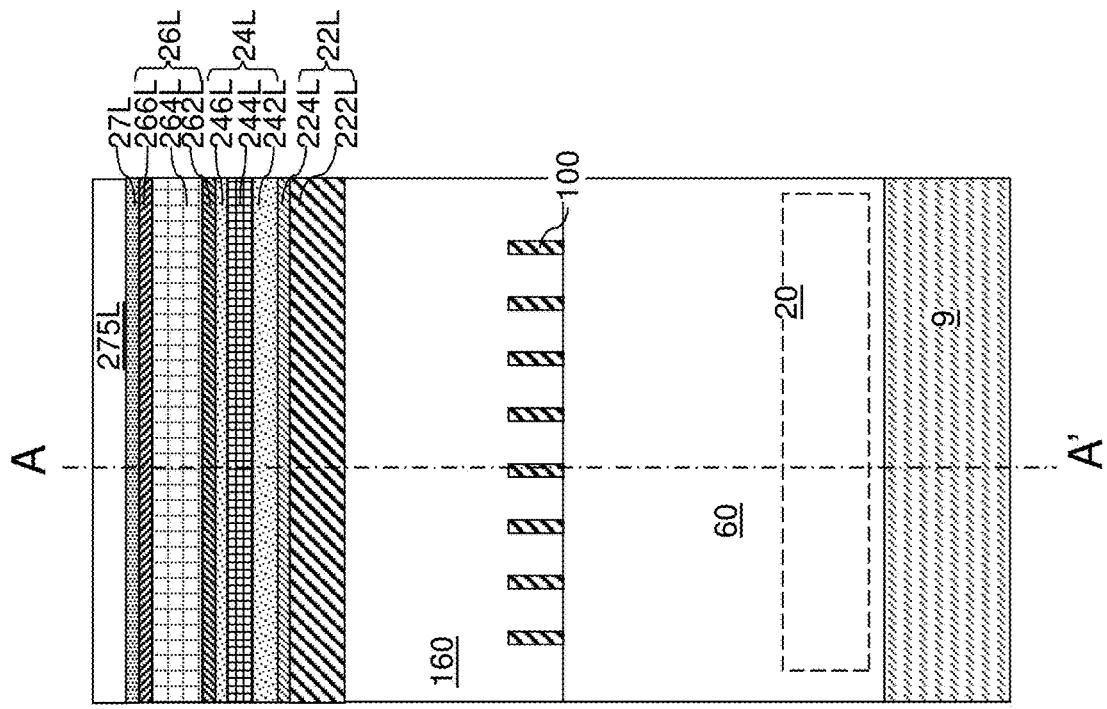
FIG. 7C is a vertical cross-sectional view of the first exemplary structure along the vertical plane C-C' of FIG. 7A.
Figure 7B:
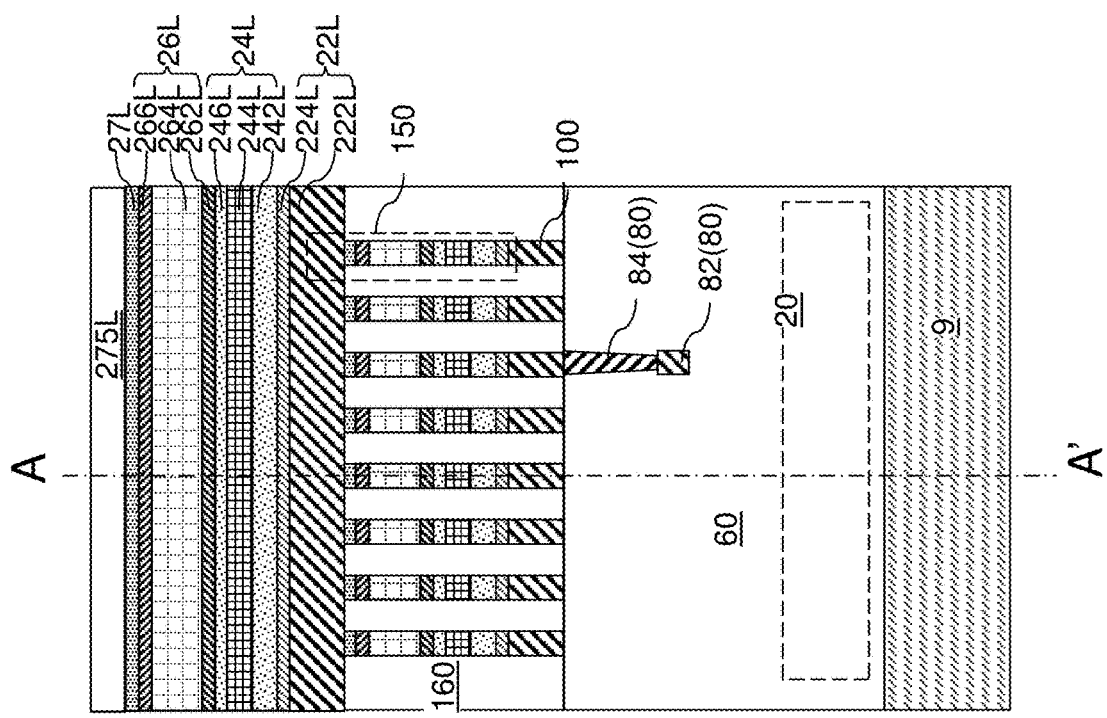
FIG. 7B is a vertical cross-sectional view of the first exemplary structure along the vertical plane B-B' of FIG. 7A.
Figure 7D:
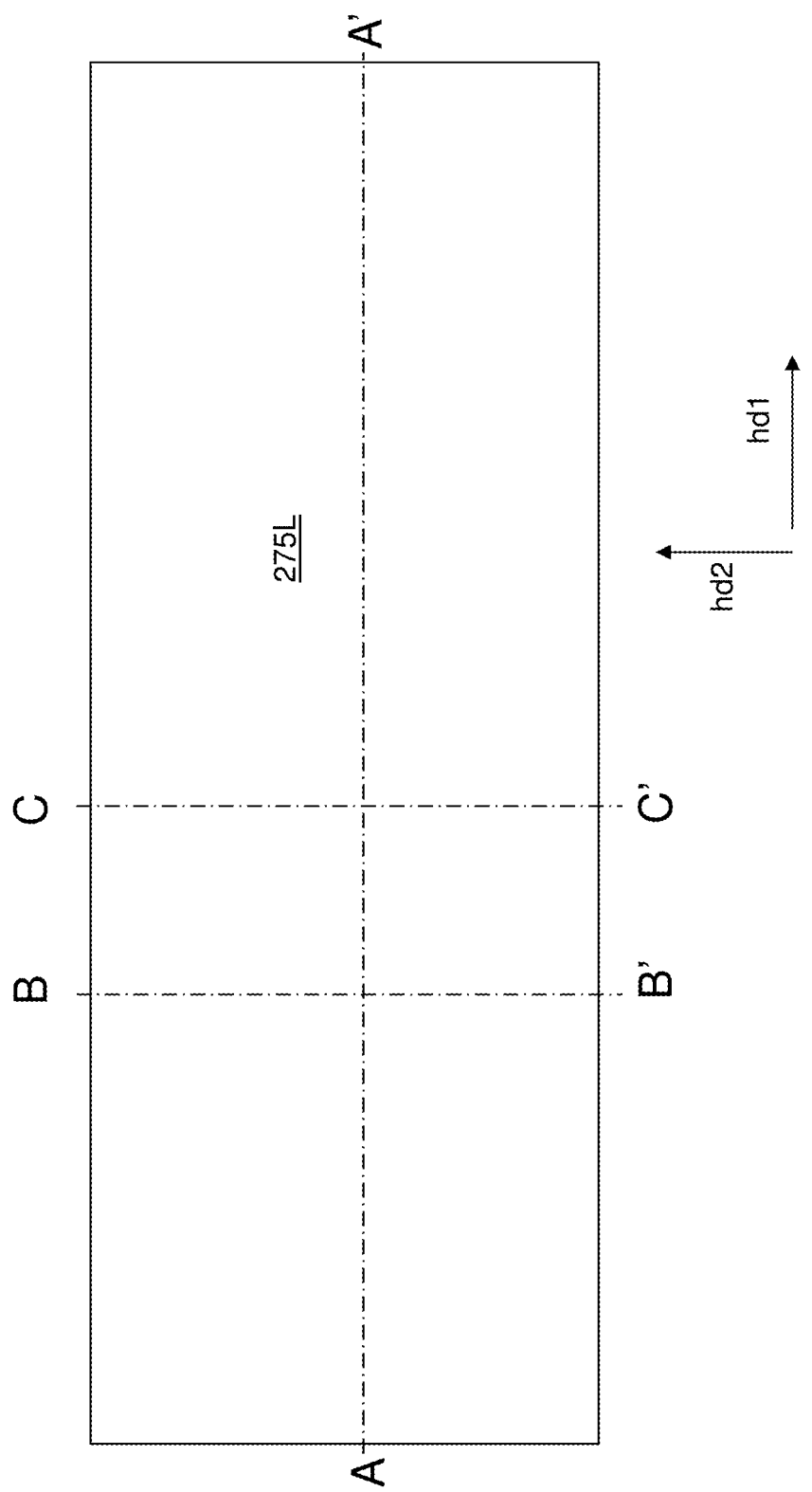
FIG. 7D is a top-down view of the first exemplary structure of FIGS. 7A-7C. The vertical plane A-A' is the plane of the vertical cross-sectional view of FIGS. 7A-7C. The vertical plane B-B' is the plane of the vertical cross-sectional view of FIGS. 7A-7C. The vertical plane C-C' is the plane of the vertical cross-sectional view of FIGS. 7A-7C.
Figure 8A:
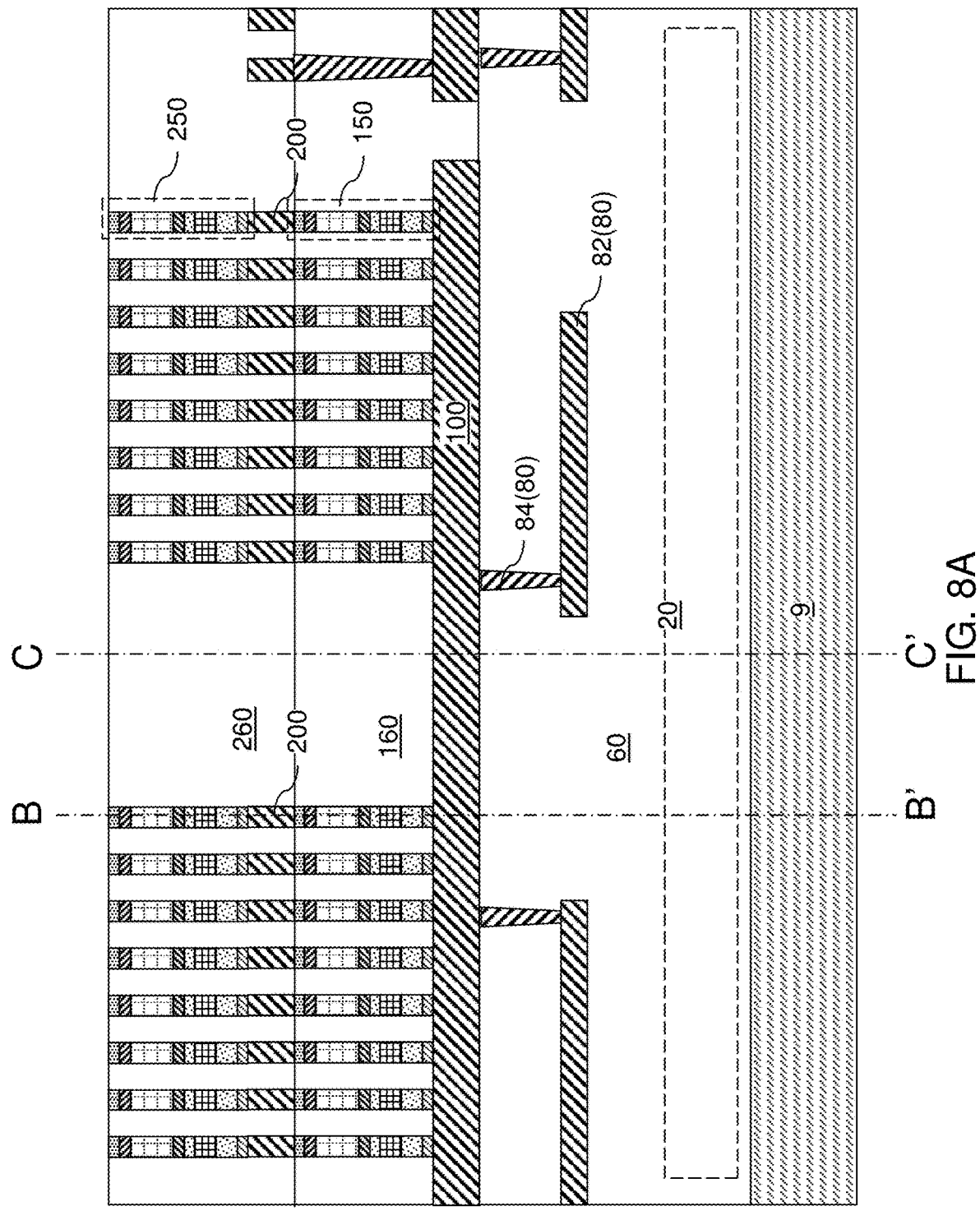
FIG. 8A is a vertical cross-sectional view of the first exemplary structure after formation of second electrically conductive lines, a two-dimensional rectangular array of second pillar structures, and a second dielectric material layer according to the first embodiment of the present disclosure.
Figure 8C:
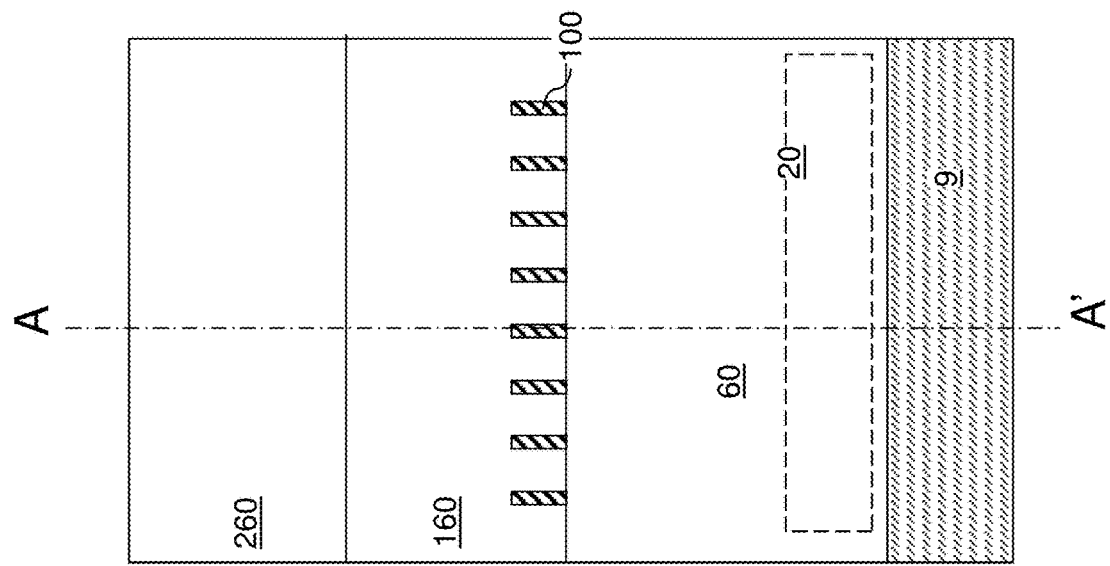
FIG. 8C is a vertical cross-sectional view of the first exemplary structure along the vertical plane C-C' of FIG. 8A.
Figure 8B:
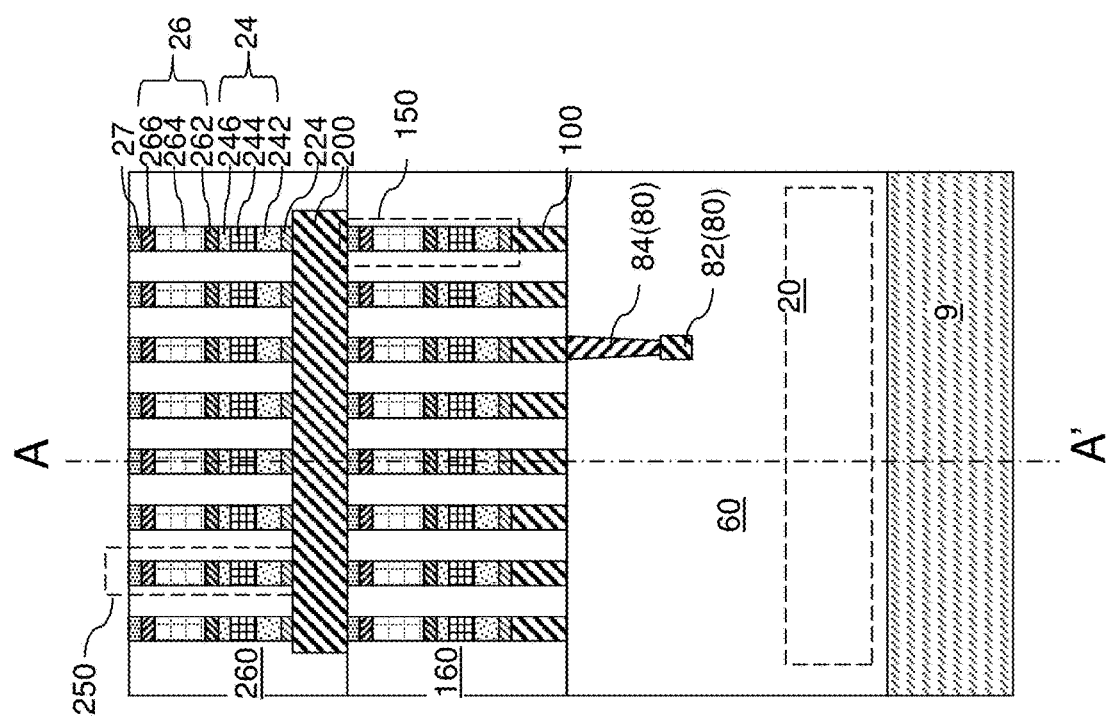
FIG. 8B is a vertical cross-sectional view of the first exemplary structure along the vertical plane B-B' of FIG. 8A.
Figure 8D:
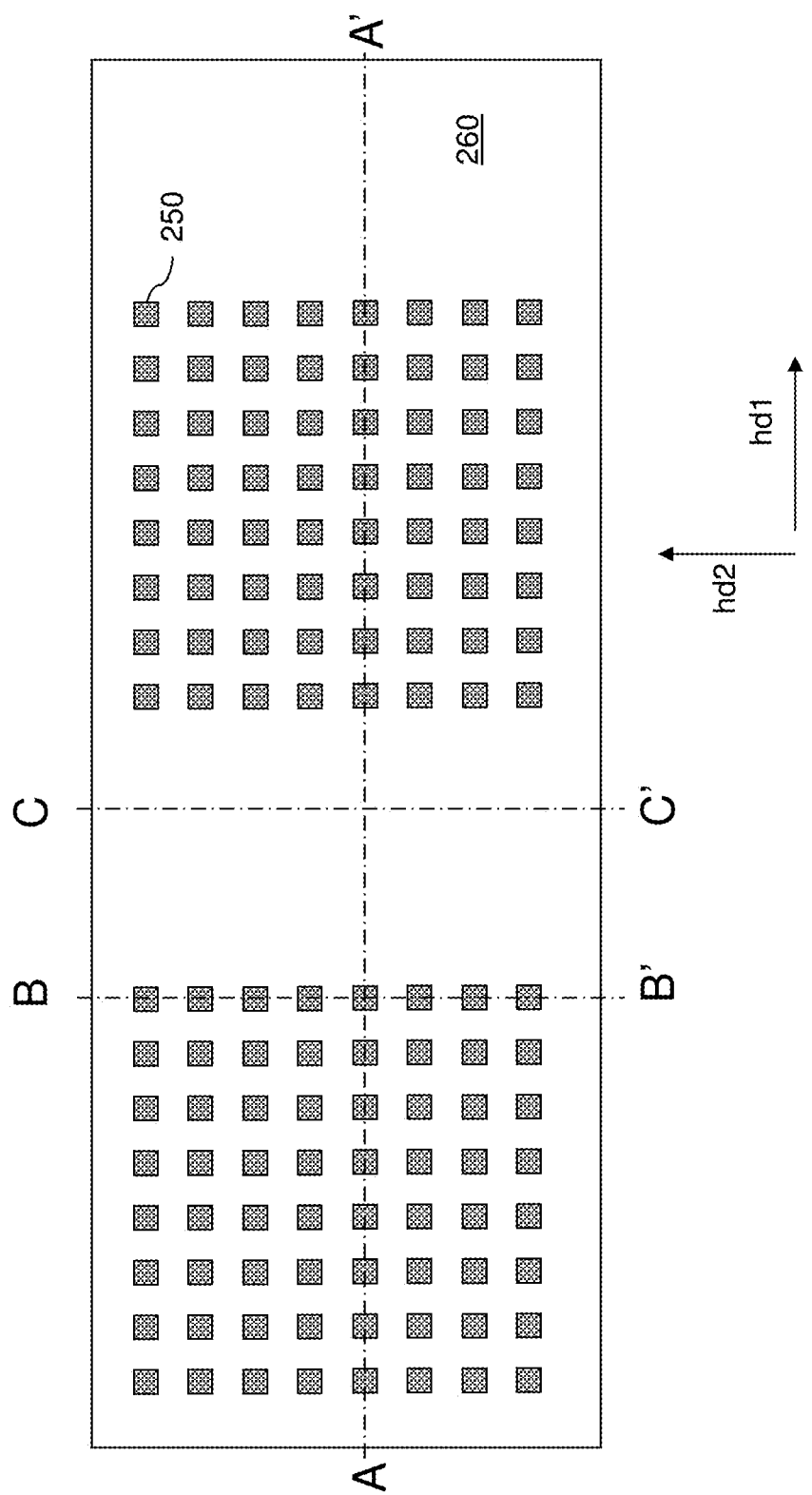
FIG. 8D is a top-down view of the first exemplary structure of FIGS. 8A-8C. The vertical plane A-A' is the plane of the vertical cross-sectional view of FIGS. 8A-8C. The vertical plane B-B' is the plane of the vertical cross-sectional view of FIGS. 8A-8C. The vertical plane C-C' is the plane of the vertical cross-sectional view of FIGS. 8A-8C.
Figure 9A:
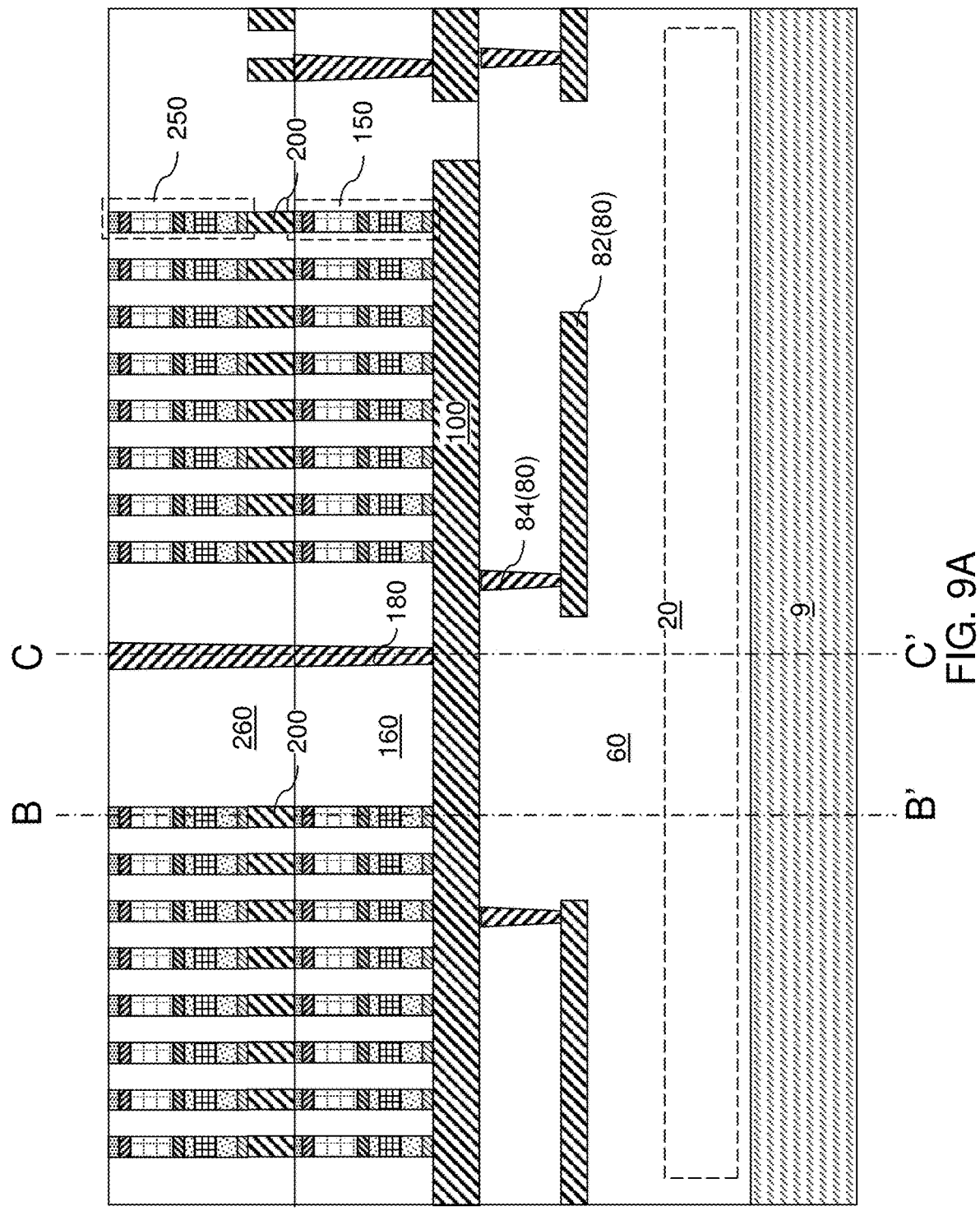
FIG. 9A is a vertical cross-sectional view of the first exemplary structure after formation of first conductive via structures according to the first embodiment of the present disclosure.
Figure 9C:
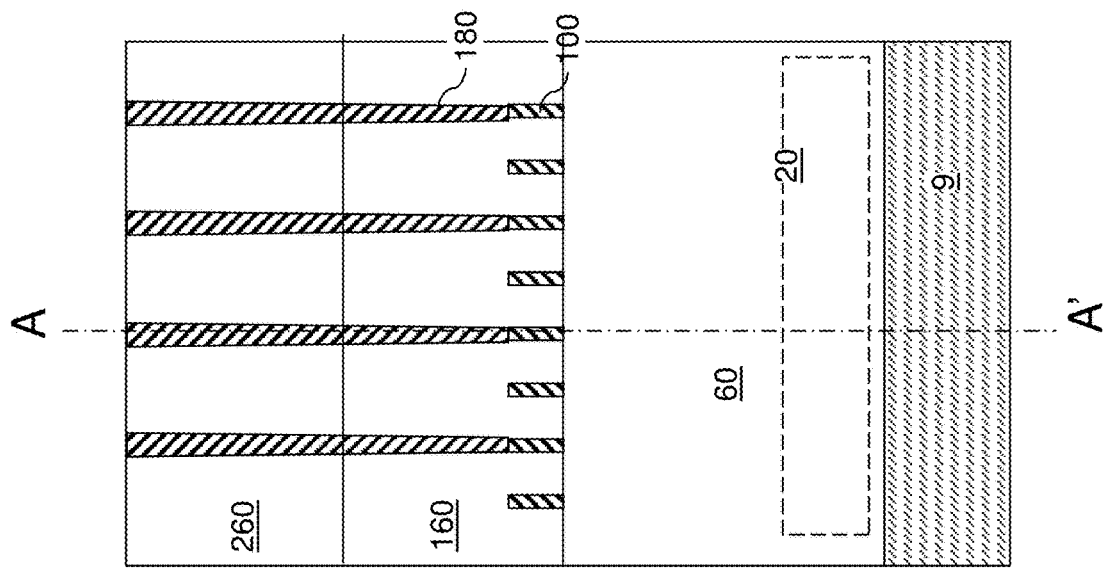
FIG. 9C is a vertical cross-sectional view of the first exemplary structure along the vertical plane C-C' of FIG. 9A.
Figure 9B:
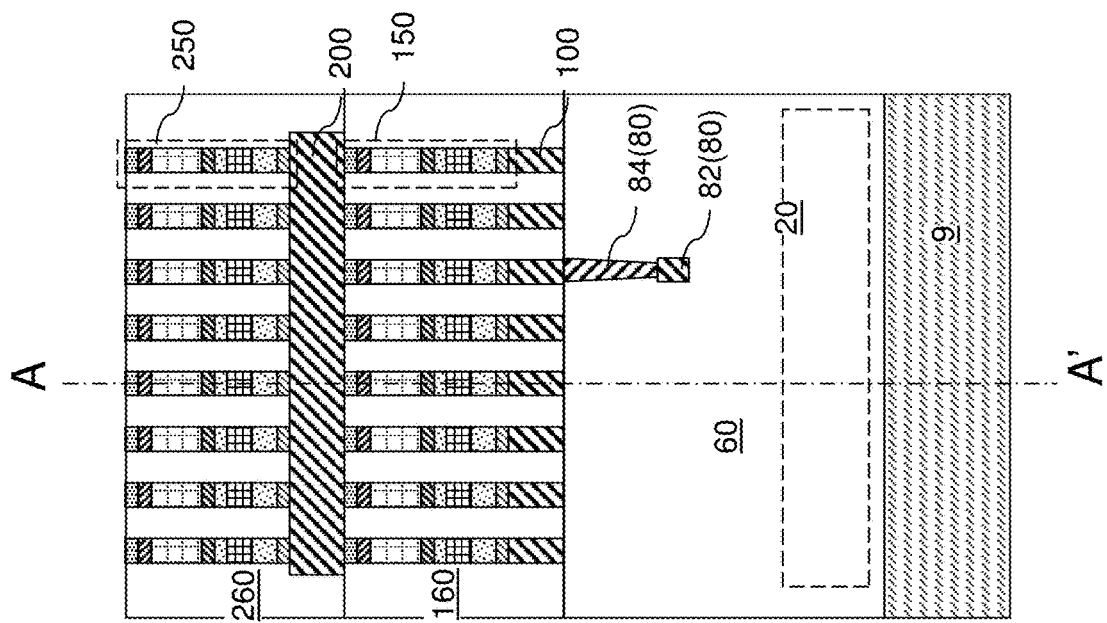
FIG. 9B is a vertical cross-sectional view of the first exemplary structure along the vertical plane B-B' of FIG. 9A.
Figure 9D:
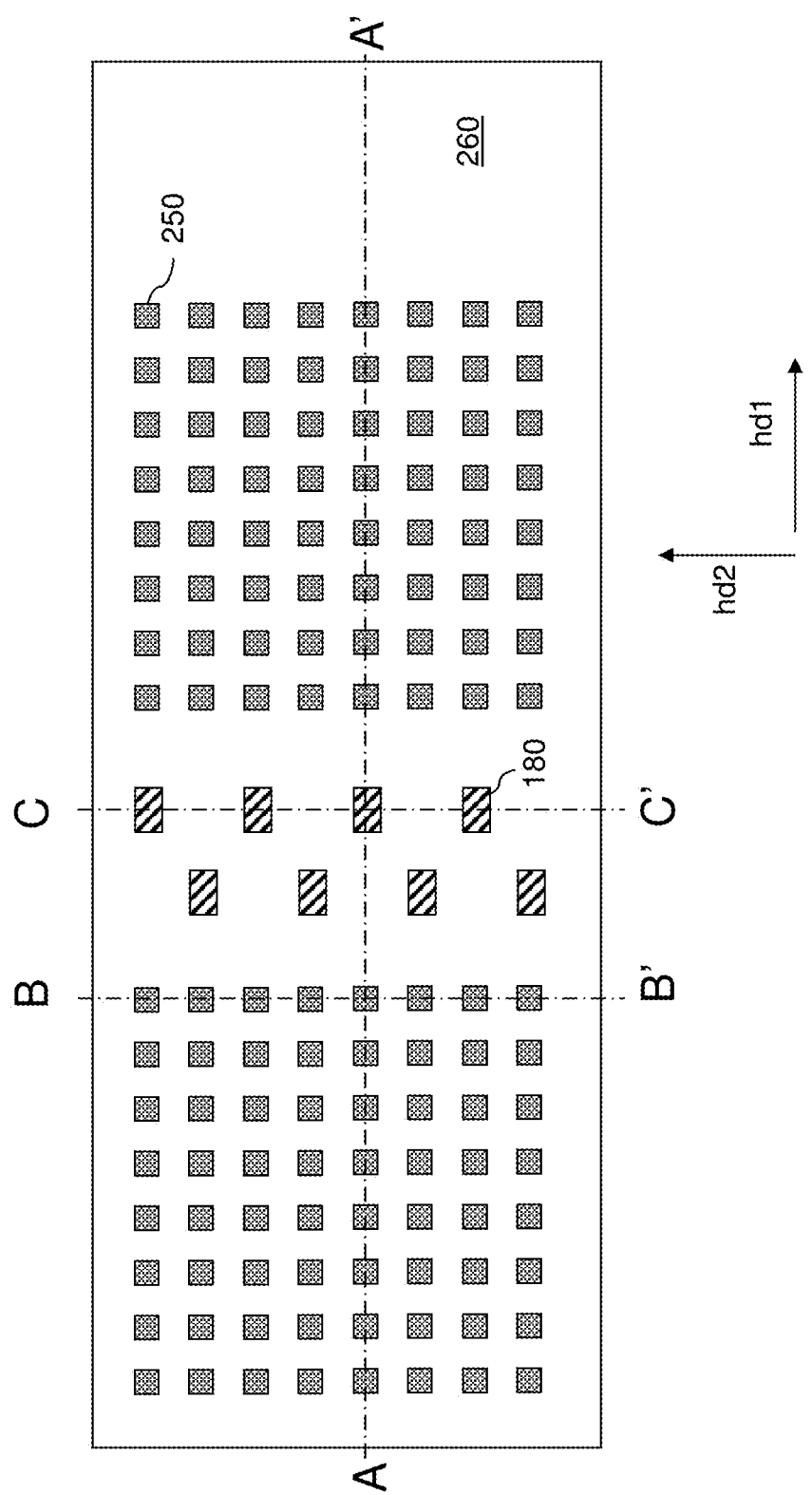
FIG. 9D is a top-down view of the first exemplary structure of FIGS. 9A-9C. The vertical plane A-A' is the plane of the vertical cross-sectional view of FIGS. 9A-9C. The vertical plane B-B' is the plane of the vertical cross-sectional view of FIGS. 9A-9C. The vertical plane C-C' is the plane of the vertical cross-sectional view of FIGS. 9A-9C.
Figure 9F:
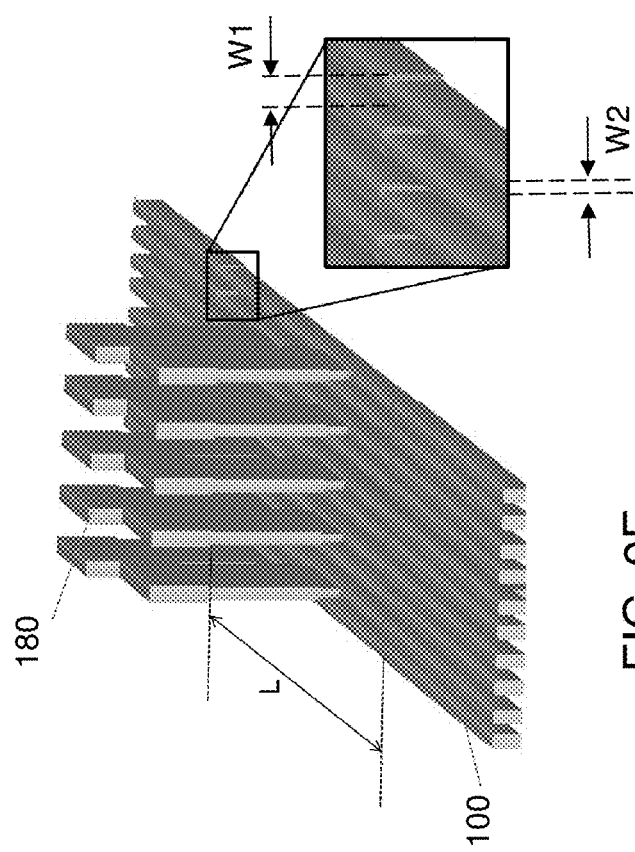
FIG. 9F is a schematic layout of the region of FIG. 9E.
Figure 9E:
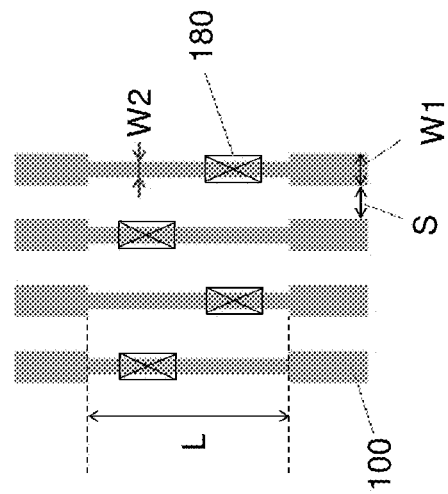
FIG. 9E is a perspective view of a region including the first conductive via structures in the first exemplary structure of FIGS. 9A-9D.
Figure 10C:
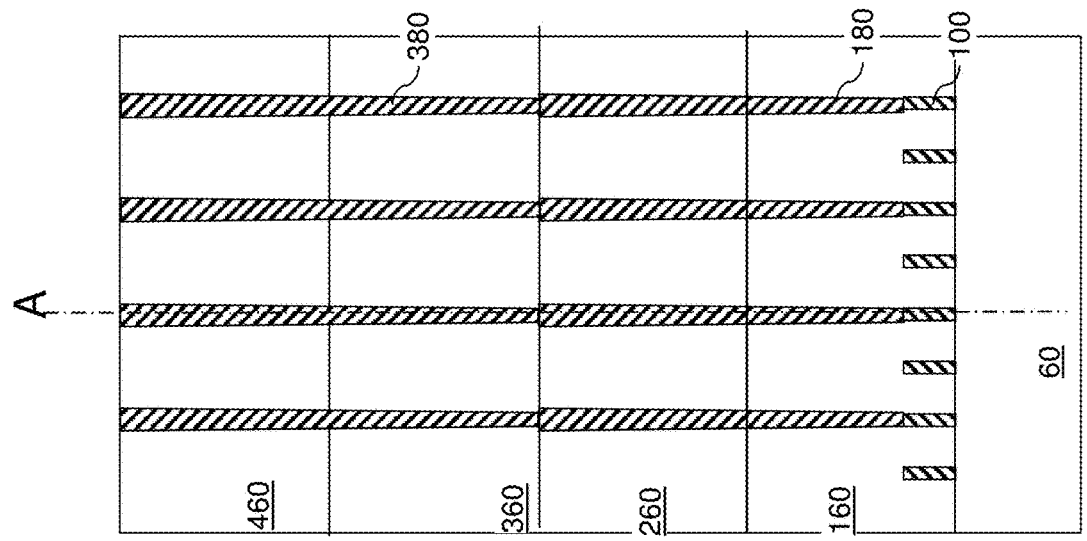
FIG. 10C is a vertical cross-sectional view of the first exemplary structure along the vertical plane C-C' of FIG. 10A.
Figure 10B:
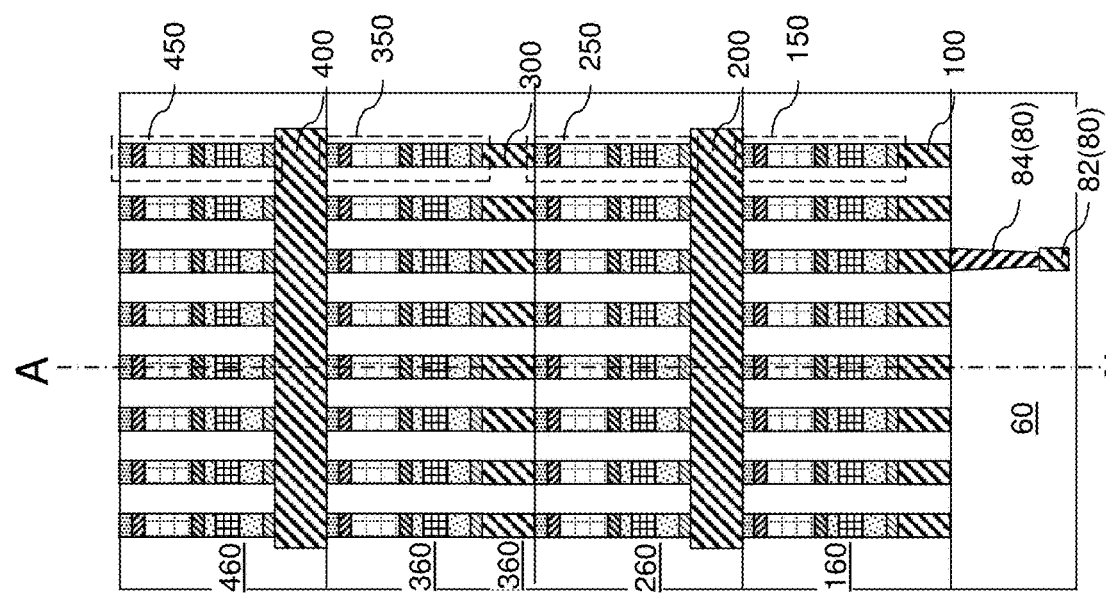
FIG. 10B is a vertical cross-sectional view of the first exemplary structure along the vertical plane B-B' of FIG. 10A.
Figure 10D:
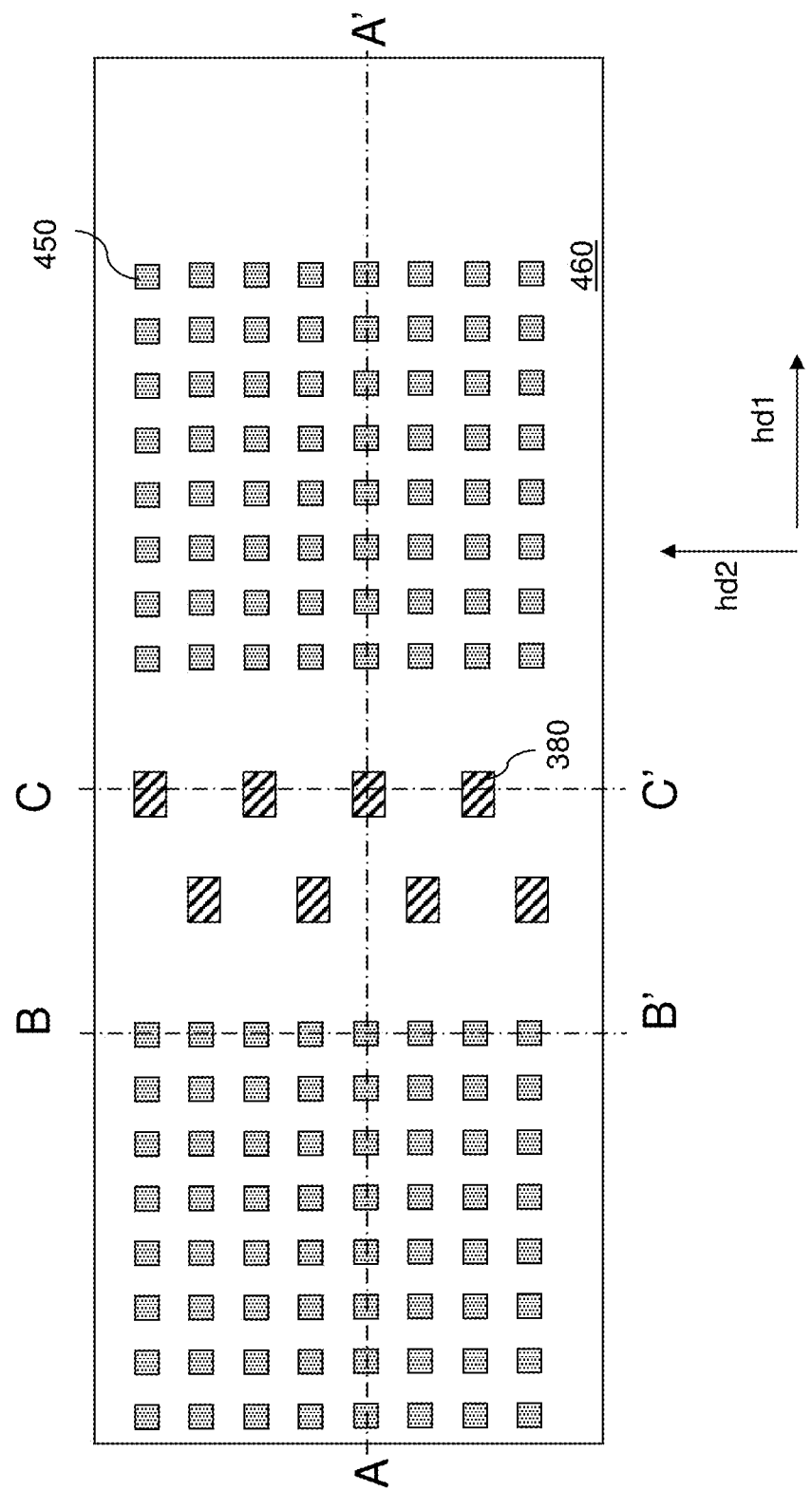
FIG. 10D is a top-down view of the first exemplary structure of FIGS. 10A-10C. The vertical plane A-A' is the plane of the vertical cross-sectional view of FIGS. 10A-10C. The vertical plane B-B' is the plane of the vertical cross-sectional view of FIGS. 10A-10C. The vertical plane C-C' is the plane of the vertical cross-sectional view of FIGS. 10A-10C.
Figure 11A:
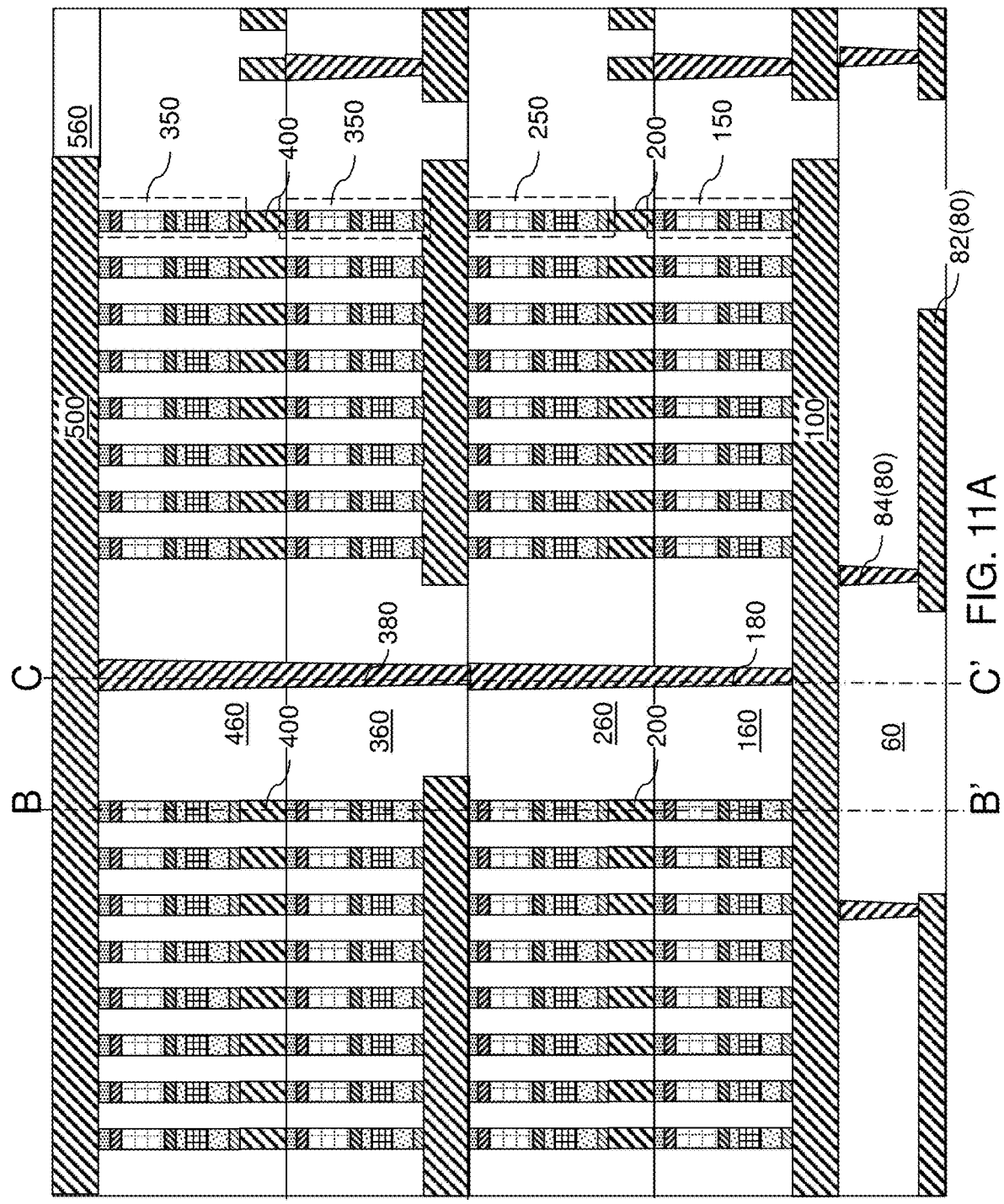
FIG. 11A is a vertical cross-sectional view of the first exemplary structure after formation of fifth electrically conductive lines according to the first embodiment of the present disclosure.
Figure 11C:
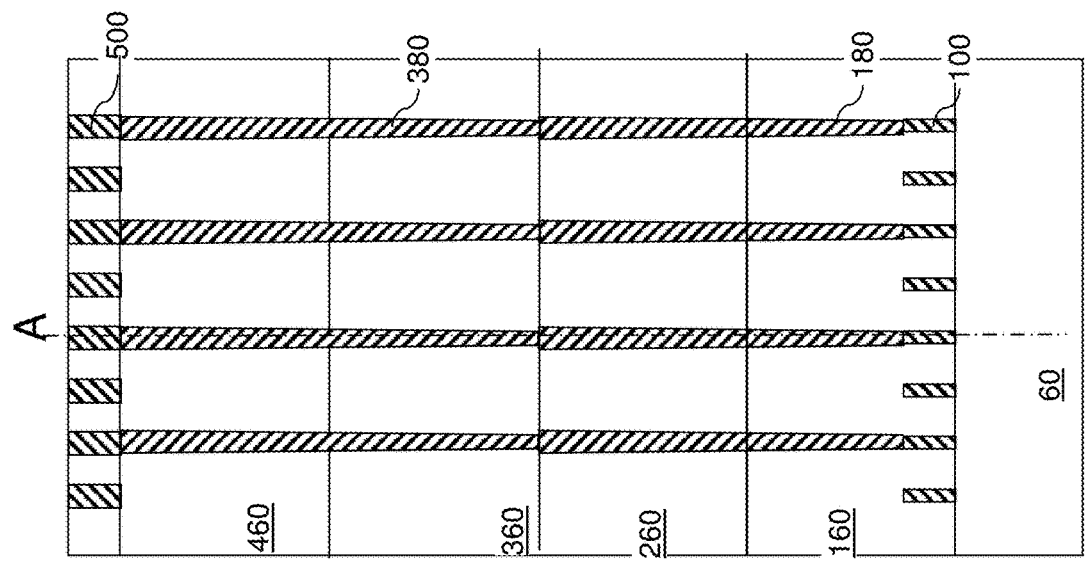
FIG. 11C is a vertical cross-sectional view of the first exemplary structure along the vertical plane C-C' of FIG. 11A.
Figure 11B:
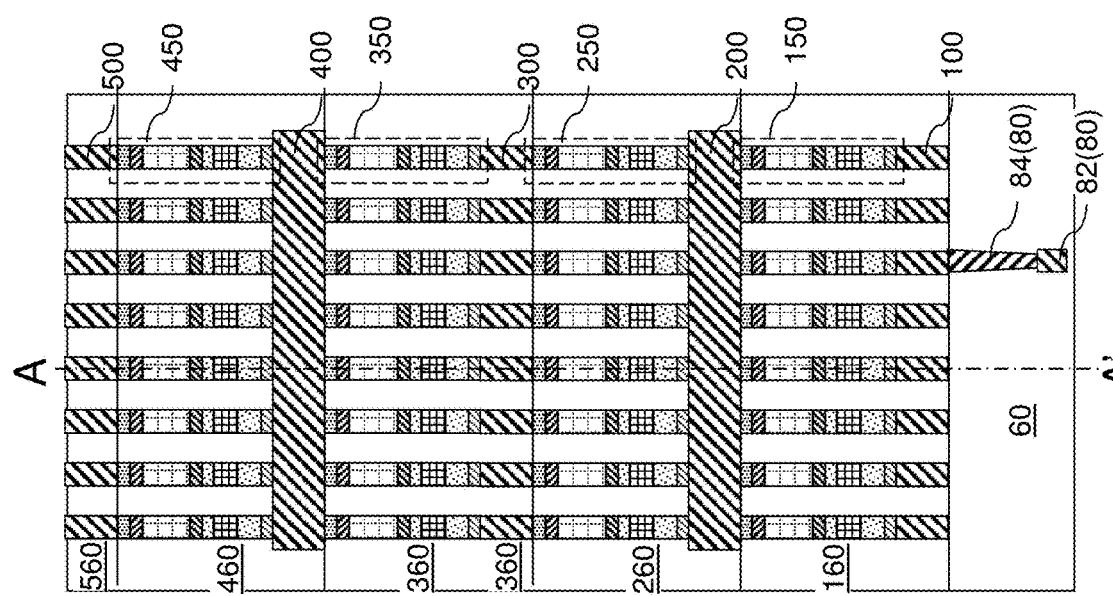
FIG. 11B is a vertical cross-sectional view of the first exemplary structure along the vertical plane B-B' of FIG. 11A.
Figure 11D:
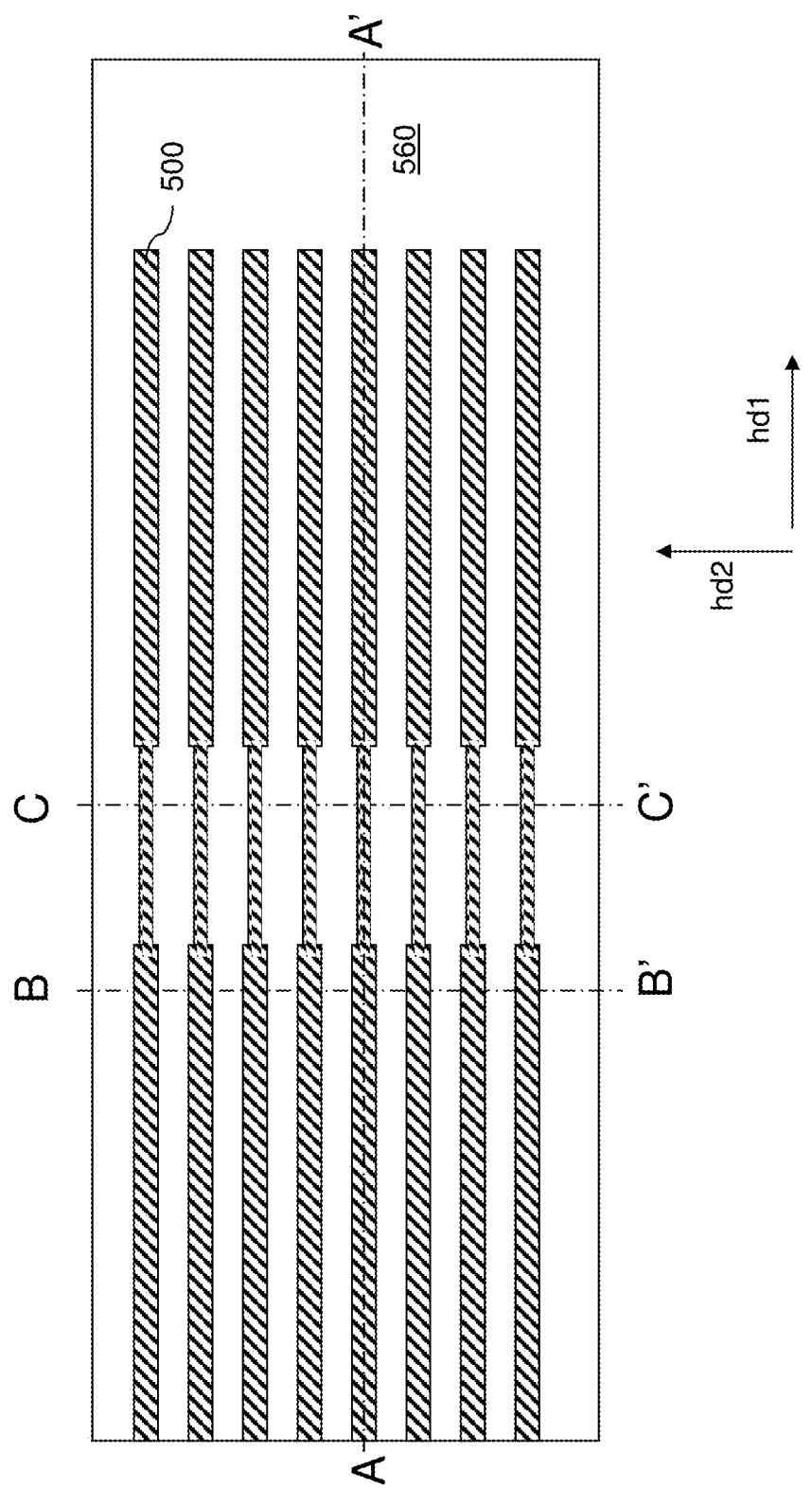
FIG. 11D is a top-down view of the first exemplary structure of FIGS. 11A-11C. The vertical plane A-A' is the plane of the vertical cross-sectional view of FIGS. 11A-11C. The vertical plane B-B' is the plane of the vertical cross-sectional view of FIGS. 11A-11C. The vertical plane C-C' is the plane of the vertical cross-sectional view of FIGS. 11A-11C.
Figure 12C:
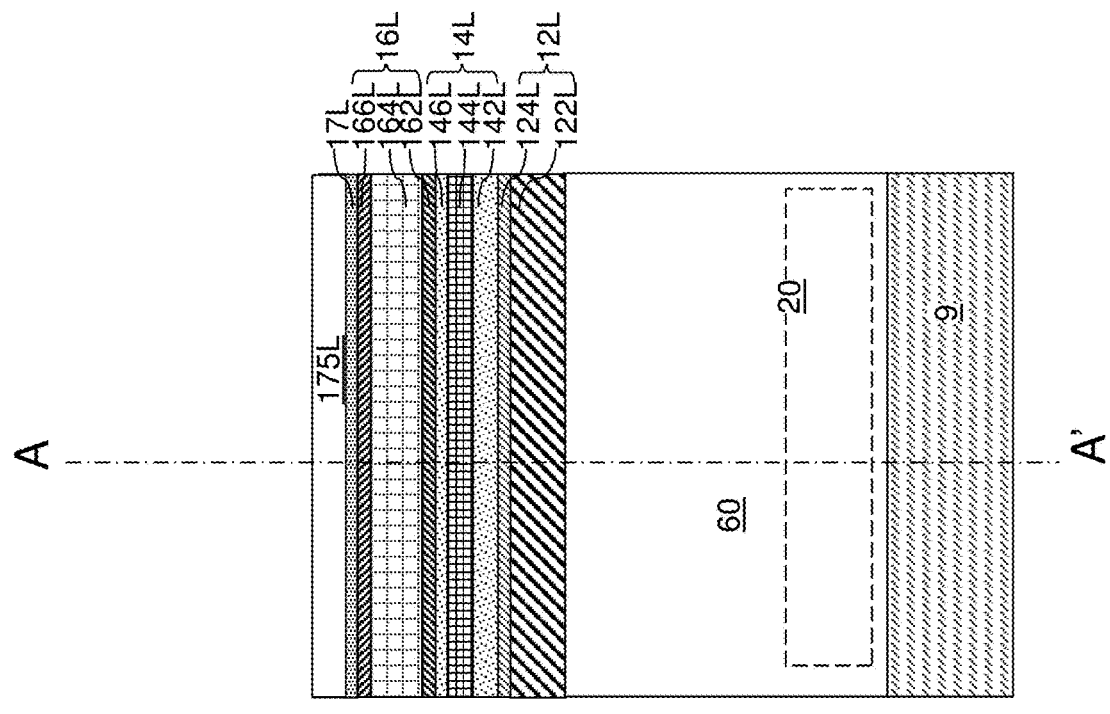
FIG. 12C is a vertical cross-sectional view of the second exemplary structure along the vertical plane C-C' of FIG. 12A.
Figure 12B:
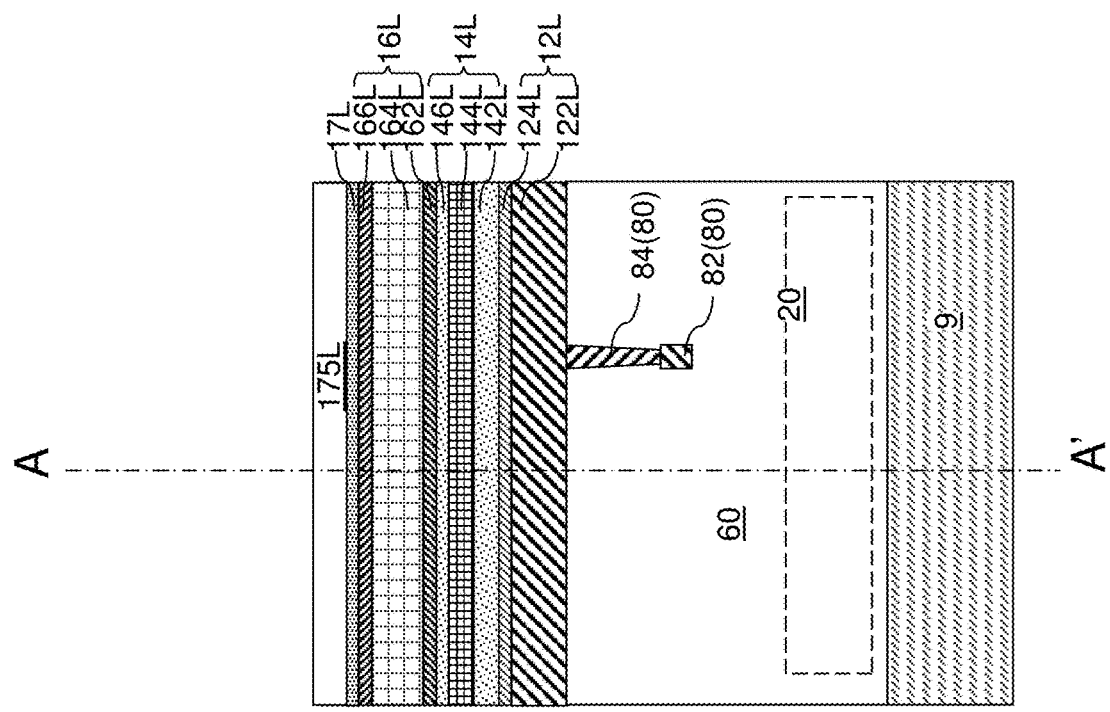
FIG. 12B is a vertical cross-sectional view of the second exemplary structure along the vertical plane B-B' of FIG. 12A.
Figure 12D:
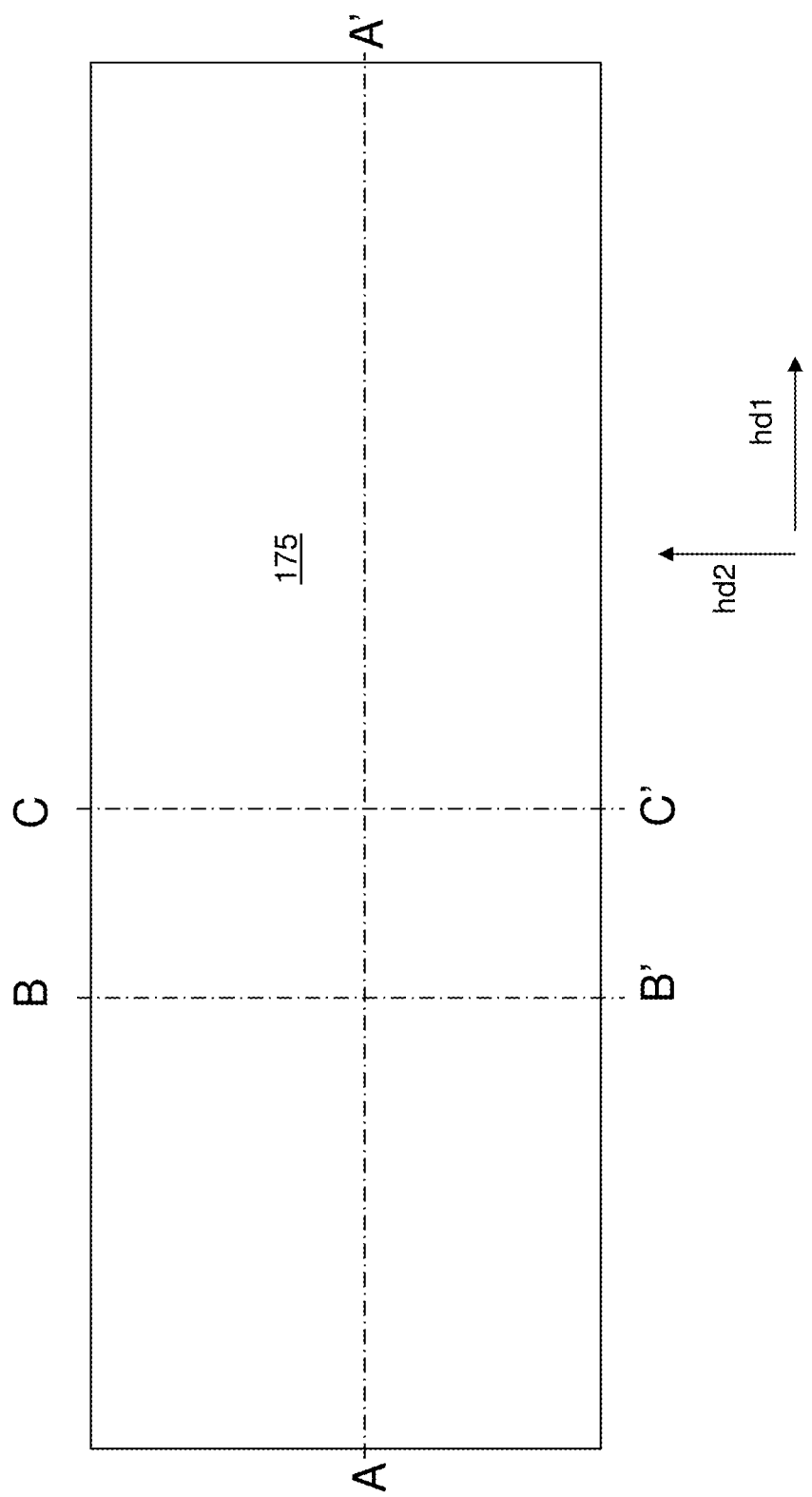
FIG. 12D is a top-down view of the second exemplary structure of FIGS. 12A-12C. The vertical plane A-A' is the plane of the vertical cross-sectional view of FIGS. 12A-12C. The vertical plane B-B' is the plane of the vertical cross-sectional view of FIGS. 12A-12C. The vertical plane C-C' is the plane of the vertical cross-sectional view of FIGS. 12A-12C.
Figure 13D:
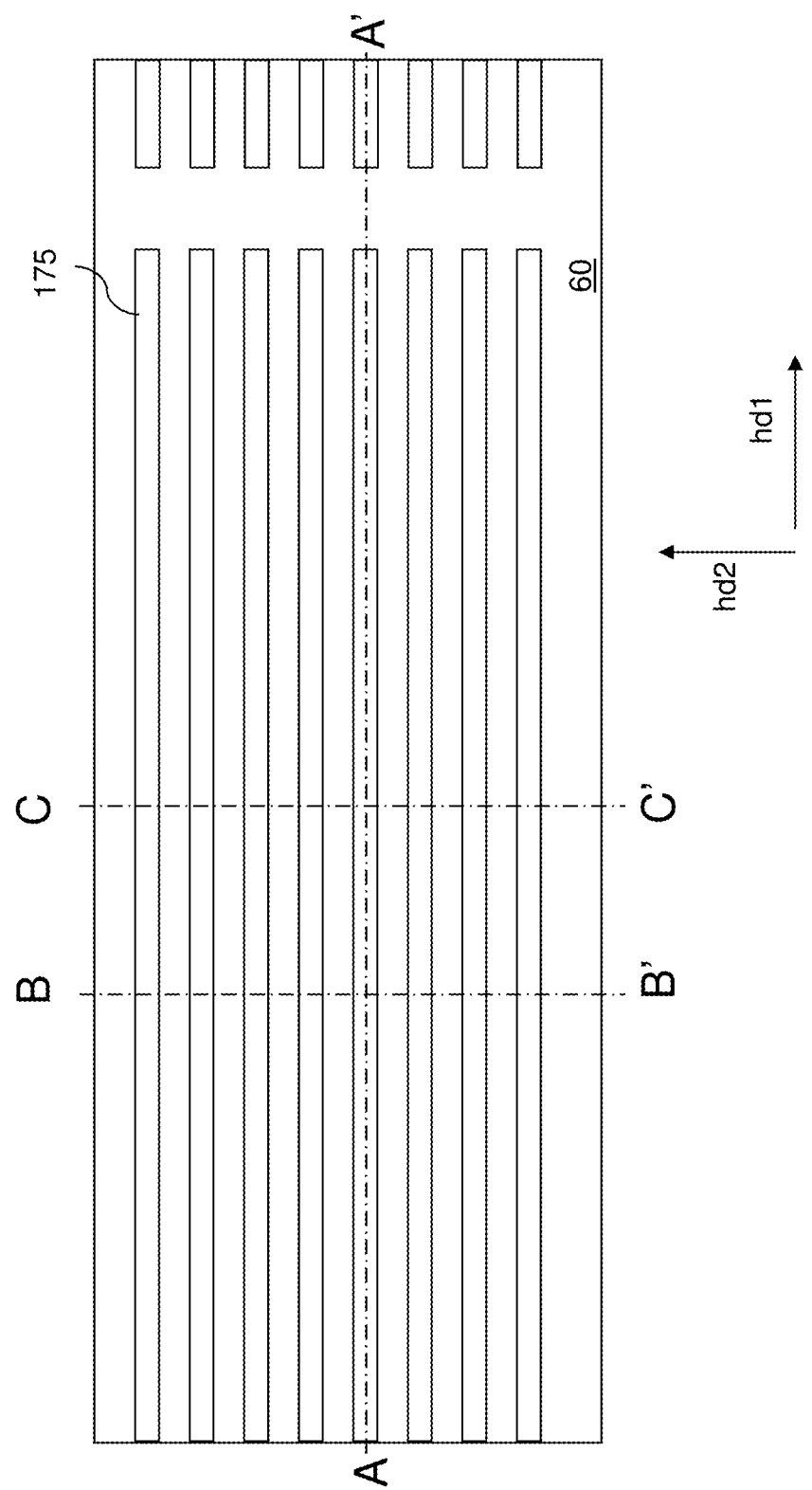
FIG. 13D is a top-down view of the second exemplary structure of FIGS. 13A-13C. The vertical plane A-A' is the plane of the vertical cross-sectional view of FIGS. 13A-13C. The vertical plane B-B' is the plane of the vertical cross-sectional view of FIGS. 13A-13C. The vertical plane C-C' is the plane of the vertical cross-sectional view of FIGS. 13A-13C.
Figure 14A:
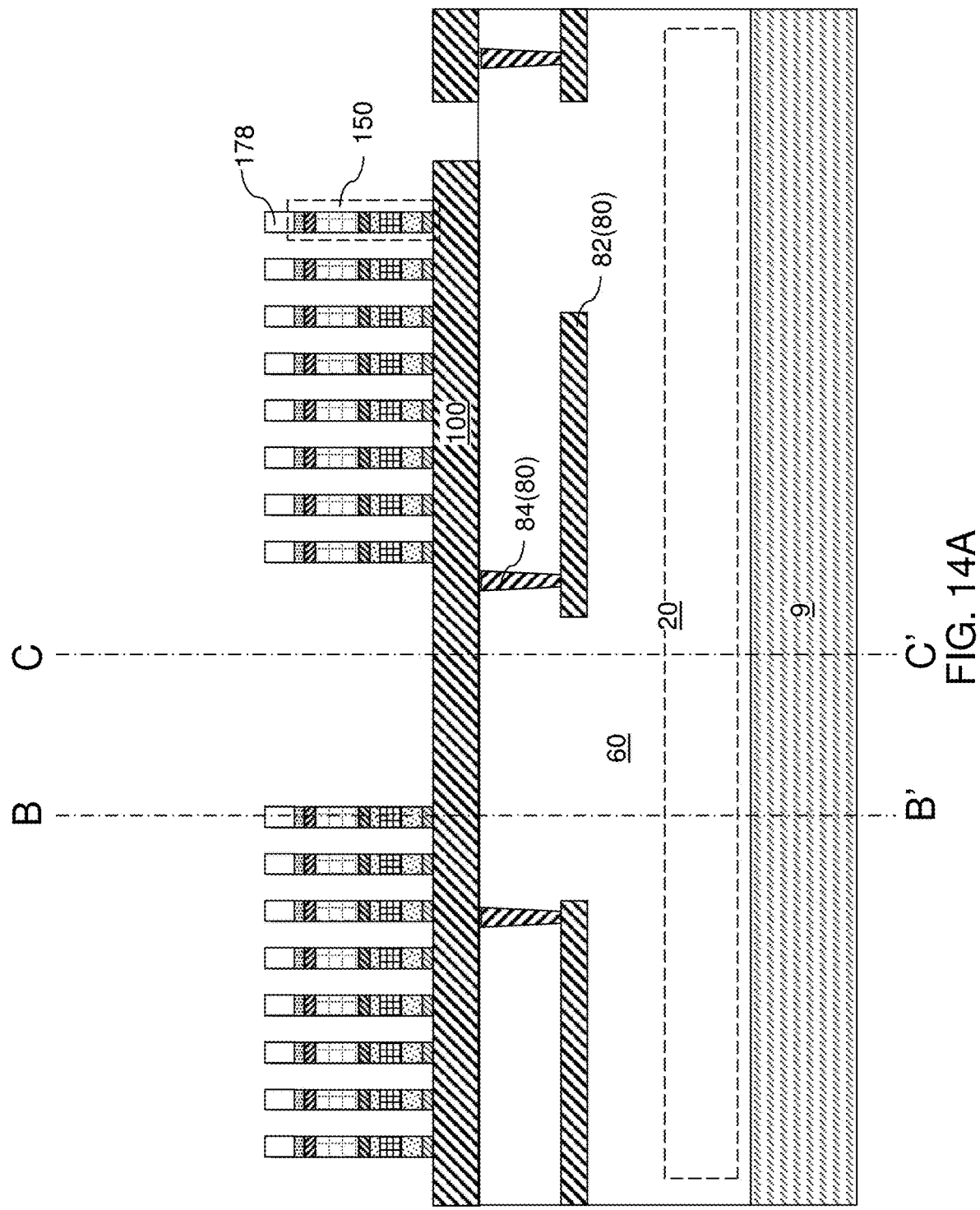
FIG. 14A is a vertical cross-sectional view of the second exemplary structure after formation of a two-dimensional rectangular array of first pillar structures according to the second embodiment of the present disclosure.
Figure 14B:
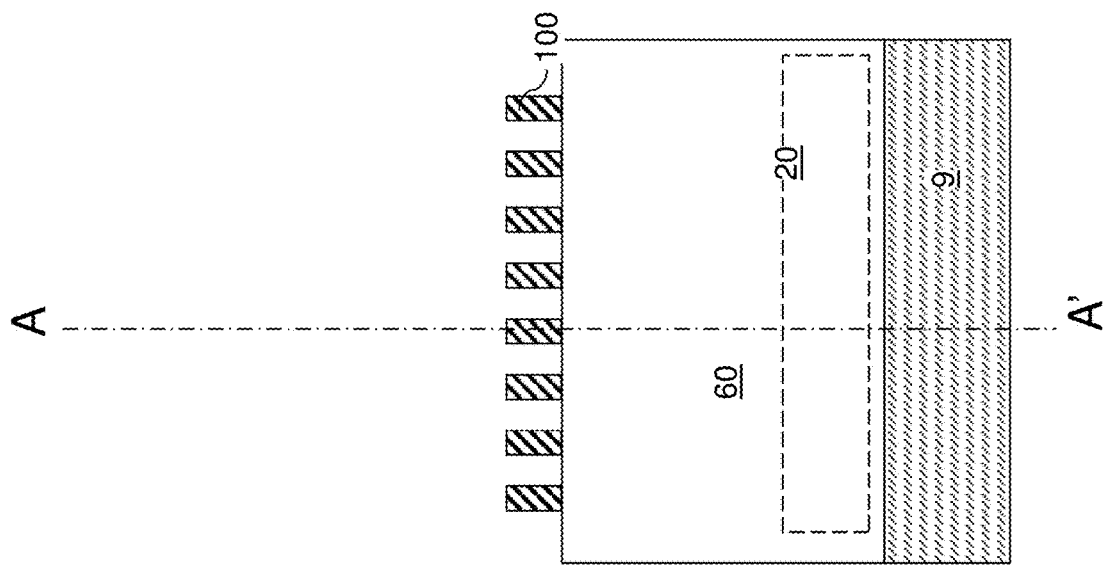
FIG. 14B is a vertical cross-sectional view of the second exemplary structure along the vertical plane B-B' of FIG. 14A.
Figure 14C:
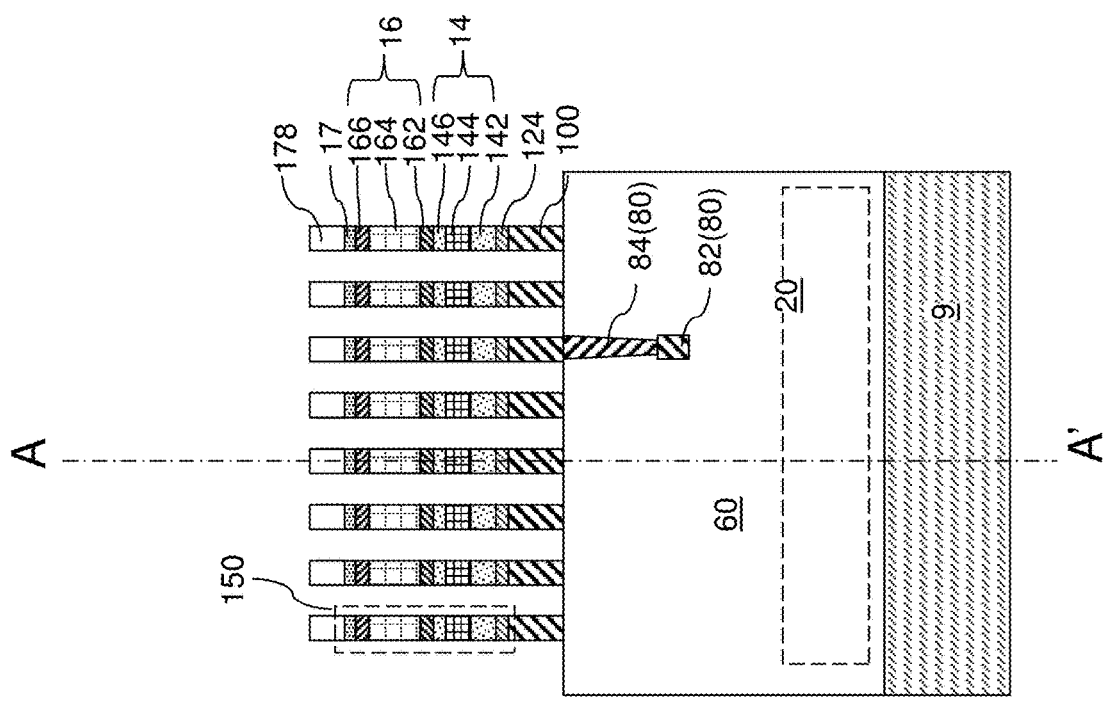
FIG. 14C is a vertical cross-sectional view of the second exemplary structure along the vertical plane C-C' of FIG. 14A.
Figure 14D:
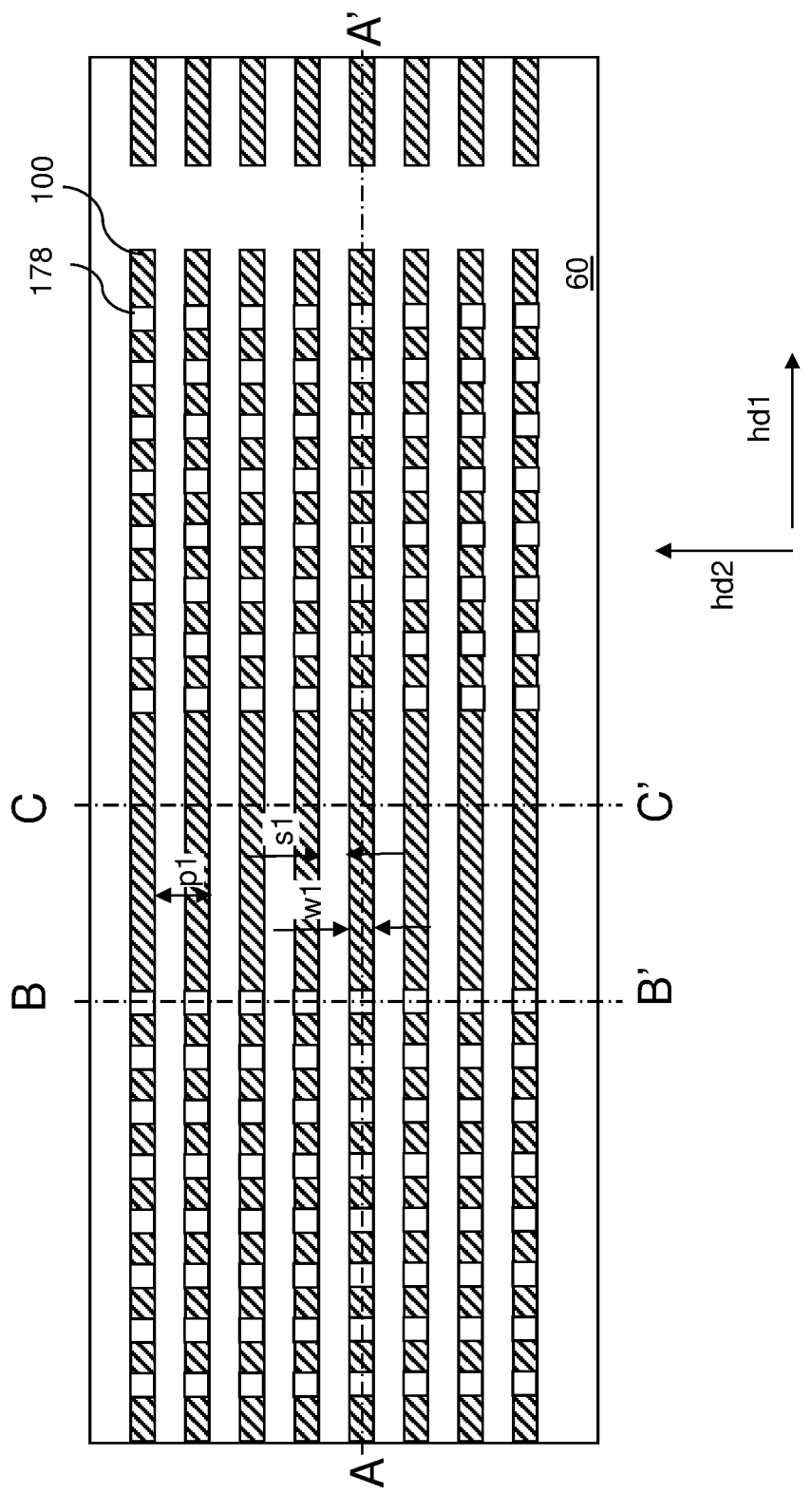
FIG. 14D is a top-down view of the second exemplary structure of FIGS. 14A-14C. The vertical plane A-A' is the plane of the vertical cross-sectional view of FIGS. 14A-14C. The vertical plane B-B' is the plane of the vertical cross-sectional view of FIGS. 14A-14C. The vertical plane C-C' is the plane of the vertical cross-sectional view of FIGS. 14A-14C.
Figure 15C:
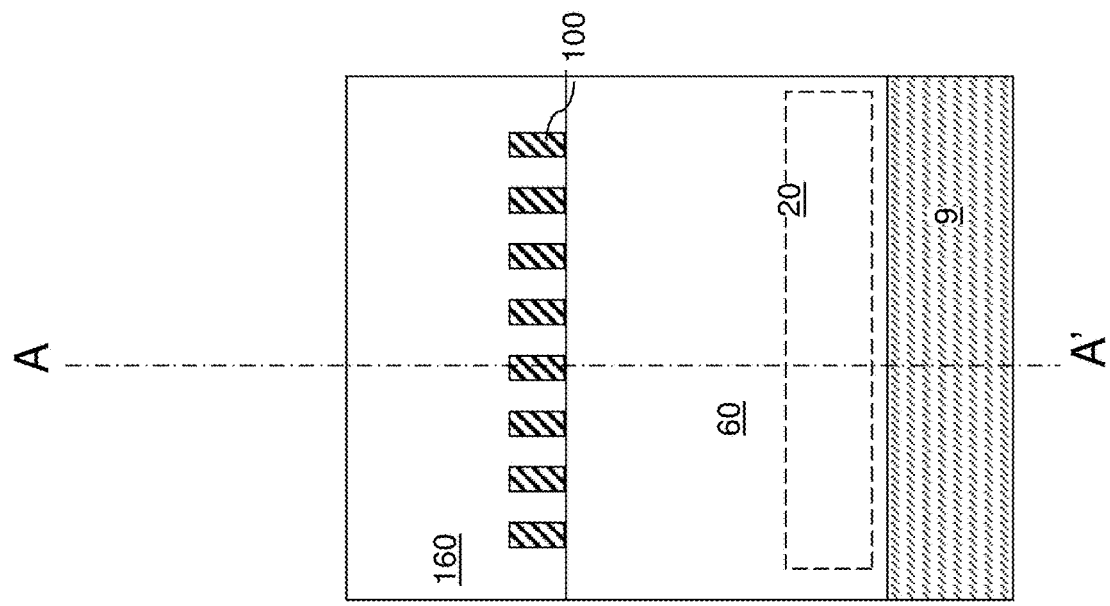
FIG. 15C is a vertical cross-sectional view of the second exemplary structure along the vertical plane C-C' of FIG. 15A.
Figure 15B:
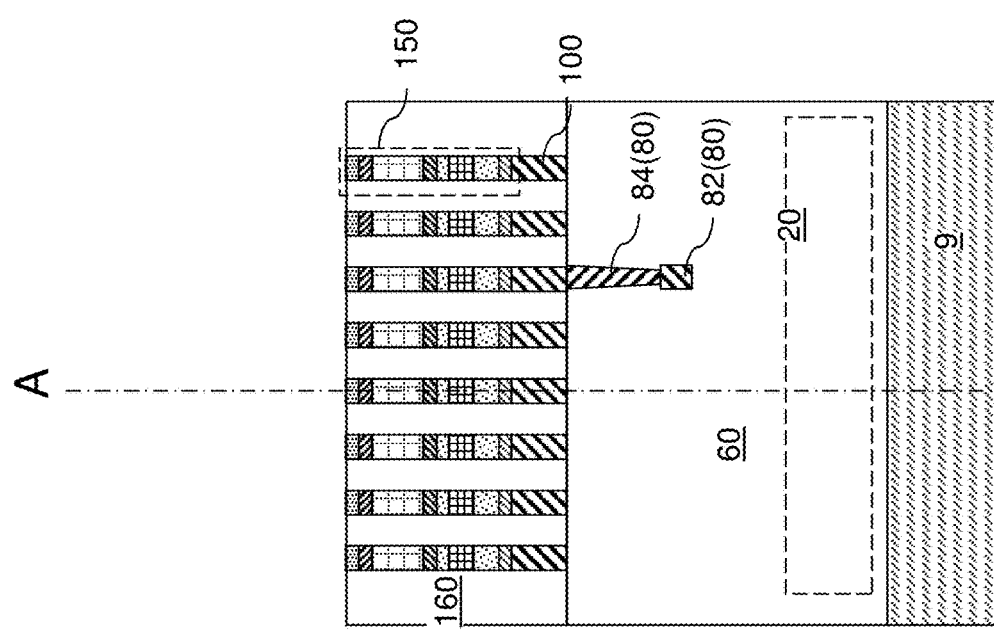
FIG. 15B is a vertical cross-sectional view of the second exemplary structure along the vertical plane B-B' of FIG. 15A.
Figure 15D:
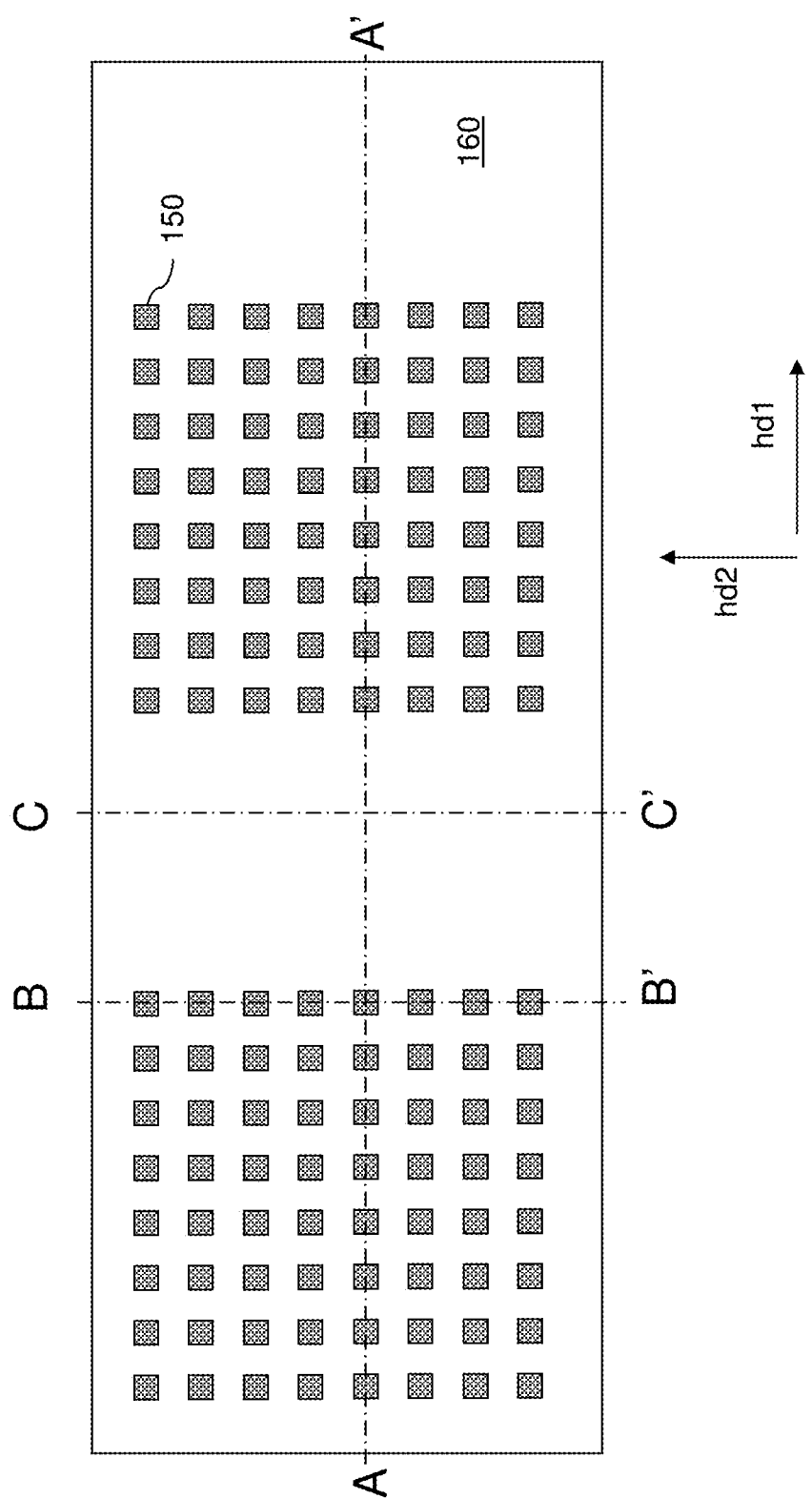
FIG. 15D is a top-down view of the second exemplary structure of FIGS. 15A-15C. The vertical plane A-A' is the plane of the vertical cross-sectional view of FIGS. 15A-15C. The vertical plane B-B' is the plane of the vertical cross-sectional view of FIGS. 15A-15C. The vertical plane C-C' is the plane of the vertical cross-sectional view of FIGS. 15A-15C.
Figure 16C:
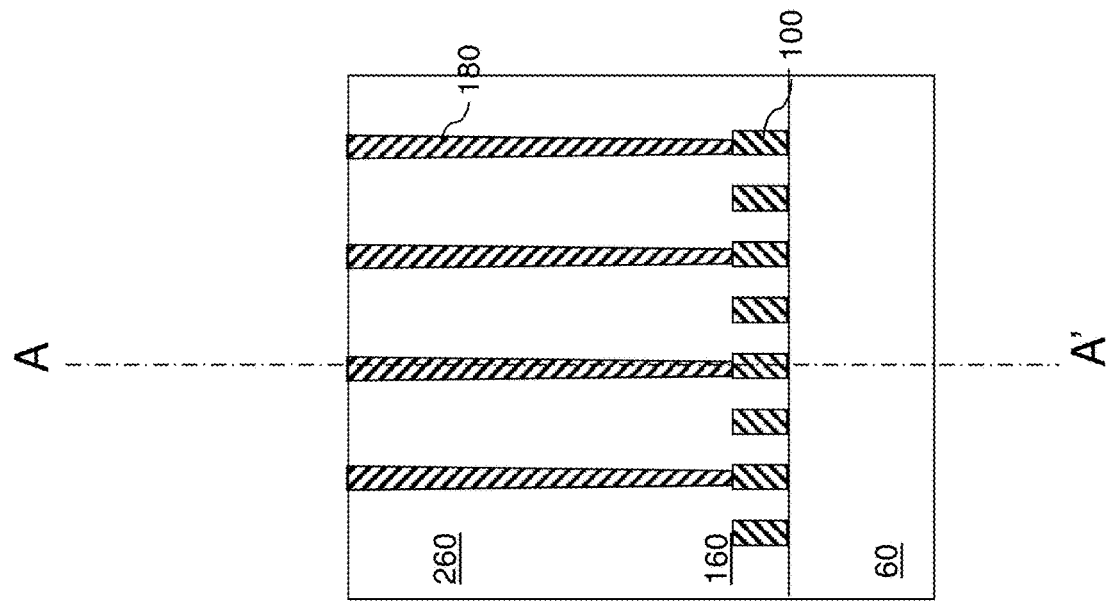
FIG. 16C is a vertical cross-sectional view of the second exemplary structure along the vertical plane C-C' of FIG. 16A.
Figure 16B:
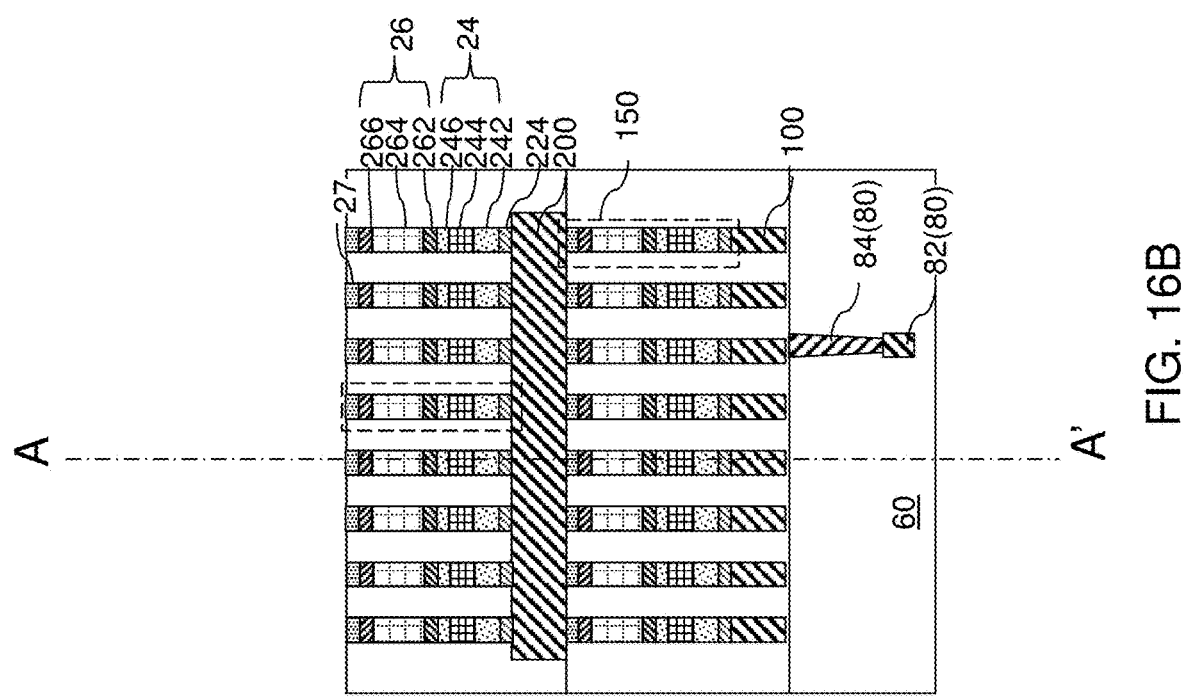
FIG. 16B is a vertical cross-sectional view of the second exemplary structure along the vertical plane B-B' of FIG. 16A.
Figure 16D:
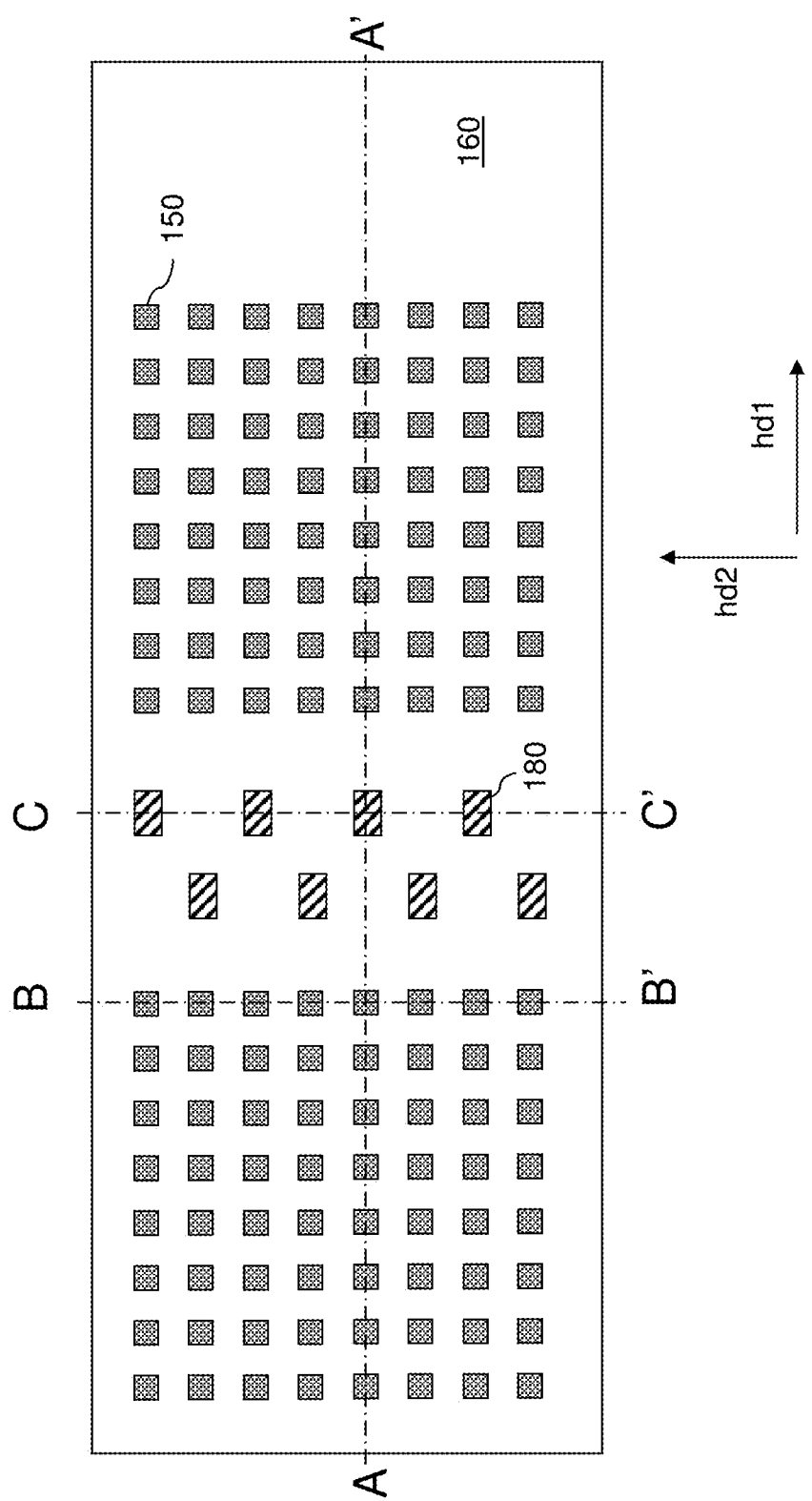
FIG. 16D is a top-down view of the second exemplary structure of FIGS. 16A-16C. The vertical plane A-A' is the plane of the vertical cross-sectional view of FIGS. 16A-16C. The vertical plane B-B' is the plane of the vertical cross-sectional view of FIGS. 16A-16C. The vertical plane C-C' is the plane of the vertical cross-sectional view of FIGS. 16A-16C.
Figure 17A:
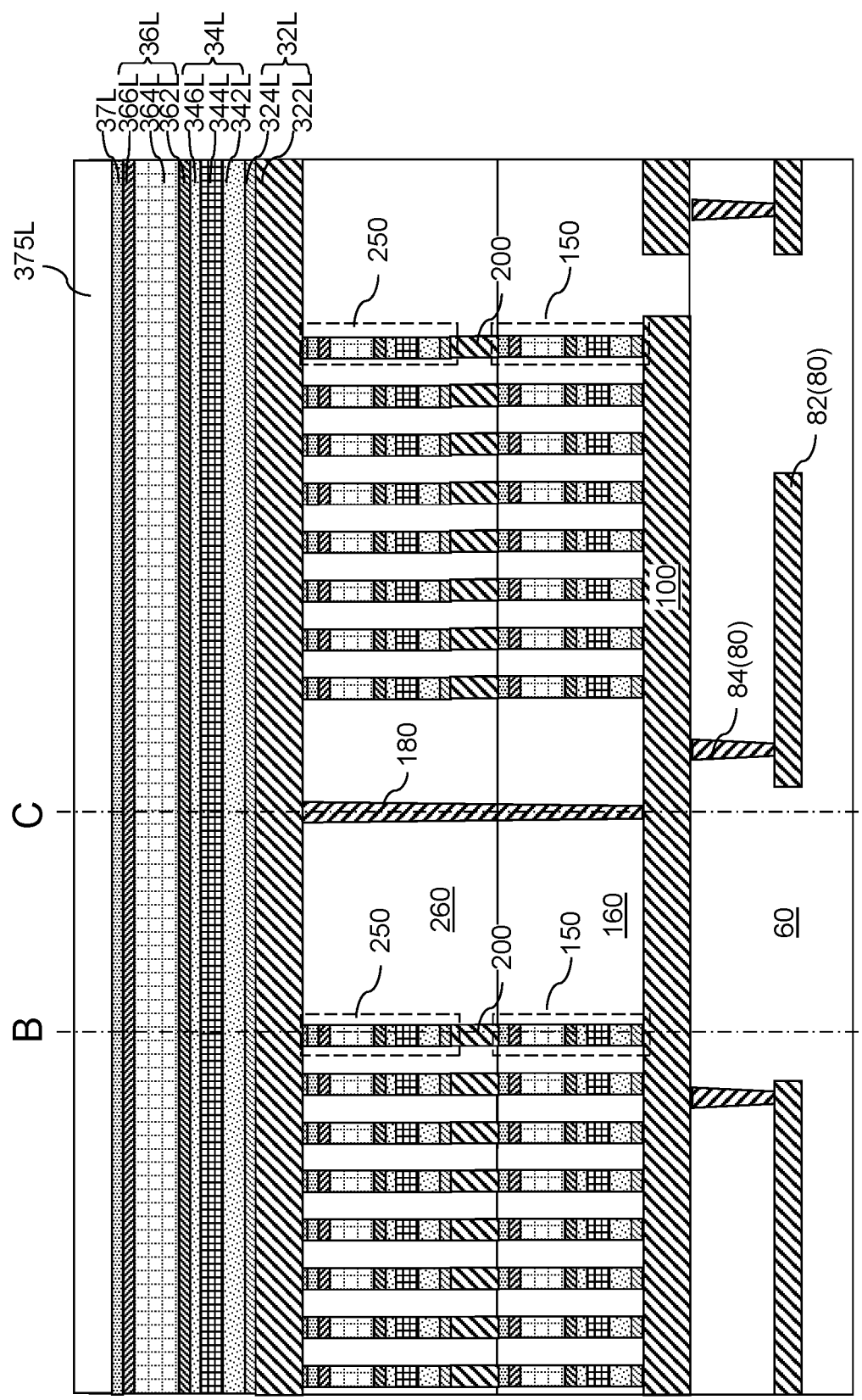
FIG. 17A is a vertical cross-sectional view of the second exemplary structure after formation of a layer stack including a third conductive material layer, a third selector layer, a third phase change memory layer, an optional third barrier layer, and a third hard mask layer according to the second embodiment of the present disclosure.
Figure 17C:
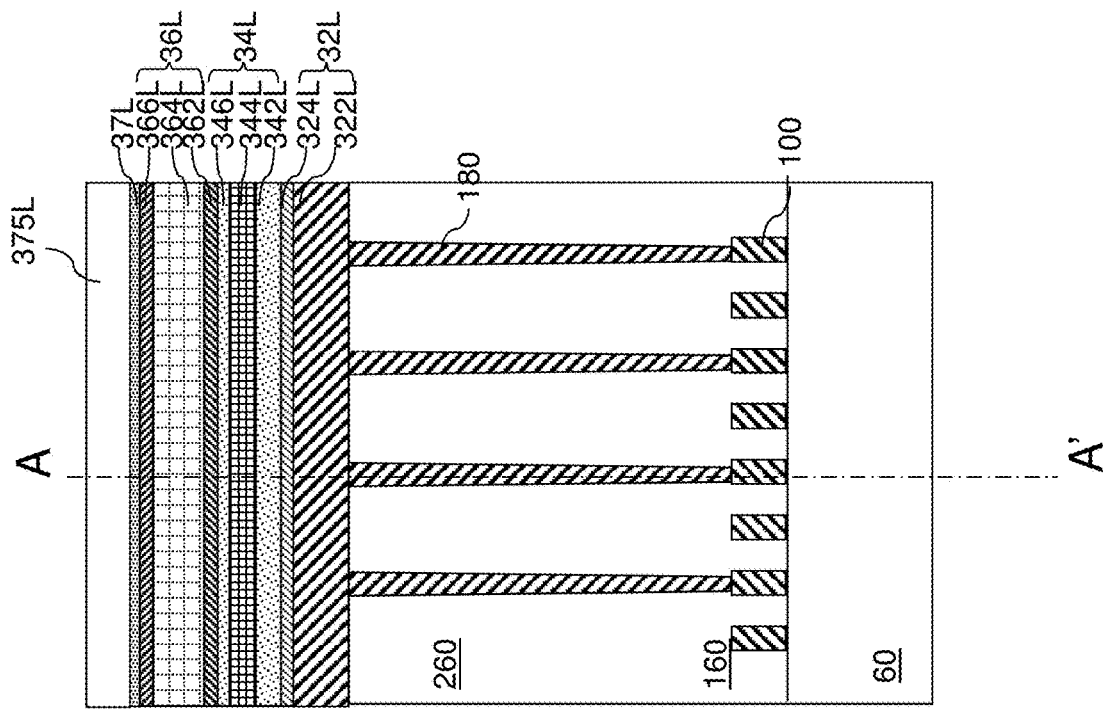
FIG. 17C is a vertical cross-sectional view of the second exemplary structure along the vertical plane C-C' of FIG. 17A.
Figure 17B:
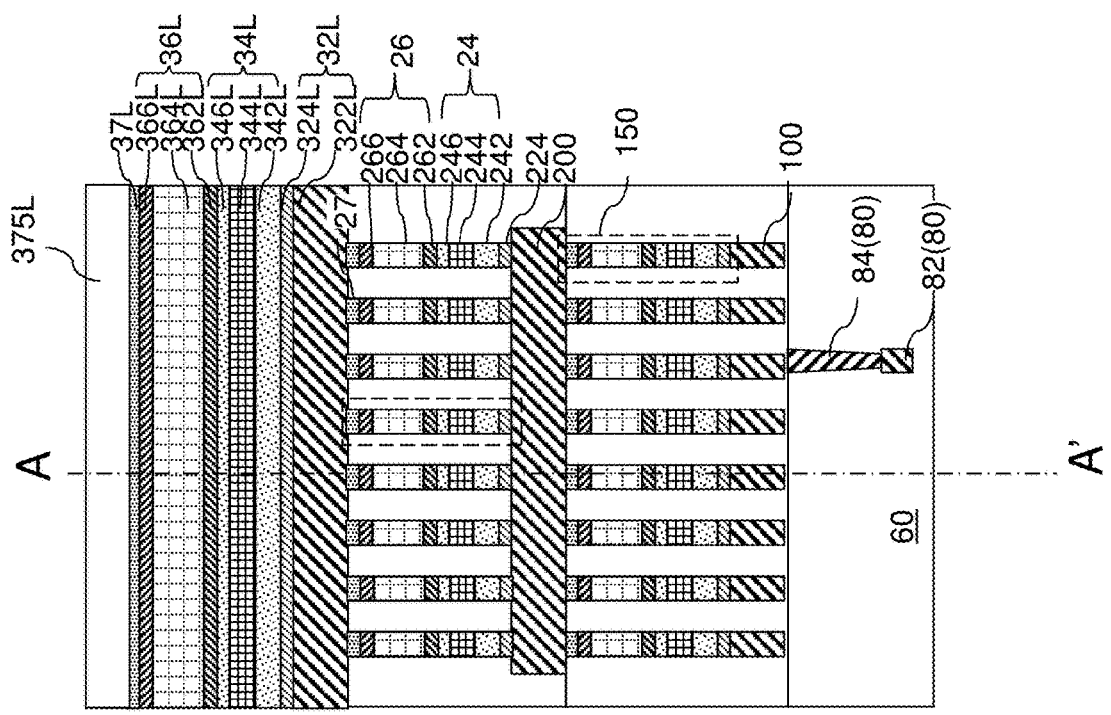
FIG. 17B is a vertical cross-sectional view of the second exemplary structure along the vertical plane B-B' of FIG. 17A.
Figure 17D:
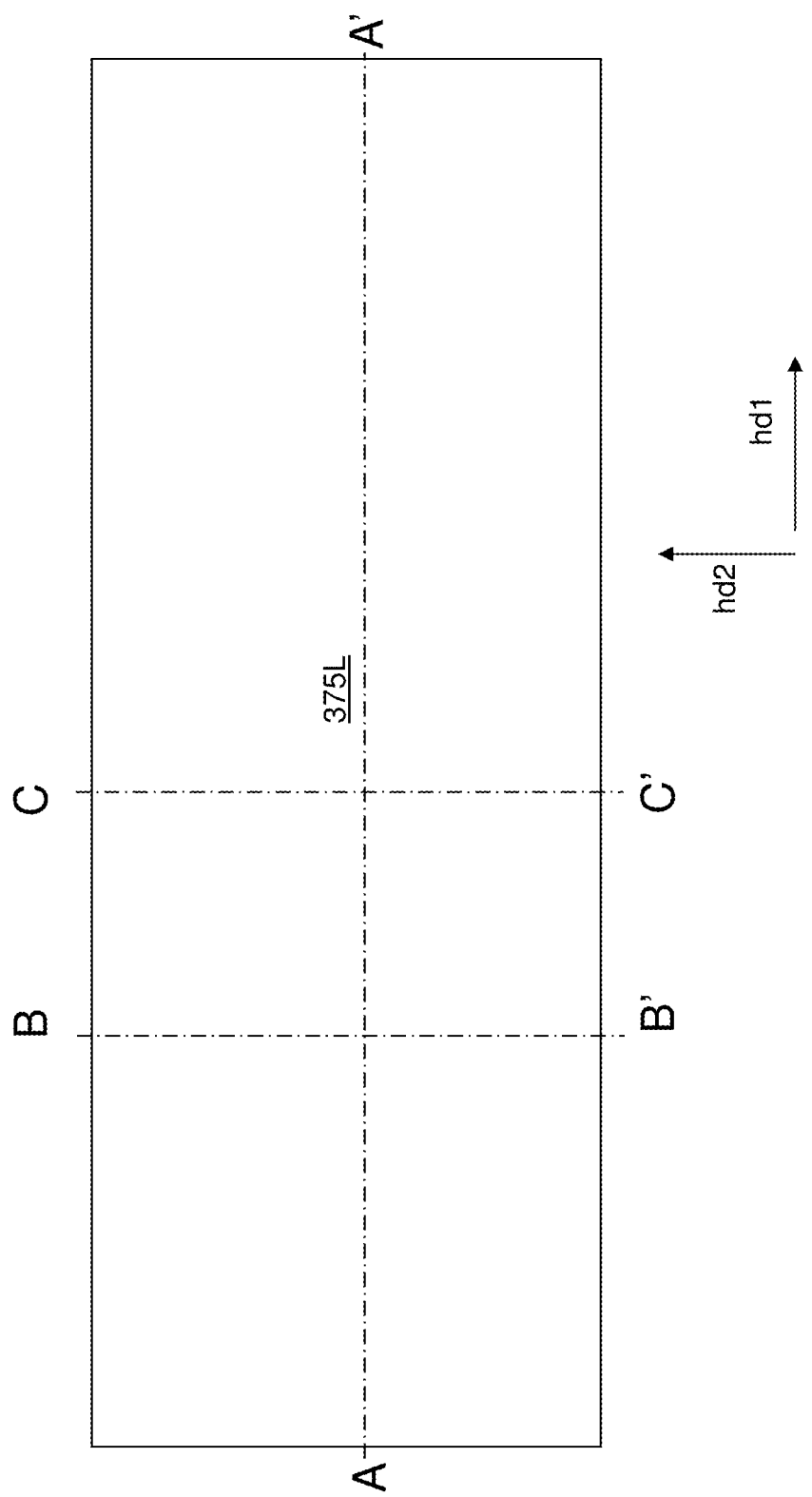
FIG. 17D is a top-down view of the second exemplary structure of FIGS. 17A-17C. The vertical plane A-A' is the plane of the vertical cross-sectional view of FIGS. 17A-17C. The vertical plane B-B' is the plane of the vertical cross-sectional view of FIGS. 17A-17C. The vertical plane C-C' is the plane of the vertical cross-sectional view of FIGS. 17A-17C.

Referring to FIGS. 3A-3C, a masking material layer 179 may be applied over the first exemplary structure, and may be patterned to form end regions of a plurality of first hard mask strips 175 that are parallel to one another. The masking material layer 179 may be, for example, a lithographically patterned photoresist layer. For example, first portions 1751 and third portions 1753 of each first hard mask strip 175 may be masked with the masking material layer 179, while second portions 1752 of each first hard mask strip 175 located between a respective pair of a first portion 1751 and third portions 1753 are not masked by the masking material layer 179.

An isotropic slimming process may be performed to etch back physically exposed surface regions of the first hard mask strips 175. For example, if the first hard mask strips 175 include silicon nitride or silicon oxide, a wet etch process using a mixture of hydrofluoric acid and glycerin or dilute hydrofluoric acid may be used to isotropically trim the second portions 1752 of the first hard mask strips 175. The recess distance may be in a range from 2 nm to 150 nm. The second portions 1752 of the first hard mask strips 175 may have a second width w2 after the isotropic slimming process. The second width w2 may be in a range from 10 nm to 250 nm, such as from 20 nm to 150 nm, although lesser and greater dimensions may also be used. The first hard mask strips 175 are patterned to include a neck region, which is the region of a second portion 1752 having the second width w2 that is less than the first width w1. The masking material layer 179 may be removed, for example, by ashing.

Referring to FIGS. 4A-4D, an anisotropic etch process may be performed using the first hard mask strips 175 as an etch mask. The anisotropic etch process may etch through portions of the optional first barrier layer 17L, the first phase change memory layer 16L, the first selector layer 14L, and the first conductive material layer 12L that are not masked by the first hard mask strips 175. The chemistry of the anisotropic etch process may be sequentially modified to sequentially etch through portions of the optional first barrier layer 17L, the first phase change memory layer 16L, the first selector layer 14L, and the first conductive material layer 12L. The anisotropic etch process may stop at, or below, the topmost surface of the base dielectric material layers 60. The patterns of the hard mask strips 175 are transferred through portions of the optional first barrier layer 17L, the first phase change memory layer 16L, the first selector layer 14L, and the first conductive material layer 12L by the anisotropic etch process. First trenches 11 laterally extending along the first horizontal direction hd1 are formed by the anisotropic etch. The first trenches 11 may be line trenches that laterally extend along the first horizontal direction.

Remaining portions of the first material layer stack (12L, 14L, 16L, 17L, 175L) include first stacked rail structures 150L and first electrically conductive lines 100, each of which laterally extends along the first horizontal direction hd1. The first electrically conductive lines 100 include patterned remaining portions of the first metal layer 122L. The first stacked rail structures 150L are laterally spaced apart by the first trenches 11 along the second horizontal direction hd2. As used herein, a "rail" or a "rail structure" refers to a structure that extends predominantly along a lengthwise direction. As used herein, a "stacked rail" or a "stacked rail structure" refers to a stack of at least two rails that laterally extend along a same lengthwise direction.

Each first stacked rail structure 150L may include, from bottom to top, a first selector rail 14' that is a patterned portion of the first selector layer 14L, a first phase change memory rail 16' that is a patterned portion of the first phase change memory layer 16L, and a first barrier rail 17' that is a patterned portion of the first barrier layer 17L. As used herein, a "strip" refers to a rail having a thickness that is less than the width. The first stacked rail structures 150L laterally extend along the first horizontal direction hd1, are laterally spaced from one another by the first trenches 11, and are located over the substrate 9.

In one embodiment, each first stacked rail structure 150L may include a first metal nitride strip 124' that may be a patterned portion of the first metal nitride layer 124L. In one embodiment, each first selector rail 14' may include a vertical stack of a first lower barrier material strip 142', a first ovonic threshold switch material rail 144', and a first upper barrier material strip 146'. The first lower barrier material strip 142' is a patterned portion of an optional first lower barrier material layer 142L. The first ovonic threshold switch material rail 144' is a patterned portion of the first ovonic threshold switch material layer 144L. The first upper barrier material strip 146' is a patterned portion of the optional first upper barrier material layer 146L. In one embodiment, each first phase change memory rail 16' may include, from bottom to top, a first optional lower conductive liner strip 162', a first phase change memory material rail 164', and a first optional upper conductive liner strip 166'. Each first lower conductive liner strip 162' is a patterned portion of the first lower conductive liner layer 162L, each first phase change memory material rail 164' is a patterned portion of the first phase change memory material layer 164L, and each first upper conductive liner strip 166' is a patterned portion of the first upper conductive liner layer 166L. The first stacked rail structures 150L laterally extend along the first horizontal direction hd1, and are laterally spaced from one another by the first trenches 11 over the base dielectric material layers 60.

Referring to FIGS. 5A-5D, another photoresist layer (not shown) may be applied over the first exemplary structure, and may be lithographically patterned in a line and space pattern within areas that includes portions of the first stacked rail structures 150L having the first width. Each line and space pattern may laterally extend along the second horizontal direction hd2, and may be laterally spaced apart along the first horizontal direction hd1. The pitch of each line and space pattern may be in a range from 30 nm to 600 nm, although lesser and greater distances may also be used. The width of each line within the line and space pattern may be about one half of the pitch of the line and space pattern.

An anisotropic etch process may be performed to transfer the pattern of the photoresist layer through the hard mask strips 175 and the first stacked rail structures 150L. Each hard mask strips 175 may be patterned into hard mask segments 178 having a rectangular horizontal cross-sectional shape. The first stacked rail structures 150L are patterned into a two-dimensional rectangular array of first pillar structures 150. Each first pillar structure 150 may have a rectangular horizontal cross-sectional shape. The first metal nitride strips 124' may be patterned into first metal nitride segments, or may function as an etch stop structure and remain as first metal nitride strips 124'.

The chemistry of the anisotropic etch process may be sequentially modified to etch through the various materials of the hard mask strips 175, the first barrier rails 17', the first phase change memory rails 16', the first selector rails 14', and optionally through the first metal nitride strips 124'. The anisotropic etch process may stop at the top surface of, or within, the first electrically conductive lines 100 or within the first metal nitride strips 124'.

As used herein, a "pillar" or a "pillar structure" refers to a structure that extends along a vertical direction such that each sidewall of the structure is vertical or is substantially vertical. As used herein, a sidewall is "substantially vertical" if the sidewall is tapered, i.e., tilted, with respect to a vertical direction by a tilt angle that is less than 10 degrees. In an illustrative example, each first pillar structure 150 may include, from bottom to top, a first selector pillar 14 that is a patterned portion of a first selector rail 14', a first phase change pillar 16 that is a patterned portion of a phase change memory rail 16', and an optional first barrier segment 17 that is a patterned portion of a first barrier strip 17'.

Each first selector pillar is a selector element, i.e., an element that provides non-linear voltage-current characteristics such that the element functions as a conductor under first voltage bias conditions and as an insulator under second voltage bias conditions. In one embodiment, each first selector pillar 14 may include a vertical stack of a first lower barrier material portion 142 that is a patterned portion of a first lower barrier material strip 142', a first ovonic threshold switch material portion 144 that is a patterned portion of a first ovonic threshold switch material rail 144', and a first upper barrier material portion 146 that is a patterned portion of a first upper barrier material strip 146'.

In one embodiment, each first selector pillar 14 may include a first ovonic threshold switch material portion 144, an upper amorphous carbon portion that contacts a top surface of the first ovonic threshold switch material portion 144 as a first upper barrier material portion 146, and a lower amorphous carbon portion that contacts a bottom surface of the first ovonic threshold switch material portion 144 as a first lower barrier material portion 142.

Each first phase change pillar 16 may be a phase change memory element, i.e., a structure that changes the resistance depending on the phase of a material therein. In one embodiment, each first phase change pillar 16 may include a vertical stack of an optional first lower conductive liner segment 162 that is a patterned portion of a first optional lower conductive liner strip 162', a first phase change memory material pillar 164 that is a patterned portion of a first phase change memory material rail 164', and a first optional upper conductive liner segment 166 that is a patterned portion of a first upper conductive liner strip 166'. The photoresist layer may be removed, for example, by ashing.

Generally, the two-dimensional array of first pillar structures 150 may comprise a first two-dimensional array of memory elements. The first two-dimensional array of memory elements may be formed on top surfaces of first portions and third portions of the first electrically conductive lines 100 having the first width w1. Top surfaces of the second portions of the first electrically conductive lines 100 may be physically exposed.

Referring to FIGS. 6A-6D, a first dielectric material may be deposited over the exemplary structure and may be planarized using top surfaces of the first pillar structures 150 as stopping surfaces. For example, excess portions of the first dielectric material layer overlying a horizontal plane including top surfaces of the optional first barrier segments 17 or first phase change pillars 16 (in case the first barrier segments 17 are not used) may be removed by a planarization process, which may use a recess etch process and/or a chemical mechanical planarization process. The hard mask segments 178 may be collaterally removed during the planarization process. A remaining continuous portion of the first dielectric material constitutes a first dielectric material layer 160. The first dielectric material layer 160 may include undoped silicate glass, a doped silicate glass, or spin-on glass. A dielectric liner (not shown) may be optionally deposited prior to deposition of the first dielectric material. The first dielectric material layer 160 may be formed around the first two-dimensional array of memory elements, and may fill the gaps between memory elements of the first two-dimensional array. Peripheral contact via structures 182 may be optionally formed through the first dielectric material layer 160.

Referring to FIGS. 7A-7D, a second material layer stack (22L, 24L, 26L, 27L, 275L), which is also referred to as a second layer stack or a second vertical stack, may be formed over the first dielectric material layer 160 and the two-dimensional array of first pillar structures 150. For example, the second material layer stack (22L, 24L, 26L, 27L, 275L) may include a second conductive material layer 22L, a second selector layer 24L, a second phase change memory layer 26L, an optional second barrier layer 27L, and a second hard mask layer 275L. Each layer in the second material layer stack (22L, 24L, 26L, 27L, 275L) may be formed as a blanket material layer, i.e., an unpatterned material layer that laterally extend along a second horizontal direction hd1 and a second horizontal direction hd2 that is perpendicular to the second horizontal direction hd1.

The second conductive material layer 22L may include at least one conductive material layer, which may be at least one metallic material layer. For example, the second conductive material layer 22L may include a layer stack, from bottom to top, of a second metal layer 222L (such as a tungsten layer) and a second metal nitride layer 224L (such as a tungsten nitride layer or a titanium nitride layer). The thickness of the second metal layer 222L may be in a range from 21 nm to 100 nm, such as from 30 nm to 70 nm, although lesser and greater thicknesses may also be used. The thickness of the second metal nitride layer 224L may be in a range from 1 nm to 10 nm, such as from 1.5 nm to 5 nm, although lesser and greater thicknesses may also be used. In another embodiment, the second conductive material layer 22L may include two separate metallic material layers formed during separate deposition and patterning steps, such as a first tungsten layer that is patterned with the layers of the underlying first pillar structures 150 and a second tungsten layer that is deposited on the first tungsten layer after patterning the first tungsten layer and the first pillar structures for process feasibility and/or smaller variation of contact between parts of the second conductive material layer 22L and the underlying and overlying memory material layers.

The second selector layer 24L includes a non-Ohmic material that provides electrical connection of electrical isolation depending on the magnitude and/or the polarity of an externally applied voltage bias thereacross. In one embodiment, the second selector layer 24L includes at least one threshold switch material layer such as an ovonic threshold switch material layer. The ovonic threshold switch material layer may include a second ovonic threshold switch material layer 244L which contains any ovonic threshold switch material. In one embodiment, the second ovonic threshold switch material layer 244L may include, and/or may consist essentially of, a GeSeAs compound, a GeSe compound, a SeAs compound, a GeTe compound, or a SiTe compound.

In one embodiment, the material of the second ovonic threshold switch material layer 244L may be selected such that the resistivity of the second ovonic threshold switch material layer 244L decreases at least by two orders of magnitude (i.e., by more than a factor of 100) upon application of an external bias voltage that exceeds a critical bias voltage magnitude (also referred to as threshold voltage). In one embodiment, the composition and the thickness of the second ovonic threshold switch material layer 244L may be selected such that the critical bias voltage magnitude may be in a range from 1 V to 4 V, although lesser and greater voltages may also be used for the critical bias voltage magnitude. The thickness of the second ovonic threshold switch material layer 244L may be, for example, in a range from 5 nm to 50 nm, such as from 10 nm to 30 nm, although lesser and greater thicknesses may also be used.

The second selector layer 24L may include an optional second upper barrier material layer 246L overlying the second ovonic threshold switch material layer 244L and an optional second lower barrier material layer 242L underlying the second ovonic threshold switch material layer 244L. The optional second upper and/or lower barrier material layers (246L, 242L) include a material that suppresses diffusion of the material of the second ovonic threshold switch material layer 244L. For example, the second upper and/or lower barrier material layers (246L, 242L) may include amorphous carbon or diamond-like carbon (DLC). The thickness of the second upper barrier material layers 246L may be in a range from 4 nm to 40 nm, such as from 8 nm to 21 nm, although lesser and greater thicknesses may also be used. The thickness of the second lower barrier material layer 242L may be in a range from 4 nm to 40 nm, such as from 8 nm to 21 nm, although lesser and greater thicknesses may also be used.

The second phase change memory layer 26L includes a second phase change memory material layer 264L. The second phase change memory material layer 264L include a phase change memory material. The thickness of the second phase change memory material layer 264L may be in a range from 1 nm to 60 nm, such as from 3 nm to 40 nm and/or from 10 nm to 25 nm, although lesser and greater thicknesses may also be used.

The second phase change memory layer 26L may optionally include a second lower conductive liner layer 262L underlying the second phase change memory material layer 264L, and may optionally include a second upper conductive liner layer 266L overlying the second phase change memory material layer 264L. The optional second lower conductive liner layer 262L and/or the optional second upper conductive liner layer 266L, if present, include a conductive metallic material. In one embodiment, the second lower conductive liner layer 262L and/or the second upper conductive liner layer 266L may include a conductive metallic nitride such as titanium nitride, tantalum nitride, or tungsten nitride. The thickness of each of the second lower conductive liner layer 262L and the second upper conductive liner layer 266L may be in a range from 1 nm to 10 nm, such as from 1.5 nm to 5 nm, although lesser and greater thicknesses may also be used.

The optional second barrier layer 27L, if present, includes a barrier material, and may be formed on top of the second phase change memory layer 26L. The barrier material is a material that may prevent diffusion of, and provide effective encapsulation of, the second phase change memory material. In one embodiment, the barrier material may include, and/or may consist essentially of, amorphous carbon. The thickness of the second barrier layer 27L may be in a range from 12 nm to 75 nm, such as from 21 nm to 60 nm, although lesser and grater thicknesses may also be used.

The second hard mask layer 275L includes a hard mask material that may be used as a planarization stopping structure in a subsequent planarization process. The second hard mask layer 275L may include a material selected from a metal, a dielectric material, or a semiconductor material. For example, the second hard mask layer 275L may include silicon nitride, a dielectric metal oxide, or a metal. In one embodiment, the second hard mask layer 275L may include silicon nitride. The thickness of the second hard mask layer 275L may be in a range from 3 nm to 30 nm, such as from 6 nm to 15 nm, although lesser and greater thicknesses may also be used.

Referring to FIGS. 8A-8D, the processing steps described above with reference to FIGS. 2A-2D may be performed with a modification to the pattern of a photoresist layer such that the second hard mask layer 275L may be patterned into hard mask strips that laterally extend along the first horizontal direction. The processing steps described above with reference to FIGS. 4A-4D may be performed to transfer the pattern of the hard mask strips through the optional second barrier layer 27L, the second phase change memory layer 26L, the second selector layer 24L, and the second conductive material layer 22L. Each patterned portion of the second metal layer 222L constitutes a second electrically conductive line 200. Each patterned portion of the second selector layer 24L constitutes a second selector rail. Each patterned portion of the second phase change memory layer 26L constitutes a second phase change memory rail. Each patterned portion of the second barrier layer constitutes a second barrier strip.

The processing steps described above with reference to FIGS. 5A-5D may be performed with a rotation in the lithographic pattern so that a two-dimensional array of second pillar structures 250 is formed. Specifically, a photoresist layer may be patterned with a line and space pattern that laterally extends along the second horizontal direction hd2. The pattern in the photoresist layer may be transferred through the second barrier strips, the second phase change memory rails, and the second selector rails. In an illustrative example, each second pillar structure 250 may include, from bottom to top, a second selector pillar 24 that is a patterned portion of a second selector rail, a second phase change memory pillar 26 that is a patterned portion of a phase change memory rail, and an optional second barrier segment 27 that is a patterned portion of a second barrier strip.

Each second selector pillar 24 may be a selector element, i.e., an element that provides non-linear voltage-current characteristics such that the element functions as a conductor under second voltage bias conditions and as an insulator under second voltage bias conditions. In one embodiment, each second selector pillar 24 may include a vertical stack of a second lower barrier material portion 242 that is a patterned portion of a second lower barrier material strip, a second ovonic threshold switch material portion 244 that is a patterned portion of a second ovonic threshold switch material rail, and a second upper barrier material portion 246 that is a patterned portion of a second upper barrier material strip.

Each second phase change pillar 26 may be a phase change memory element, i.e., a structure that changes the resistance depending on the phase of a material therein. In one embodiment, each second phase change pillar 26 may include a vertical stack of an optional second lower conductive liner segment 262 that is a patterned portion of a second optional lower conductive liner strip, a second phase change memory material pillar 264 that is a patterned portion of a second phase change memory material rail, and a second optional upper conductive liner segment 266 that is a patterned portion of a second upper conductive liner strip. The photoresist layer may be removed, for example, by ashing.

Generally, the two-dimensional array of second pillar structures 250 may comprise a second two-dimensional array of memory elements. The second two-dimensional array of memory elements may be formed on top surfaces of the second electrically conductive lines 200. Top surfaces of the second portions of the second electrically conductive lines 200 may be physically exposed between each row of second pillar structures 250 that is arranged along the first horizontal direction.

The processing steps described above with reference to FIGS. 6A-6D may be repeated to deposit a second dielectric material over the first exemplary structure. The second dielectric material may be planarized using top surfaces of the second pillar structures 250 as stopping surfaces. For example, excess portions of the second dielectric material overlying a horizontal plane including top surfaces of the optional second barrier segments 27 or second phase change pillars 26 (in case the second barrier segments 27 are not used) may be removed by a planarization process, which may use a recess etch process and/or a chemical mechanical planarization process. Remaining portions of the second hard mask strips 275 may be collaterally removed during the planarization process. A remaining continuous portion of the second dielectric material constitutes a second dielectric material layer 260. The second dielectric material layer 260 may include undoped silicate glass, a doped silicate glass, or spin-on glass. A dielectric liner (not shown) may be optionally deposited prior to deposition of the first dielectric material. The second dielectric material layer 260 is formed around the second two-dimensional array of memory elements, and fills the gaps between memory elements of the second two-dimensional array.

Referring to FIGS. 9A-9F, first via cavities may be formed through the second dielectric material layer 260 and the first dietetic material layer 160 directly on top surfaces of second portions of the first electrically conductive lines 100 having the second width w2. The length L of the second portions may be in a range from 500 nm to 5,000 nm, although lesser and greater lengths L may also be used. In one embodiment, the first via cavities may be formed as a plurality of rows of first via cavities such that each row of first via cavities extends along the second horizontal direction hd2 and rows of the first via cavities are laterally spaced apart along the first horizontal direction hd1. In one embodiment, each row of first via cavities may contact every N-th first electrically conductive line 100 in which N is a positive integer greater than 1. While an embodiment in which N=2 is illustrated in the present disclosure, embodiments are expressly illustrated in which N is 3 or more.

At least one conductive material may be deposited in the first via cavities, and excess portions of the at least one conductive material may be removed from above the horizontal plane including the top surface of the first dielectric material layer 160. The at least one conductive material may include, for example, a metallic nitride material such as TiN, TaN, or WN, and a metallic fill material such as W, Cu, Ru, Co, Mo, or alloys thereof. Each remaining portion of the at least one conductive material that fills the first via cavities constitutes a first conductive via structure 180. Each first conductive via structure 180 may contact a top surface of a second portion of a respective one of the first electrically conductive lines 100, and may contact at least one sidewall of the respective one of the first electrically conductive lines 100. Each first conductive via structure 180 may have a top surface within the horizontal plane including the top surface of the second dielectric material layer 260. The first conductive via structures 180 are formed through the second dielectric material layer 260 and the first dielectric material layer 160, and may contact sidewalls of the second dielectric material layer 260 and the first dielectric material layer 160.

Referring to FIGS. 10A-10D, the processing steps described above with reference to FIGS. 2A-2D, 4A-4D, 5A-5D, 6A-6D, 7A-7D, and 8A-8D can be sequentially formed third electrically conductive lines 300 laterally extending along the first horizontal direction hd1, a two-dimensional array of third pillar structures 350, a third dielectric material layer 360, fourth electrically conductive lines 400 laterally extending along the second horizontal direction hd2, a two-dimensional array of fourth pillar structures 450, and a fourth dielectric material layer 460. Each of the third pillar structures 350 and the fourth pillar structures 450 can have the same structure as the first pillar structures 150 and/or the second pillar structures 250.

Second via cavities may be formed through the fourth dietetic material layer 460 and the third dielectric material layer 360 directly on top surfaces of first conductive via structures 180. In one embodiment, the second via cavities may be formed as a plurality of rows of second via cavities such that each row of second via cavities extends along the second horizontal direction hd2 and rows of the second via cavities are laterally spaced apart along the first horizontal direction hd1. In one embodiment, the second via cavities may have areal overlay with the first conductive via structures 180.

At least one conductive material may be deposited in the second via cavities, and excess portions of the at least one conductive material may be removed from above the horizontal plane including the top surface of the fourth dielectric material layer 460. The at least one conductive material may include, for example, a metallic nitride material such as TiN, TaN, or WN, and a metallic fill material such as W, Cu, Ru, Co, Mo, or alloys thereof. Each remaining portion of the at least one conductive material that fills the second via cavities constitutes a second conductive via structure 380. Each second conductive via structure 380 may contact a top surface of a respective first conductive via structure 180. Each second conductive via structure 380 may have a top surface within the horizontal plane including the top surface of the fourth dielectric material layer 460. The second conductive via structures 380 are formed through the third and fourth dielectric material layers (360, 460), and may contact sidewalls of the third and fourth dielectric material layers (360, 460).

Interconnection structures (180, 380) are formed through the dielectric material layers (160, 260, 360, 460). The interconnection structures (180, 380) are formed on a top surface of a second portion of a respective one of the first electrically conductive lines 100 having a second width w2 that is less than the first width w1.

Referring to FIGS. 11A-11D, a metal layer may be deposited over the fourth dielectric material layer 460 and the two-dimensional array of the fourth pillar structures 450. The metal layer may be patterned to form fifth electrically conductive lines 500. The fifth electrically conductive lines 500 may have the same pattern as the first electrically conductive lines 100. A fifth dielectric material layer 560 may be formed around the fifth electrically conductive lines 500.

In one embodiment, the fifth electrically conductive lines 500 and the fifth dielectric material layer 560 may be formed by repeating the processing steps described above. The fifth electrically conductive lines 500 may laterally extend along the first horizontal direction hd1. Each fifth electrically conductive line 500 may include a first portion having the first width w1 and a second portion having the second width w2.

Referring collective to FIGS. 1A-11D, a memory device is provided, which comprises: a vertical stack overlying a substrate 9 and including first electrically conductive lines 100, a two-dimensional array of first pillar structures 150, second electrically conductive lines 200, a two-dimensional array of second pillar structures 250, third electrically conductive lines 300, a two-dimensional array of third pillar structures 350, fourth electrically conductive lines 400, a two-dimensional array of fourth pillar structures 450, and fifth electrically conductive lines 500, wherein each of the first pillar structures 150, the second pillar structures 250, the third pillar structures 350, and the fourth pillar structures 460 comprises a respective memory element (such as a phase change memory material pillar), and the two-dimensional array of first pillar structures 150 overlies top surfaces of first portions of the first electrically conductive lines 100 having a first width w1; and interconnection structures (180, 380) providing electrically conductive paths between the fifth electrically conductive lines 500 and the first electrically conductive lines 100, wherein each of the interconnection structures (180, 380) contacts a top surface of a second portion of a respective one of the first electrically conductive lines 100 having a second width w2 that is less than the first width w1.

In one embodiment, each of the interconnection structures (180, 380) comprises: a first conductive via structure 180 that contacts the top surface of the second portion of a respective one of the first electrically conductive lines 100 and vertically extending up to a horizontal plane including the top surfaces of the two-dimensional array of second pillar structures 250; and a second conductive via structure 380 overlying the first contact via structure 180 and contacting a bottom surface of a respective one of the fifth electrically conductive lines 500.

In one embodiment, a bottom surface of the second conductive via structure 380 contacts a top surface of the first conductive via structure 180. In one embodiment, the two-dimensional array of first pillar structures 150 is formed in a first dielectric material layer 160 that laterally surrounds a lower portion of each of the first conductive via structures 180; and the two-dimensional array of second pillar structures 250 is formed in a second dielectric material layer 260 that laterally surrounds an upper portion of each of the first conductive via structures 180.

In one embodiment, the first electrically conductive lines 100, the third electrically conductive lines 300, and the fifth electrically conductive lines 500 laterally extend along the first horizontal direction hd1; and the second electrically conductive lines 200 and the fourth electrically conductive lines 400 laterally extend along a second horizontal direction hd2 that is perpendicular to the first horizontal direction hd1.

In one embodiment, each first portion of the first electrically conductive lines 100 underlies, and contacts, a respective row of first pillar structures 150 within the two-dimensional array of first pillar structures 150; and each second portion of the first electrically conductive lines 100 is laterally offset from an area including the two-dimensional array of first pillar structures 150.

In one embodiment, each of the first electrically conductive lines 100 includes a respective first portion having a pair of first sidewalls spaced by the first width w1 and a respective second portion having a pair of second sidewalls spaced by the second width w2; and each second sidewall of the pair of second sidewalls is laterally offset from one of the pair of first sidewalls by one half of a difference between the first width w1 and the second width w2 along a horizontal direction that is perpendicular to the first horizontal direction hd1, i.e., along the second horizontal direction hd2. In one embodiment, each of the first electrically conductive lines 100 includes a respective third portion having the first width w1, adjoined to the respective second portion, and contacting bottom surfaces of a two-dimensional array of additional first pillar structures 150 located at a same vertical distance from the substrate 9 as the two-dimensional array of first pillar structures 150.

In one embodiment, each of the fifth electrically conductive lines 500 includes a respective first portion having the first width w1 and a respective second portion having the second width w2; and each of the interconnection structures (180, 380) contacts a bottom surface of one of the second portions of the fifth electrically conductive lines 500.

In one embodiment, each of the first pillar structures 150, the second pillar structures 250, the third pillar structures 350, and the fourth pillar structures 450 has at least one vertical or tapered sidewall that vertically extends from a topmost surface thereof to a bottommost surface thereof. In one embodiment, each of the first pillar structures 150, the second pillar structures 250, the third pillar structures 350, and the fourth pillar structures 450 comprises a series connection of a memory material portion and a selector material portion. In one embodiment, the memory material portion includes a phase change material; and the selector material portion includes an ovonic threshold switch material.

Referring to FIGS. 12A-12D, a second exemplary structure according to a second embodiment of the present disclosure may be the same as the first exemplary structure of FIGS. 1A-1D.

Referring to FIGS. 13A-13D, the processing steps described above with reference to FIGS. 2A-2D and 4A-4D may be performed to form first electrically conductive lines 100 and first stacked rail structures 150L that are laterally spaced apart by first trenches. Each of the first stacked rail structures 150L and the first electrically conductive lines 100 laterally extends along the first horizontal direction hd1. The first electrically conductive lines 100 include patterned remaining portions of the first metal layer 122L. The first stacked rail structures 150L are laterally spaced apart by the first trenches 11 along the second horizontal direction hd2. Each of the first stacked rail structures 150L and the first electrically conductive lines 100 may have a uniform thickness throughout, which is herein referred to as a first width w1.

Each first stacked rail structure 150L may include, from bottom to top, a first selector rail 14' that is a patterned portion of the first selector layer 14L, a first phase change memory rail 16' that is a patterned portion of the first phase change memory layer 16L, and a first barrier rail 17' that is a patterned portion of the first barrier layer 17L. As used herein, a "strip" refers to a rail having a thickness that is less than the width. The first stacked rail structures 150L laterally extend along the first horizontal direction hd1, are laterally spaced from one another by the first trenches 11, and are located over the substrate 9.

In one embodiment, each first stacked rail structure 150L may include a first metal nitride strip 124' that is a patterned portion of the first metal nitride layer 124L. In one embodiment, each first selector rail 14' may include a vertical stack of a first lower barrier material strip 142', a first ovonic threshold switch material rail 144', and a first upper barrier material strip 146'. The first lower barrier material strip 142' is a patterned portion of an optional first lower barrier material layer 142L. The first ovonic threshold switch material rail 144' is a patterned portion of the first ovonic threshold switch material layer 144L. The first upper barrier material strip 146' is a patterned portion of the optional first upper barrier material layer 146L. In one embodiment, each first phase change memory rail 16' may include, from bottom to top, a first optional lower conductive liner strip 162', a first phase change memory material rail 164', and a first optional upper conductive liner strip 166'. Each first lower conductive liner strip 162' is a patterned portion of the first lower conductive liner layer 162L, each first phase change memory material rail 164' is a patterned portion of the first phase change memory material layer 164L, and each first upper conductive liner strip 166' is a patterned portion of the first upper conductive liner layer 166L. The first stacked rail structures 150L laterally extend along the first horizontal direction hd1, and are laterally spaced from one another by the first trenches 11 over the base dielectric material layers 60.

Referring to FIGS. 14A-14D, another photoresist layer (not shown) is applied over the first exemplary structure, and is lithographically patterned in a line and space pattern within areas that includes portions of the first stacked rail structures 150L having the first width. Each line and space pattern may laterally extend along the second horizontal direction hd2, and may be laterally spaced apart along the first horizontal direction hd1. The pitch of each line and space pattern may be in a range from 30 nm to 600 nm, although lesser and greater distances may also be used. The width of each line within the line and space pattern may be about one half of the pitch of the line and space pattern.

An anisotropic etch process may be performed to transfer the pattern of the photoresist layer through the hard mask strips 175 and the first stacked rail structures 150L. Each hard mask strips 175 may be patterned into hard mask segments 178 having a rectangular horizontal cross-sectional shape. The first stacked rail structures 150L are patterned into a two-dimensional rectangular array of first pillar structures 150. Each first pillar structure 150 may have a rectangular horizontal cross-sectional shape. The first metal nitride strips 124' may be patterned into first metal nitride segments, or may function as an etch stop structure and remain as first metal nitride strips 124'.

The chemistry of the anisotropic etch process may be sequentially modified to etch through the various materials of the hard mask strips 175, the first barrier rails 17', the first phase change memory rails 16', the first selector rails 14', and optionally through the first metal nitride strips 124'. The anisotropic etch process may stop at the top surface of, or within, the first electrically conductive lines 100 or within the first metal nitride strips 124'. In an illustrative example, each first pillar structure 150 may include, from bottom to top, a first selector pillar 14 that is a patterned portion of a first selector rail 14', a first phase change pillar 16 that is a patterned portion of a phase change memory rail 16', and an optional first barrier segment 17 that is a patterned portion of a first barrier strip 17'.

Each first selector pillar is a selector element, i.e., an element that provides non-linear voltage-current characteristics such that the element functions as a conductor under first voltage bias conditions and as an insulator under second voltage bias conditions. In one embodiment, each first selector pillar 14 may include a vertical stack of a first lower barrier material portion 142 that is a patterned portion of a first lower barrier material strip 142', a first ovonic threshold switch material portion 144 that is a patterned portion of a first ovonic threshold switch material rail 144', and a first upper barrier material portion 146 that is a patterned portion of a first upper barrier material strip 146'.

In one embodiment, each first selector pillar 14 includes a first ovonic threshold switch material portion 144, an upper amorphous carbon portion that contacts a top surface of the first ovonic threshold switch material portion 144 as a first upper barrier material portion 146, and a lower amorphous carbon portion that contacts a bottom surface of the first ovonic threshold switch material portion 144 as a first lower barrier material portion 142.

Each first phase change pillar 16 is a phase change memory element, i.e., a structure that changes the resistance depending on the phase of a material therein. In one embodiment, each first phase change pillar 16 may include a vertical stack of an optional first lower conductive liner segment 162 that is a patterned portion of a first optional lower conductive liner strip 162', a first phase change memory material pillar 164 that is a patterned portion of a first phase change memory material rail 164', and a first optional upper conductive liner segment 166 that is a patterned portion of a first upper conductive liner strip 166'. The photoresist layer may be removed, for example, by ashing.

Generally, the two-dimensional array of first pillar structures 150 may comprise a first two-dimensional array of memory elements. The first two-dimensional array of memory elements may be formed on top surfaces of first portions and third portions of the first electrically conductive lines 100 having the first width w1. Top surfaces of the second portions of the first electrically conductive lines 100 may be physically exposed. The first electrically conductive lines 100 may have a uniform width throughout, which may be the first width w1. The first electrically conductive lines 100 may be laterally spaced apart from one another along the second horizontal direction hd2 by a first spacing s1. The first electrically conductive layers 100 may be formed as a periodic one-dimensional array along the second horizontal direction hd2 with a uniform pitch, which may be a first pitch p1 that is the same as the sum of the first width w1 and the first spacing s1.

Referring to FIGS. 15A-15D, a first dielectric material may be deposited over the exemplary structure and may be planarized using top surfaces of the first pillar structures 150 as stopping surfaces. For example, excess portions of the first dielectric material layer overlying a horizontal plane including top surfaces of the optional first barrier segments 17 or first phase change pillars 16 (in case the first barrier segments 17 are not used) may be removed by a planarization process, which may use a recess etch process and/or a chemical mechanical planarization process. The hard mask segments 178 may be collaterally removed during the planarization process. A remaining continuous portion of the first dielectric material constitutes a first dielectric material layer 160. The first dielectric material layer 160 may include undoped silicate glass, a doped silicate glass, or spin-on glass. A dielectric liner (not shown) may be optionally deposited prior to deposition of the first dielectric material. The first dielectric material layer 160 is formed around the first two-dimensional array of memory elements, and fills the gaps between memory elements of the first two-dimensional array.

Referring to FIGS. 16A-16D, the set of processing steps described with reference to FIGS. 7A-7D and 8A-8D can be performed to form second electrically conductive lines 200, a two-dimensional array of second pillar structures 250, and a second dielectric material layer 260.

First via cavities may be formed through the second dielectric material layer 260 and the first dietetic material layer 160 directly on top surfaces of the first electrically conductive lines 100. In one embodiment, the first via cavities may be formed as a plurality of rows of first via cavities such that each row of first via cavities extends along the second horizontal direction hd2 and rows of the first via cavities are laterally spaced apart along the first horizontal direction hd1. In one embodiment, each row of first via cavities may contact every N-th first electrically conductive line 100 in which N is a positive integer greater than 1. While an embodiment in which N=2 is illustrated in the present disclosure, embodiments are expressly illustrated in which N is 3 or more.

At least one conductive material may be deposited in the first via cavities, and excess portions of the at least one conductive material may be removed from above the horizontal plane including the top surface of the second dielectric material layer 260. The at least one conductive material may include, for example, a metallic nitride material such as TiN, TaN, or WN, and a metallic fill material such as W, Cu, Ru, Co, Mo, or alloys thereof. Each remaining portion of the at least one conductive material that fills the first via cavities constitutes a first conductive via structure 180. Each first conductive via structure 180 may contact a top surface of a second portion of a respective one of the first electrically conductive lines 100, and may contact at least one sidewall of the respective one of the first electrically conductive lines 100. Each first conductive via structure 180 may have a top surface within the horizontal plane including the top surface of the second dielectric material layer 260. The first conductive via structures 180 are formed through the second dielectric material layer 260 and the first dielectric material layer 160, and may contact sidewalls of the first dielectric material layer 260 and the first dielectric material layer 160.

Referring to FIGS. 17A-17D, a third material layer stack (32L, 34L, 36L, 37L, 375L), which is also referred to as a third layer stack or a third vertical stack, is formed over the second dielectric material layer 260 and the two-dimensional array of second pillar structures 250. For example, the third material layer stack (32L, 34L, 36L, 37L, 375L) may include a third conductive material layer 32L, a third selector layer 34L, a third phase change memory layer 36L, an optional third barrier layer 37L, and a third hard mask layer 375L. Each layer in the third material layer stack (32L, 34L, 36L, 37L, 375L) may be formed as a blanket material layer, i.e., an unpatterned material layer that laterally extend along a third horizontal direction hd1 and a third horizontal direction hd2 that is perpendicular to the third horizontal direction hd1.

The third conductive material layer 32L includes at least one conductive material layer, which may be at least one metallic material layer. For example, the third conductive material layer 32L may include a layer stack, from bottom to top, of a third metal layer 322L (such as a tungsten layer) and a third metal nitride layer 324L (such as a tungsten nitride layer or a titanium nitride layer). The thickness of the third metal layer 322L may be in a range from 31 nm to 100 nm, such as from 30 nm to 70 nm, although lesser and greater thicknesses may also be used. The thickness of the third metal nitride layer 324L may be in a range from 1 nm to 10 nm, such as from 1.5 nm to 5 nm, although lesser and greater thicknesses may also be used. In another embodiment, the third conductive material layer 32L may include two separate metallic material layers formed during separate deposition and patterning steps, such as a first tungsten layer that is patterned with the layers of the underlying first pillar structures 150 and a third tungsten layer that is deposited on the first tungsten layer after patterning the first tungsten layer and the underlying pillar structures for process feasibility and/or smaller variation of contact between parts of the third conductive material layer 32L and the underlying and overlying memory material layers.

The third selector layer 34L includes a non-Ohmic material that provides electrical connection of electrical isolation depending on the magnitude and/or the polarity of an externally applied voltage bias thereacross. In one embodiment, the third selector layer 34L includes at least one threshold switch material layer such as an ovonic threshold switch material layer. The ovonic threshold switch material layer may include a third ovonic threshold switch material layer 344L which contains any ovonic threshold switch material. In one embodiment, the third ovonic threshold switch material layer 344L may include, and/or may consist essentially of, a GeSeAs compound, a GeSe compound, a SeAs compound, a GeTe compound, or a SiTe compound.

In one embodiment, the material of the third ovonic threshold switch material layer 344L may be selected such that the resistivity of the third ovonic threshold switch material layer 344L decreases at least by two orders of magnitude (i.e., by more than a factor of 100) upon application of an external bias voltage that exceeds a critical bias voltage magnitude (also referred to as threshold voltage). In one embodiment, the composition and the thickness of the third ovonic threshold switch material layer 344L may be selected such that the critical bias voltage magnitude may be in a range from 1 V to 4 V, although lesser and greater voltages may also be used for the critical bias voltage magnitude. The thickness of the third ovonic threshold switch material layer 344L may be, for example, in a range from 5 nm to 50 nm, such as from 10 nm to 30 nm, although lesser and greater thicknesses may also be used.

The third selector layer 34L may include an optional third upper barrier material layer 346L overlying the third ovonic threshold switch material layer 344L and an optional third lower barrier material layer 342L underlying the third ovonic threshold switch material layer 344L. The optional third upper and/or lower barrier material layers (346L, 342L) include a material that suppresses diffusion of the material of the third ovonic threshold switch material layer 344L. For example, the third upper and/or lower barrier material layers (346L, 342L) may include amorphous carbon or diamond-like carbon (DLC). The thickness of the third upper barrier material layers 346L may be in a range from 4 nm to 40 nm, such as from 8 nm to 31 nm, although lesser and greater thicknesses may also be used. The thickness of the third lower barrier material layer 342L may be in a range from 4 nm to 40 nm, such as from 8 nm to 31 nm, although lesser and greater thicknesses may also be used.

The third phase change memory layer 36L includes a third phase change memory material layer 364L. The third phase change memory material layer 364L include a phase change memory material. The thickness of the third phase change memory material layer 364L may be in a range from 1 nm to 60 nm, such as from 3 nm to 40 nm and/or from 10 nm to 35 nm, although lesser and greater thicknesses may also be used.

The third phase change memory layer 36L may optionally include a third lower conductive liner layer 362L underlying the third phase change memory material layer 364L, and may optionally include a third upper conductive liner layer 366L overlying the third phase change memory material layer 364L. The optional third lower conductive liner layer 362L and/or the optional third upper conductive liner layer 366L, if present, include a conductive metallic material. In one embodiment, the third lower conductive liner layer 362L and/or the third upper conductive liner layer 366L may include a conductive metallic nitride such as titanium nitride, tantalum nitride, or tungsten nitride. The thickness of each of the third lower conductive liner layer 362L and the third upper conductive liner layer 366L may be in a range from 1 nm to 10 nm, such as from 1.5 nm to 5 nm, although lesser and greater thicknesses may also be used.

The optional third barrier layer 37L, if present, includes a barrier material, and may be formed on top of the third phase change memory layer 36L. The barrier material is a material that may prevent diffusion of, and provide effective encapsulation of, the third phase change memory material. In one embodiment, the barrier material may include, and/or may consist essentially of, amorphous carbon. The thickness of the third barrier layer 37L may be in a range from 12 nm to 75 nm, such as from 31 nm to 60 nm, although lesser and grater thicknesses may also be used.

The third hard mask layer 375L includes a hard mask material that may be used as a planarization stopping structure in a subsequent planarization process. The third hard mask layer 375L may include a material selected from a metal, a dielectric material, or a semiconductor material. For example, the third hard mask layer 375L may include silicon nitride, a dielectric metal oxide, or a metal. In one embodiment, the third hard mask layer 375L may include silicon nitride. The thickness of the third hard mask layer 375L may be in a range from 3 nm to 30 nm, such as from 6 nm to 15 nm, although lesser and greater thicknesses may also be used.

Referring to FIGS. 18A-18D, a photoresist layer may be applied over the third material layer stack (32L, 34L, 36L, 37L, 375L), and may be lithographically patterned to form a line and space pattern over areas of each two-dimensional array of second pillar structures 250 and to form discrete plate patterns over areas of the first conductive via structures 180. The line and space pattern includes line patterns that laterally extend along the first horizontal direction hd1. The line and space pattern may have a uniform pitch along the second horizontal direction hd2 that is perpendicular to the first horizontal direction. The uniform pitch may be, for example, in a range from 30 nm to 600 nm. The discrete plate pattern includes discrete areas that cover each area of the first conductive via structure 180.

Figure 18A:
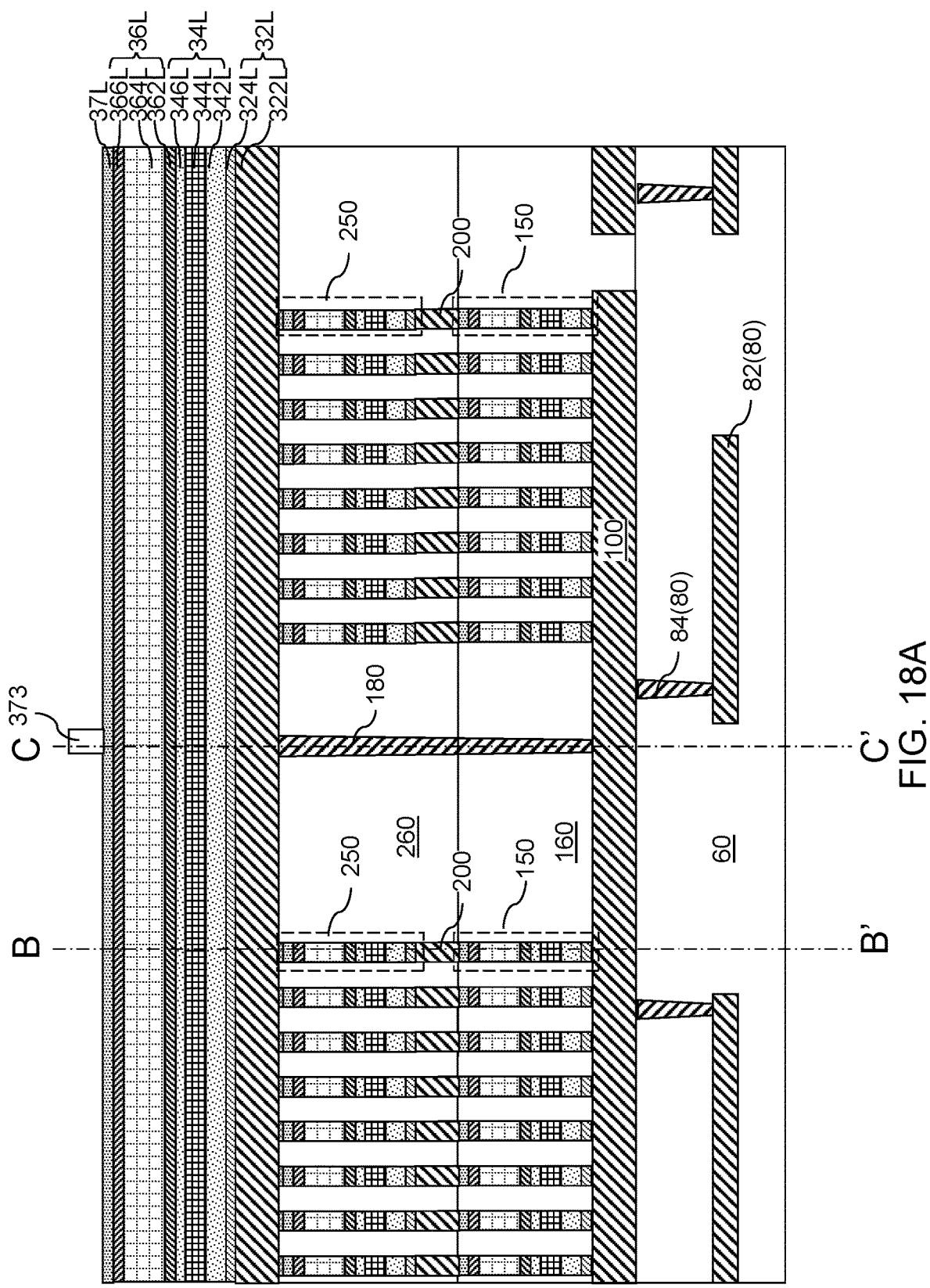
FIG. 18A is a vertical cross-sectional view of the second exemplary structure after patterning the third hard mask layer into hard mask strips and hard mask plates according to the second embodiment of the present disclosure.
Figure 18C:
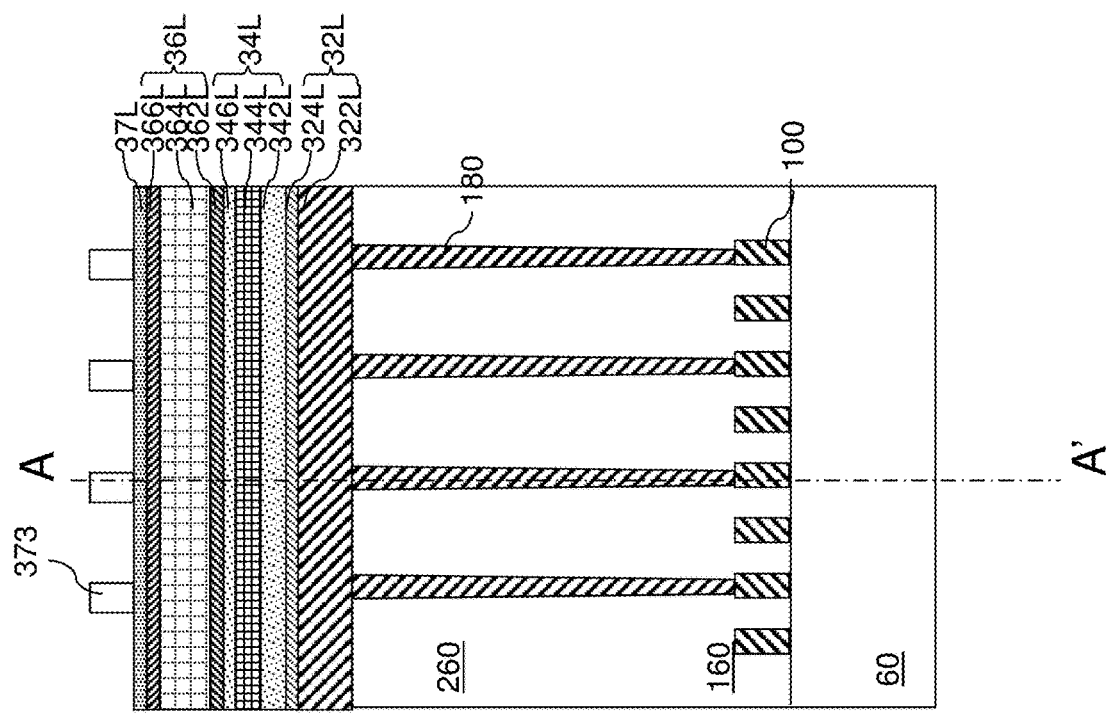
FIG. 18C is a vertical cross-sectional view of the second exemplary structure along the vertical plane C-C' of FIG. 18A.
Figure 18B:
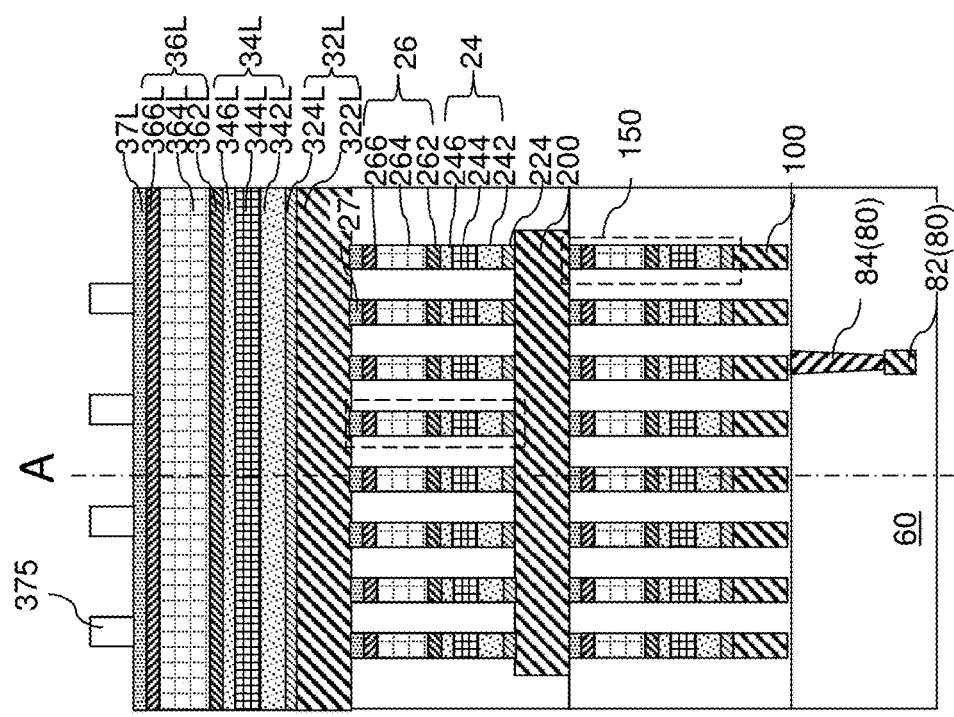
FIG. 18B is a vertical cross-sectional view of the second exemplary structure along the vertical plane B-B' of FIG. 18A.
Figure 18D:
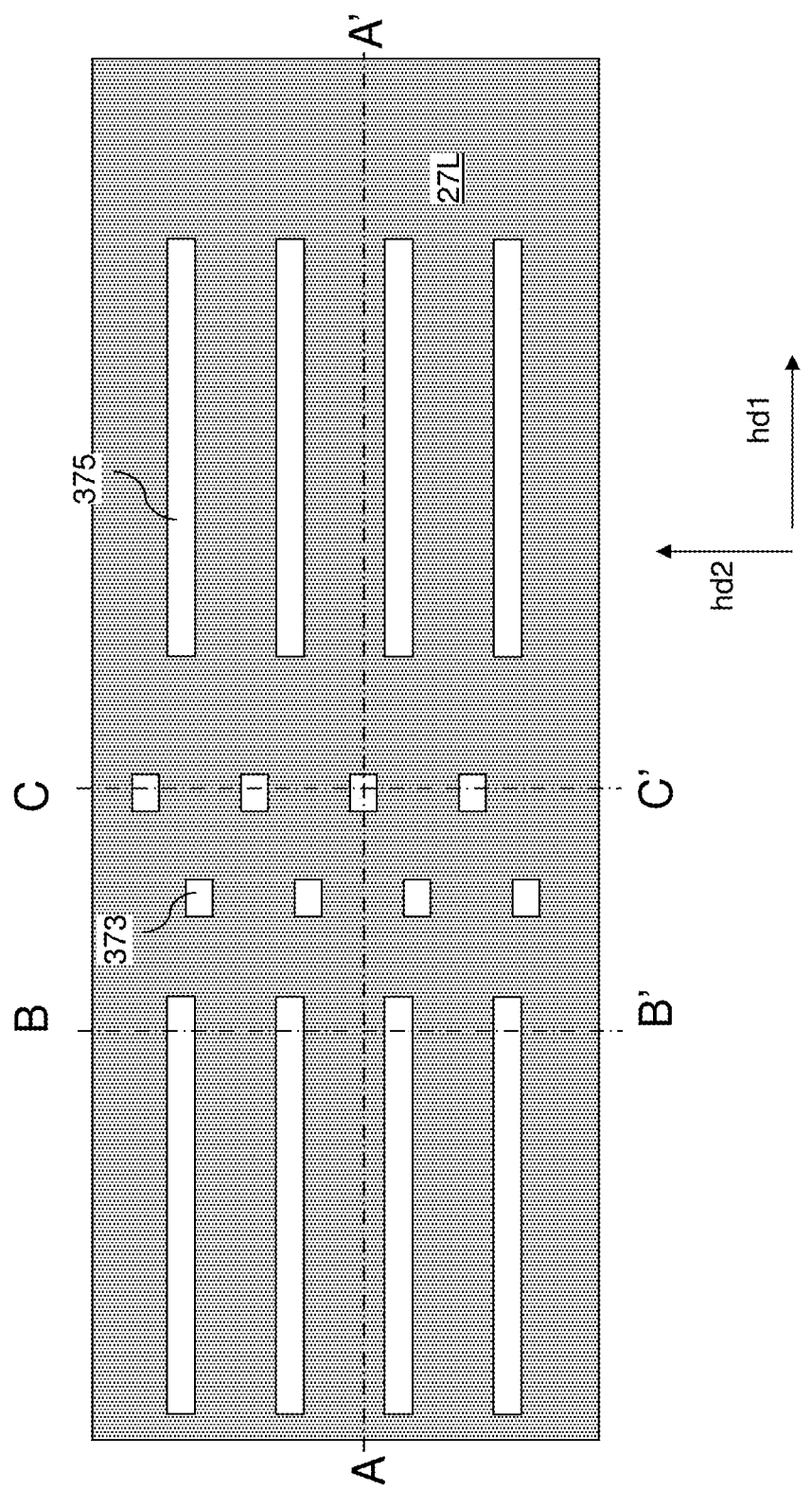
FIG. 18D is a top-down view of the second exemplary structure of FIGS. 18A-18C. The vertical plane A-A' is the plane of the vertical cross-sectional view of FIGS. 18A-18C. The vertical plane B-B' is the plane of the vertical cross-sectional view of FIGS. 18A-18C. The vertical plane C-C' is the plane of the vertical cross-sectional view of FIGS. 18A-18C.

An anisotropic etch process is performed to transfer the pattern of the photoresist layer through the third hard mask layer 375L. The third hard mask layer 375L may be patterned into third hard mask strips 375 having line shapes and hard mask plates 373 having discrete shapes. As shown in FIG. 18D, each third hard mask strip 375 may laterally extend along the first horizontal direction hd1 with a uniform width, and may be formed between a neighboring pair of rows of second pillar structures 250 that laterally extend along the first horizontal direction hd1. The third hard mask strips 375 are not shown in FIG. 18A because the cross sectional line A-A' in FIG. 18D extends between the third hard mask strips 375. Each third hard mask strip 375 may have a rectangular shape. In one embodiment, the third hard mask strips 375 may be located at every other gap area located between rectangular areas including a respective neighboring pair of rows of second pillar structures 250. In this case, the third hard mask strips 375 do not have any areal overlap with the second pillar structures 250. In one embodiment, the third hard mask strips 375 may have a respective uniform width, which may be in a range from 15 nm to 300 nm, although lesser and greater dimensions may also be used. The hard mask plates 373 overlie a respective one of the first conductive via structure 180. The hard mask plates 373 may have rectangular shapes, circular shapes, or oval shapes. The photoresist layer may be subsequently removed, for example, by ashing.

Figure 19A:
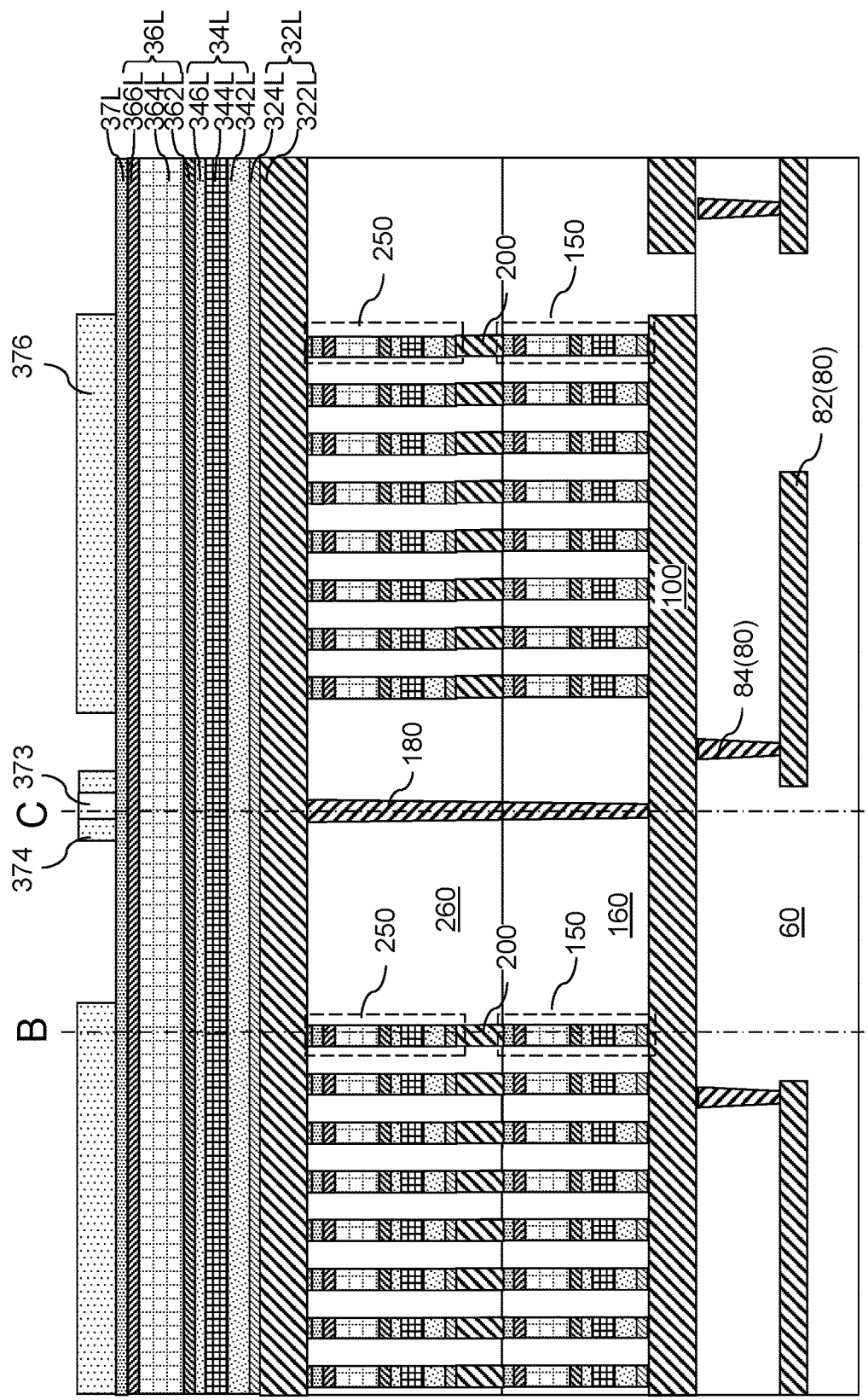
FIG. 19A is a vertical cross-sectional view of the second exemplary structure after formation of first spacer material portions around the hard mask strips and formation of second spacer material portions around the hard mask plates according to the second embodiment of the present disclosure.
Figure 19C:
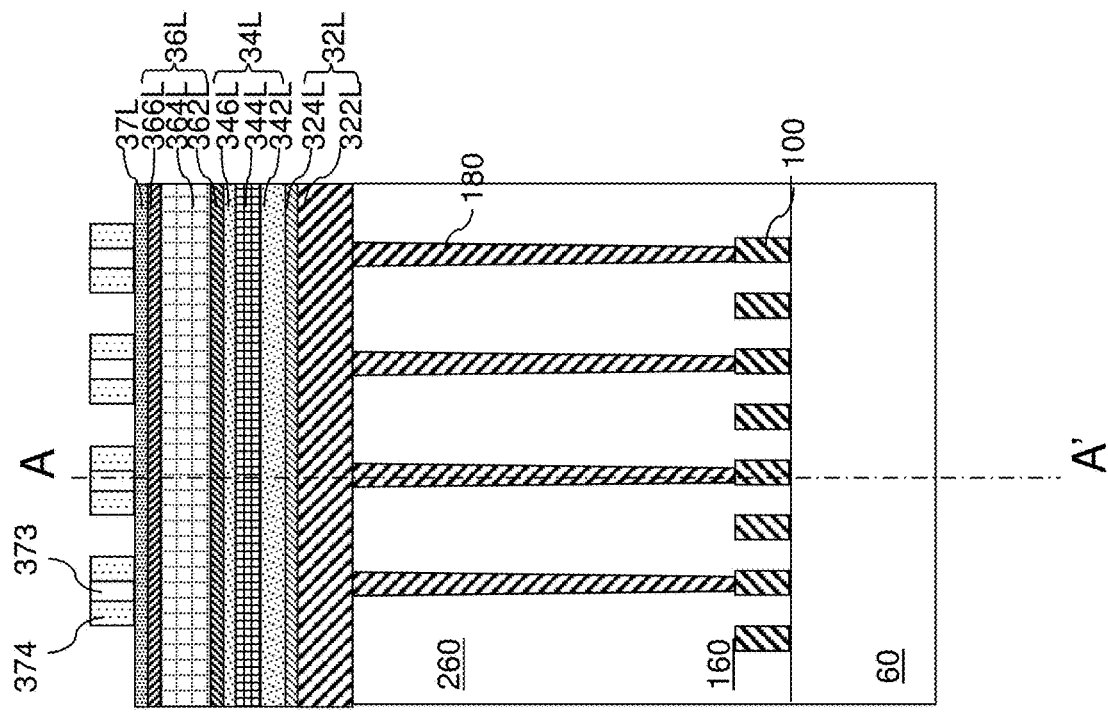
FIG. 19C is a vertical cross-sectional view of the second exemplary structure along the vertical plane C-C' of FIG. 19A.
Figure 19B:
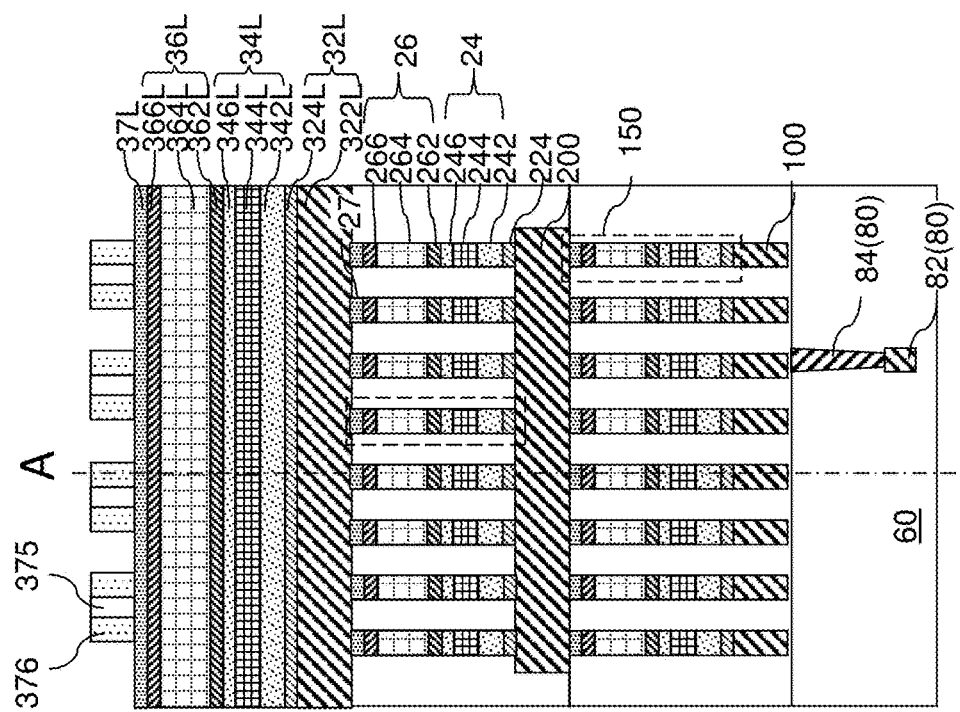
FIG. 19B is a vertical cross-sectional view of the second exemplary structure along the vertical plane B-B' of FIG. 19A.
Figure 19D:
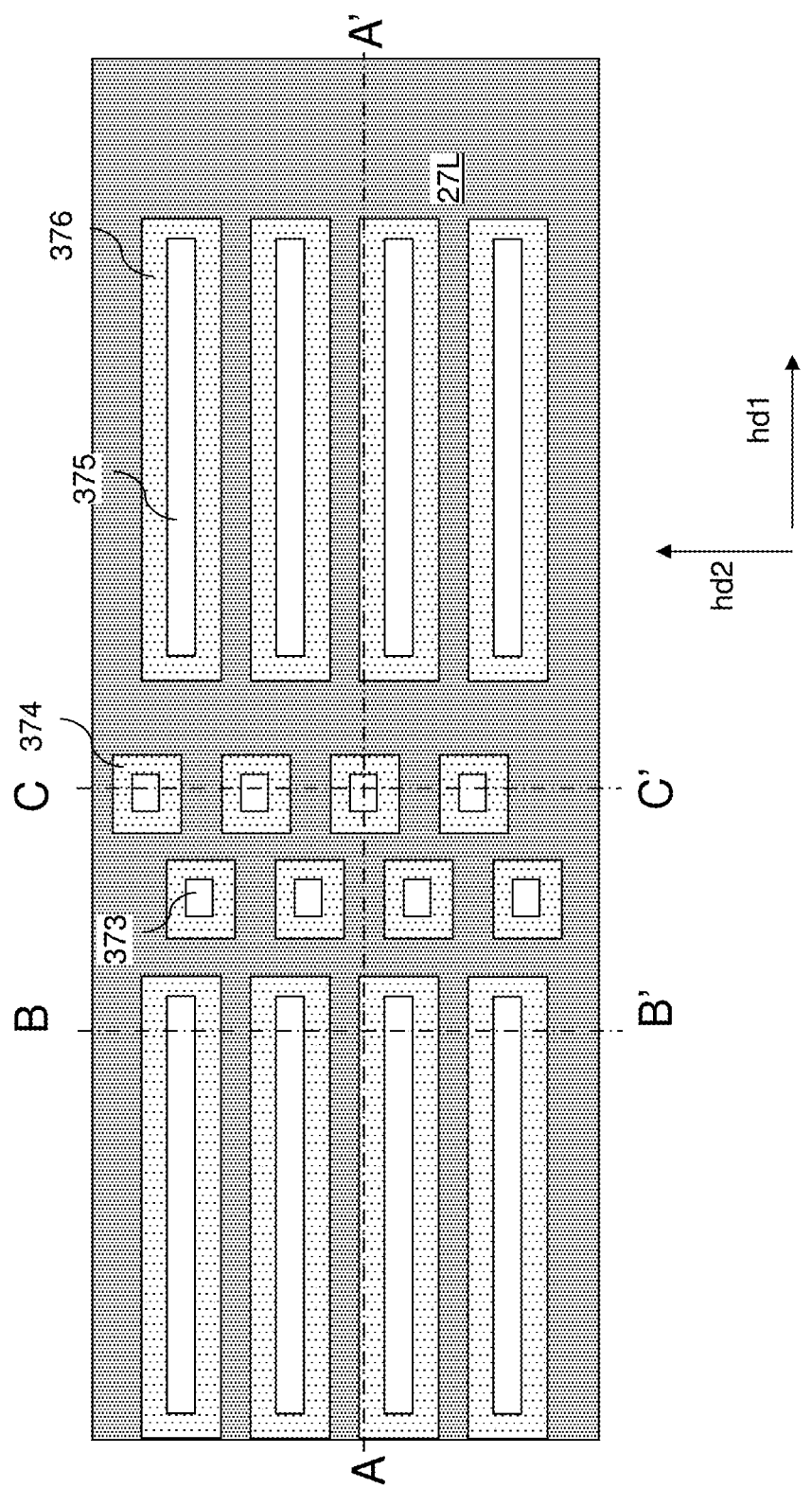
FIG. 19D is a top-down view of the second exemplary structure of FIGS. 19A-19C. The vertical plane A-A' is the plane of the vertical cross-sectional view of FIGS. 19A-19C. The vertical plane B-B' is the plane of the vertical cross-sectional view of FIGS. 19A-19C. The vertical plane C-C' is the plane of the vertical cross-sectional view of FIGS. 19A-19C.
Figure 20A:
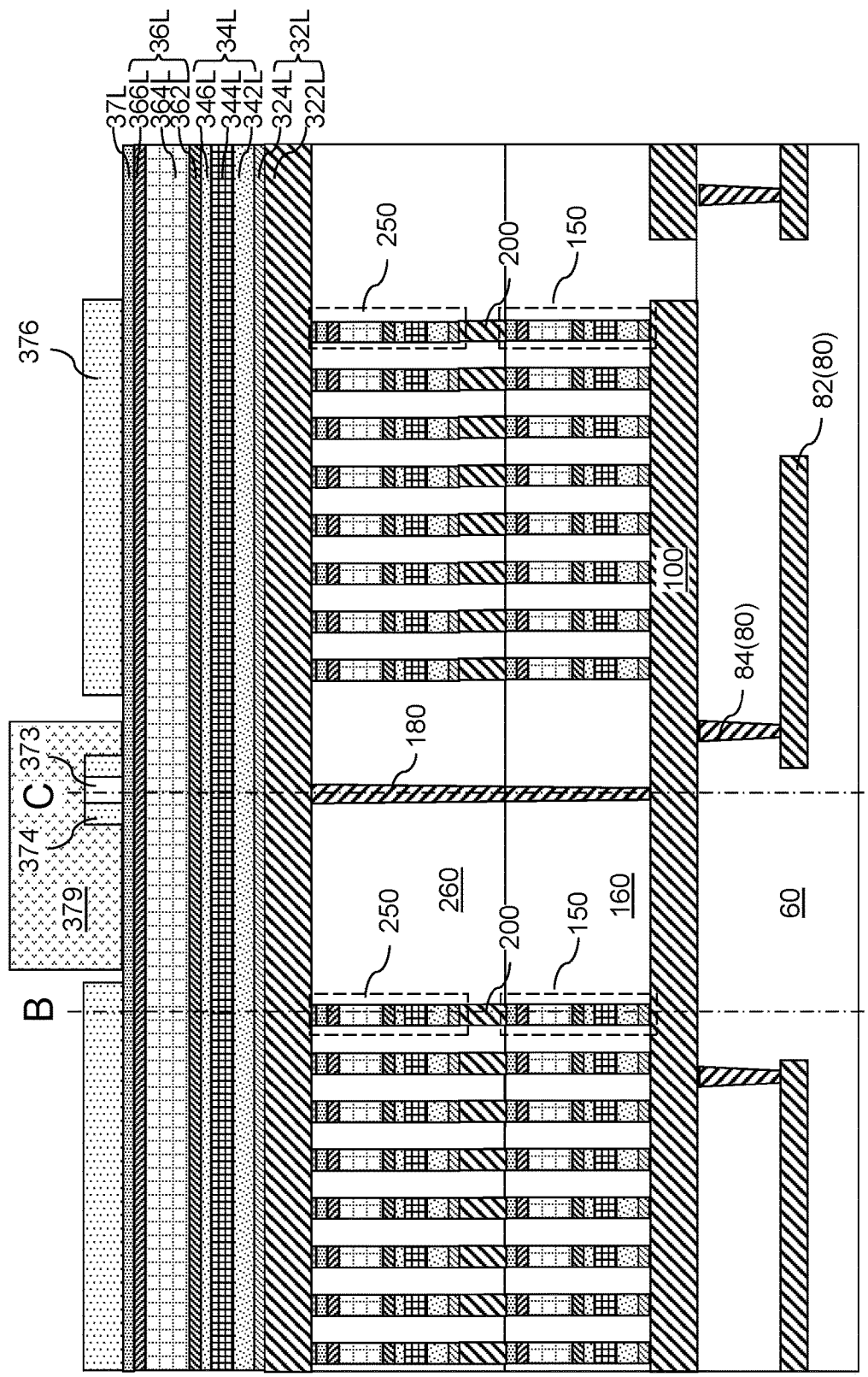
FIG. 20A is a vertical cross-sectional view of the second exemplary structure after masking the second spacer material portions with a patterned photoresist layer and removing the second spacer material portions according to the second embodiment of the present disclosure.
Figure 20C:
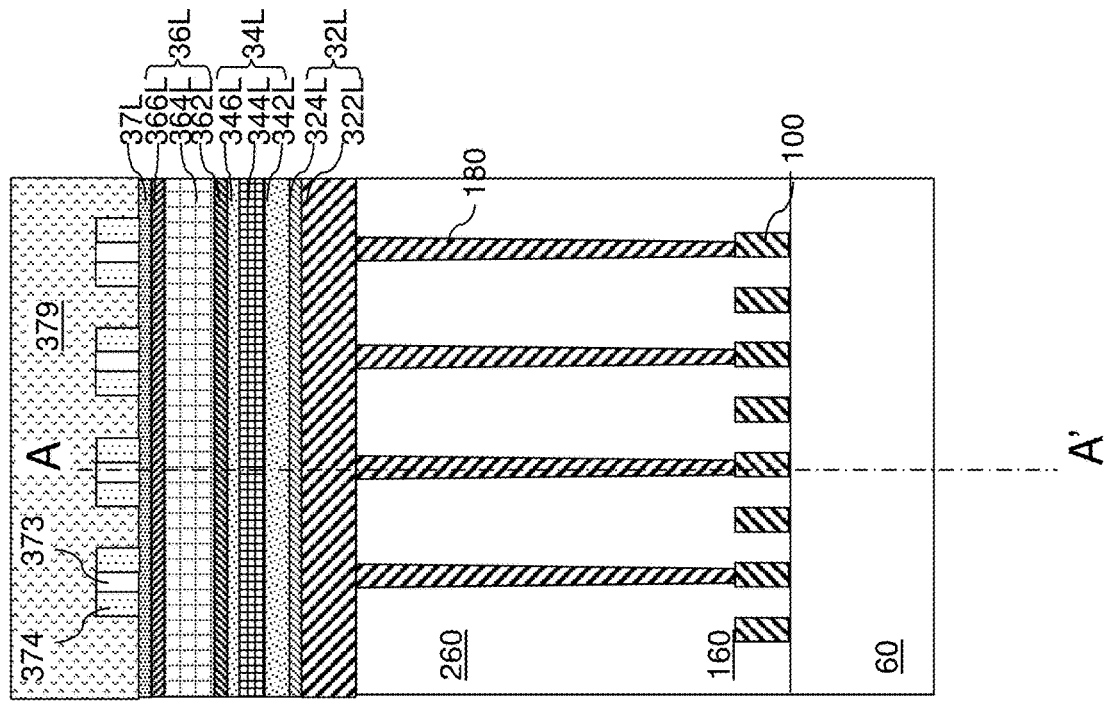
FIG. 20C is a vertical cross-sectional view of the second exemplary structure along the vertical plane C-C' of FIG. 20A.
Figure 20B:
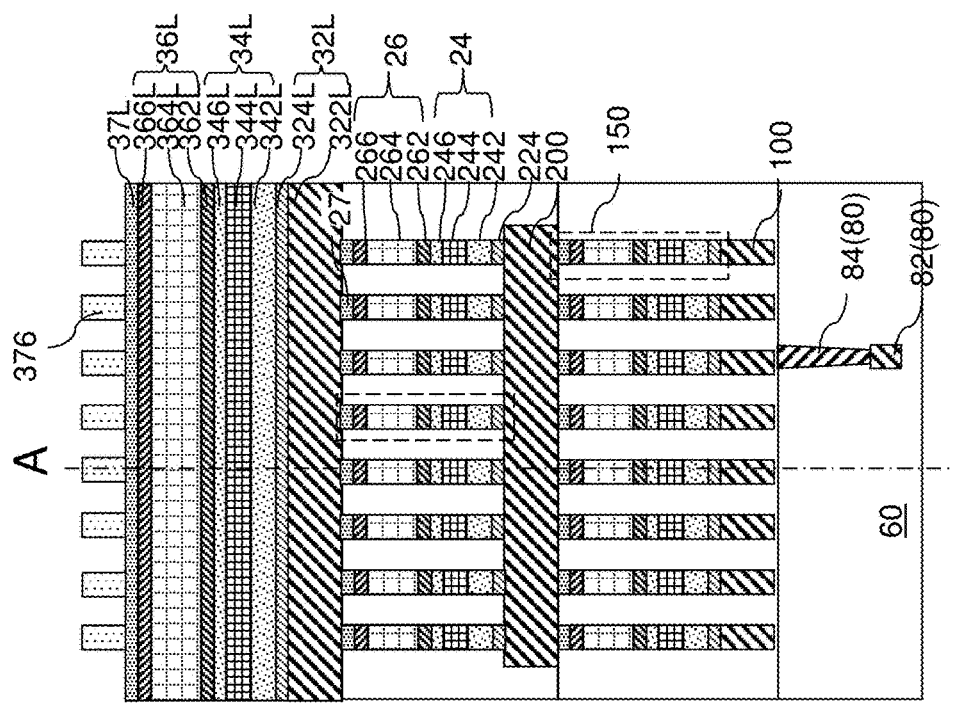
FIG. 20B is a vertical cross-sectional view of the second exemplary structure along the vertical plane B-B' of FIG. 20A.
Figure 20D:
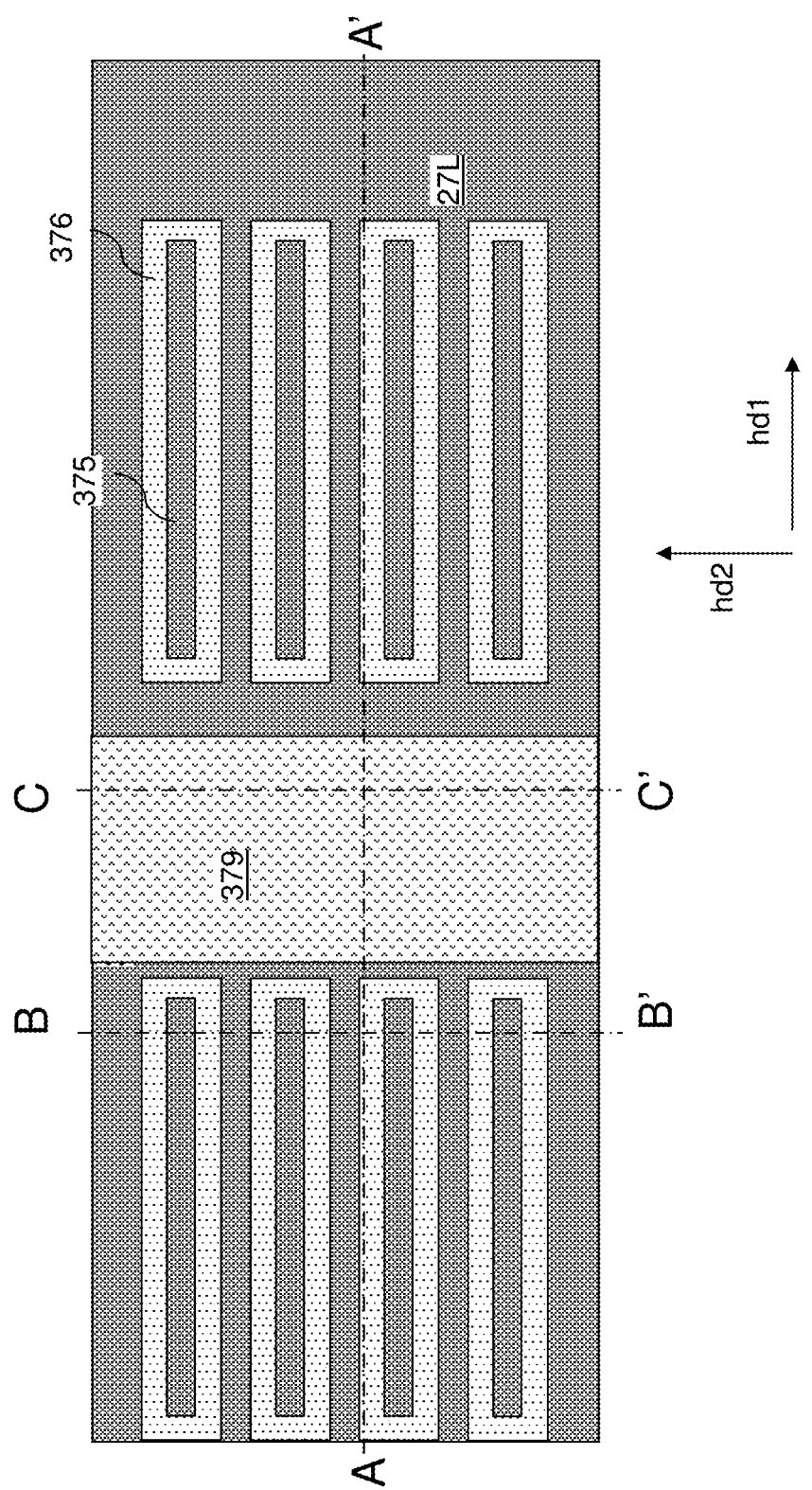
FIG. 20D is a top-down view of the second exemplary structure of FIGS. 20A-20C. The vertical plane A-A' is the plane of the vertical cross-sectional view of FIGS. 20A-20C. The vertical plane B-B' is the plane of the vertical cross-sectional view of FIGS. 20A-20C. The vertical plane C-C' is the plane of the vertical cross-sectional view of FIGS. 20A-20C.
Figure 21A:
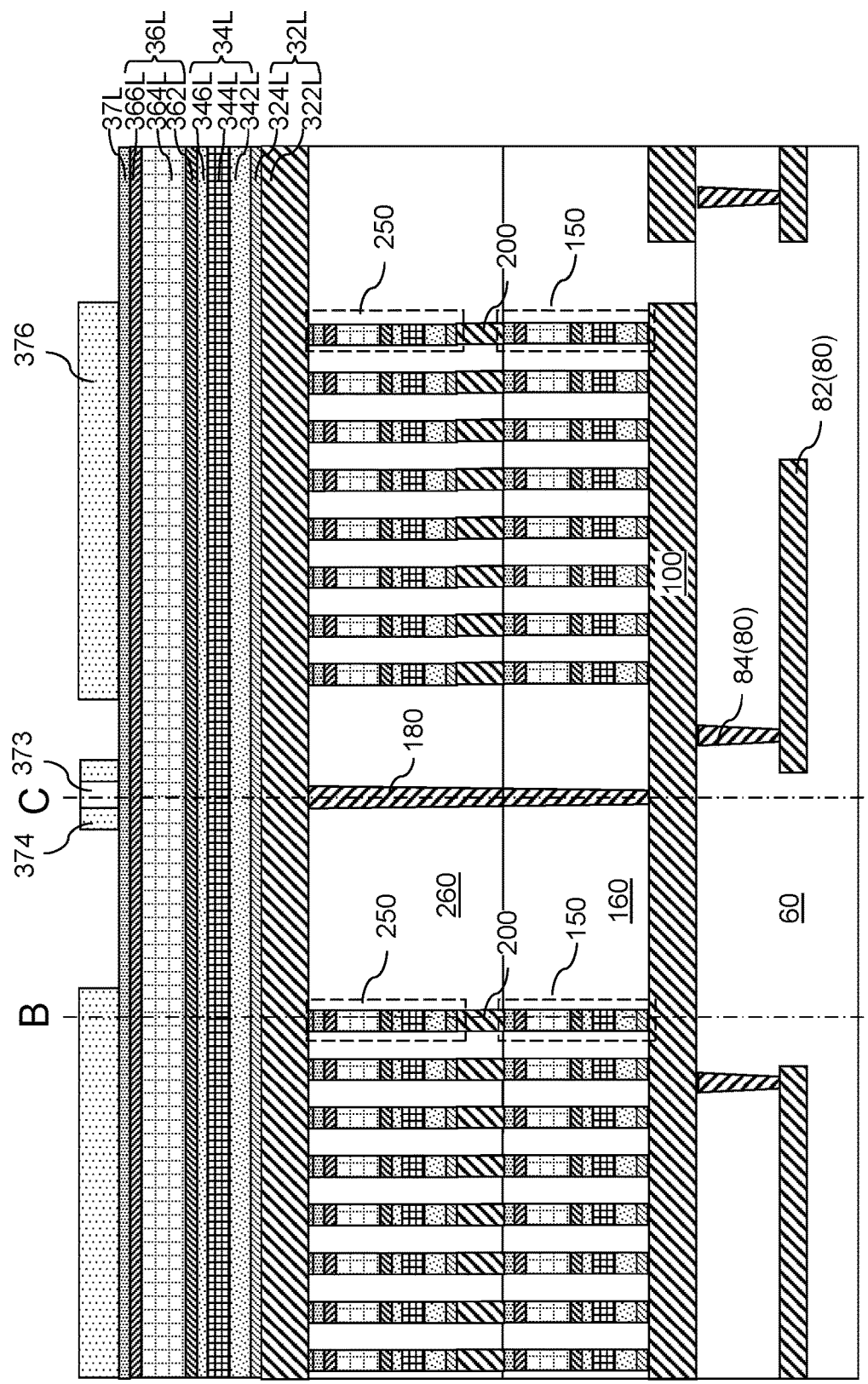
FIG. 21A is a vertical cross-sectional view of the second exemplary structure after removing the patterned photoresist layer according to the second embodiment of the present disclosure.
Figure 21C:
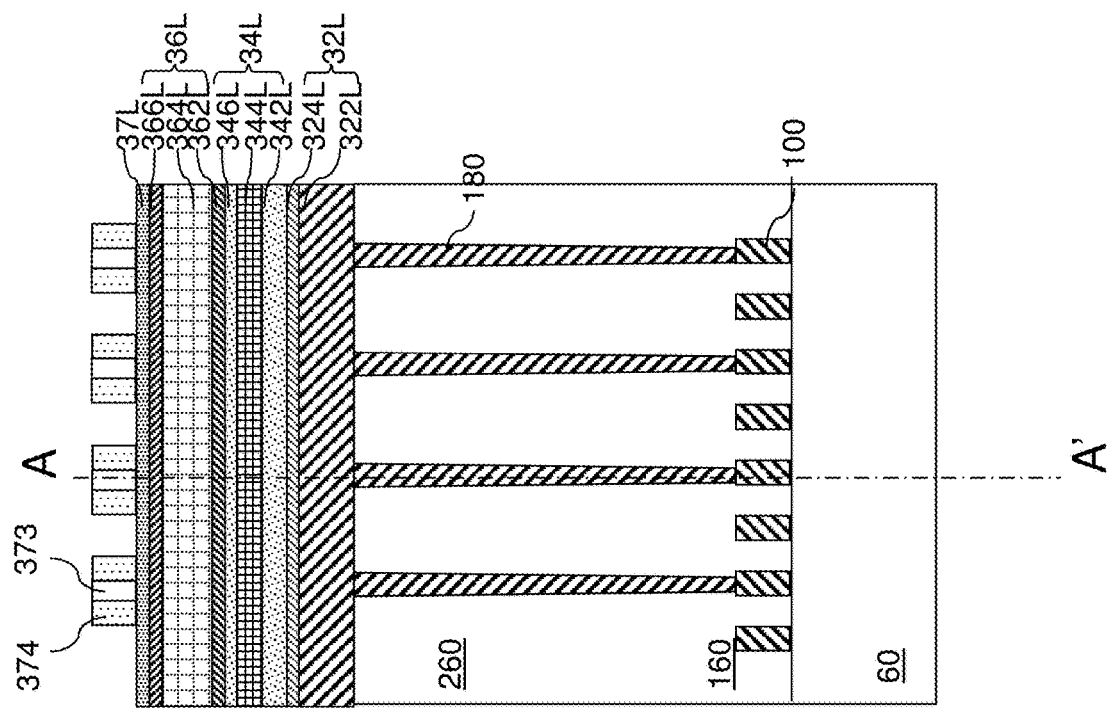
FIG. 21C is a vertical cross-sectional view of the second exemplary structure along the vertical plane C-C' of FIG. 21A.
Figure 21B:
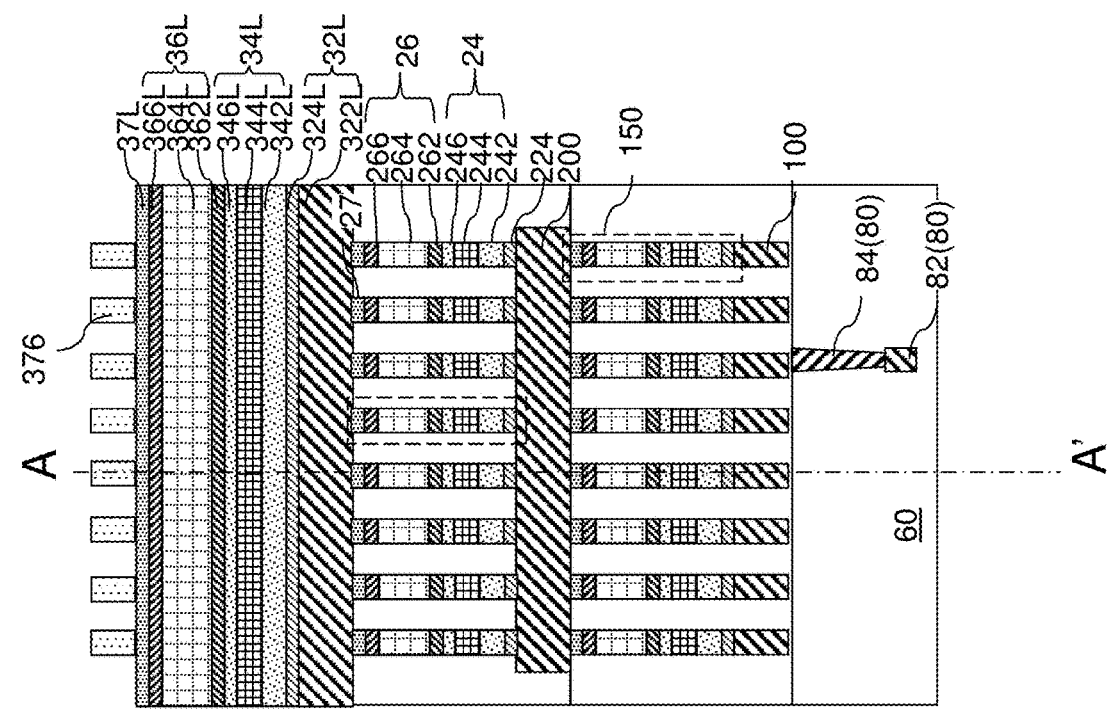
FIG. 21B is a vertical cross-sectional view of the second exemplary structure along the vertical plane B-B' of FIG. 21A.
Figure 21D:
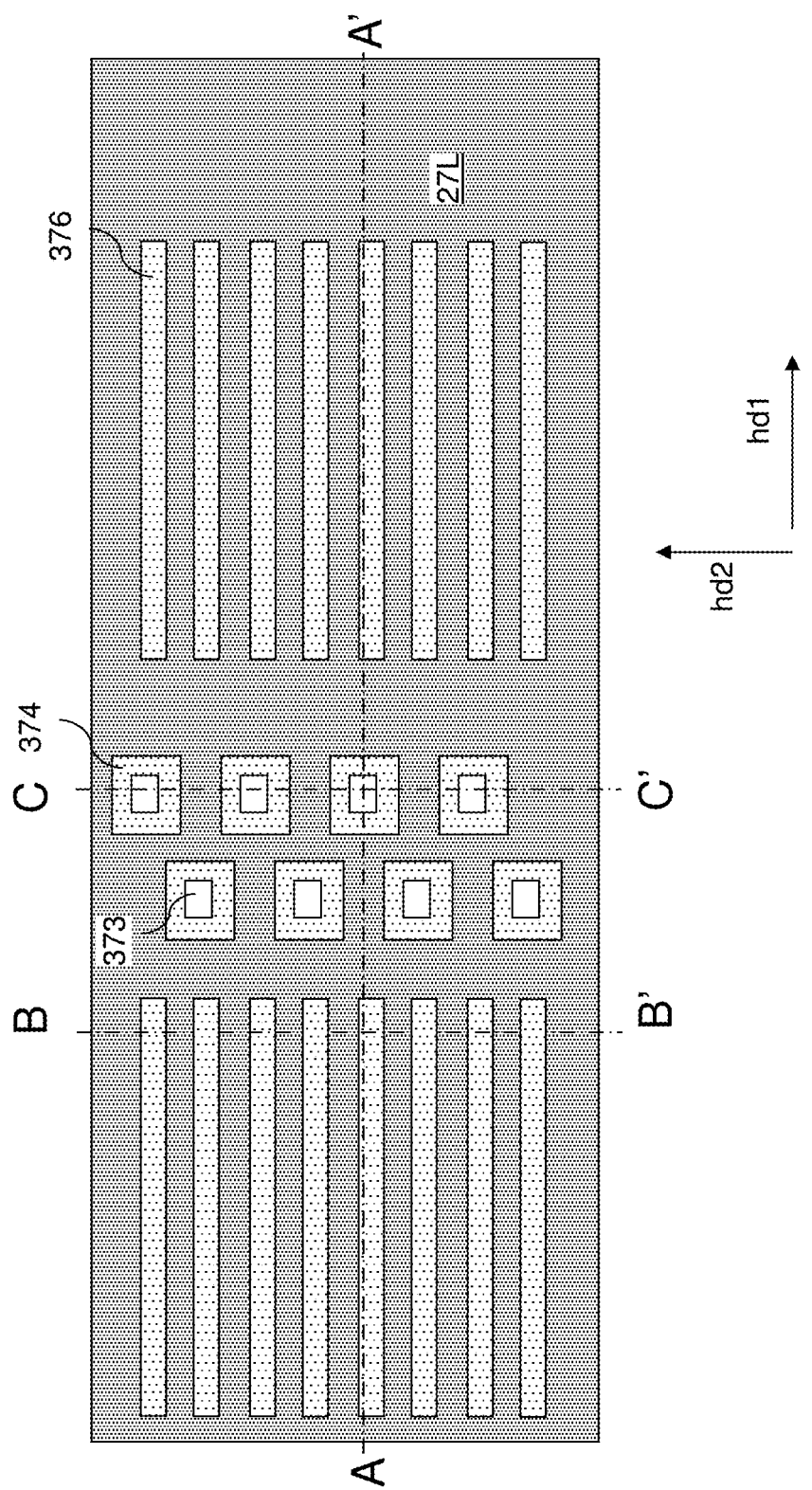
FIG. 21D is a top-down view of the second exemplary structure of FIGS. 21A-21C. The vertical plane A-A' is the plane of the vertical cross-sectional view of FIGS. 21A-21C. The vertical plane B-B' is the plane of the vertical cross-sectional view of FIGS. 21A-21C. The vertical plane C-C' is the plane of the vertical cross-sectional view of FIGS. 21A-21C.
Figure 22A:
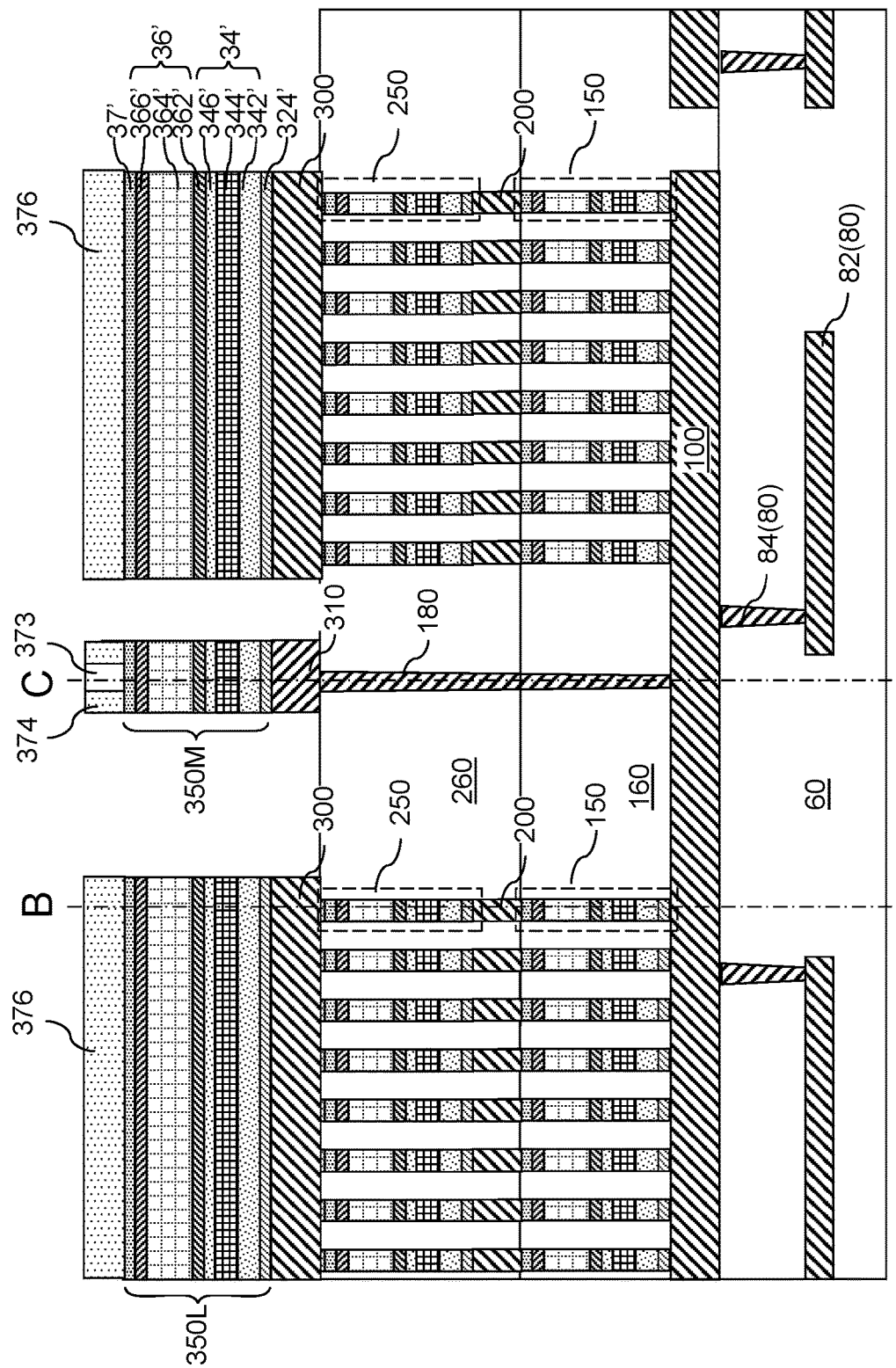
FIG. 22A is a vertical cross-sectional view of the second exemplary structure after formation of third electrically conductive lines and third stacked rail structures according to the second embodiment of the present disclosure.
Figure 22D:
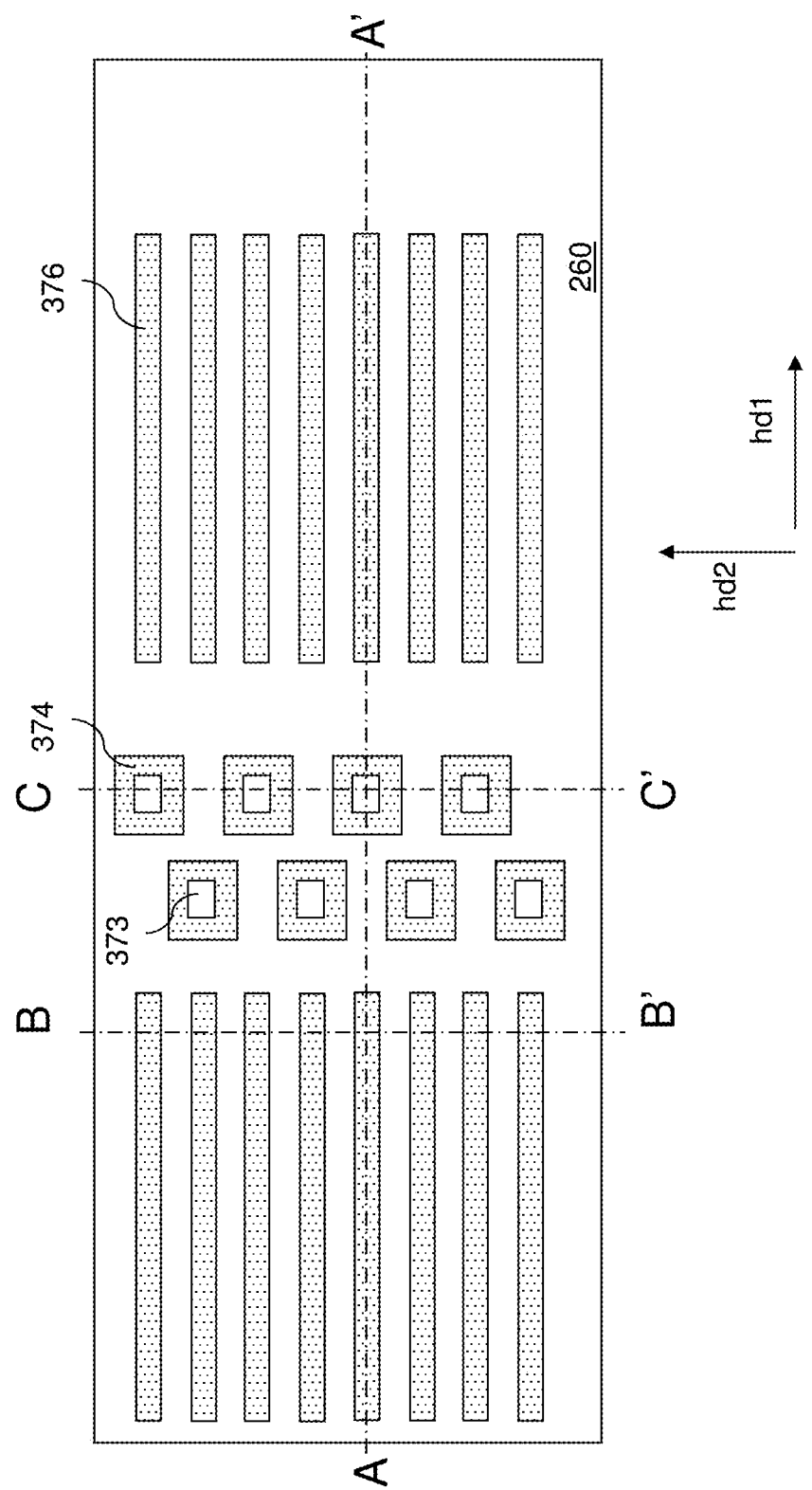
FIG. 22D is a top-down view of the second exemplary structure of FIGS. 22A-22C. The vertical plane A-A' is the plane of the vertical cross-sectional view of FIGS. 22A-22C. The vertical plane B-B' is the plane of the vertical cross-sectional view of FIGS. 22A-22C. The vertical plane C-C' is the plane of the vertical cross-sectional view of FIGS. 22A-22C.
Figure 23D:
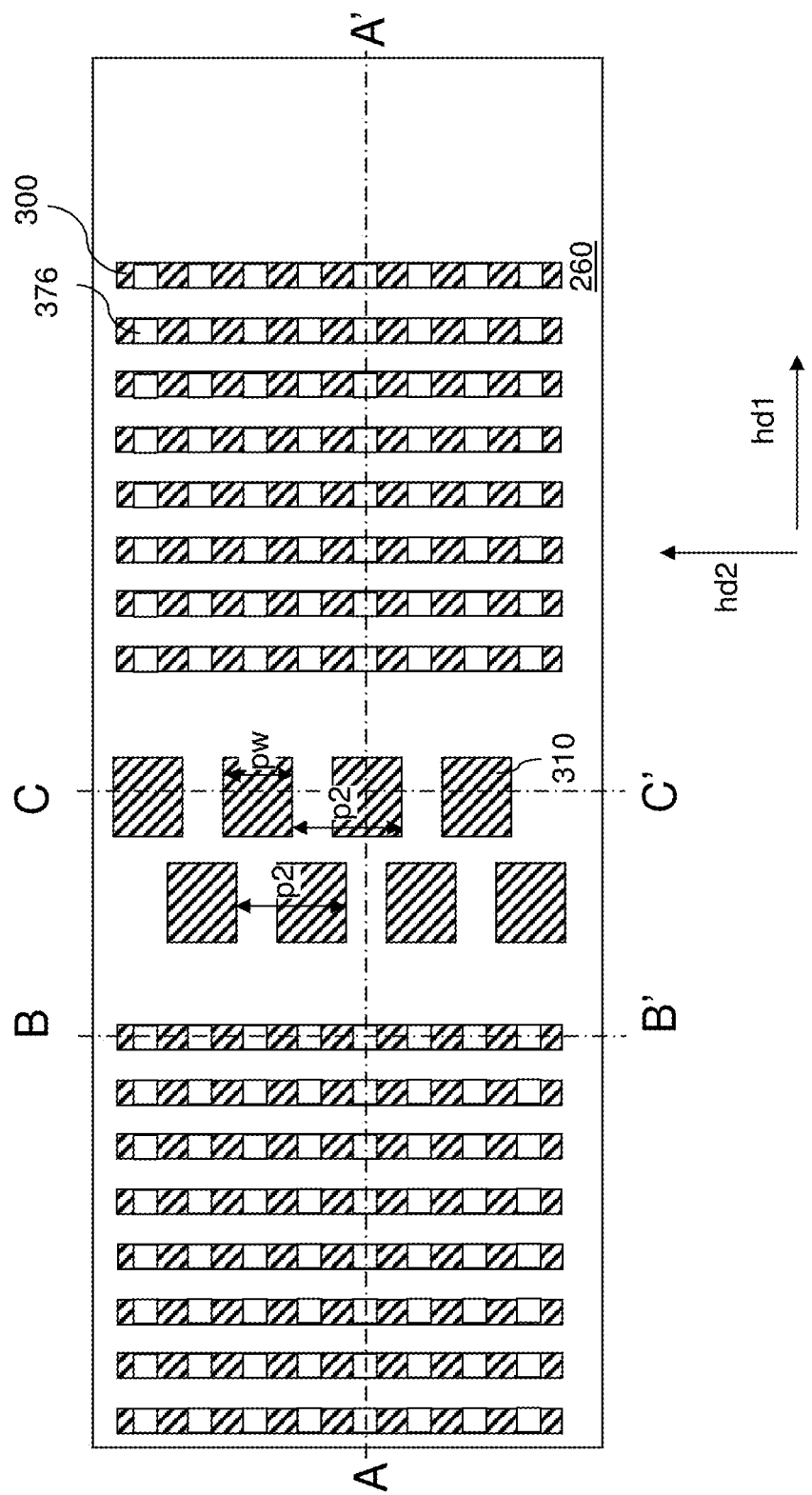
FIG. 23D is a top-down view of the second exemplary structure of FIGS. 23A-23C. The vertical plane A-A' is the plane of the vertical cross-sectional view of FIGS. 23A-23C. The vertical plane B-B' is the plane of the vertical cross-sectional view of FIGS. 23A-23C. The vertical plane C-C' is the plane of the vertical cross-sectional view of FIGS. 23A-23C.
Figure 24A:
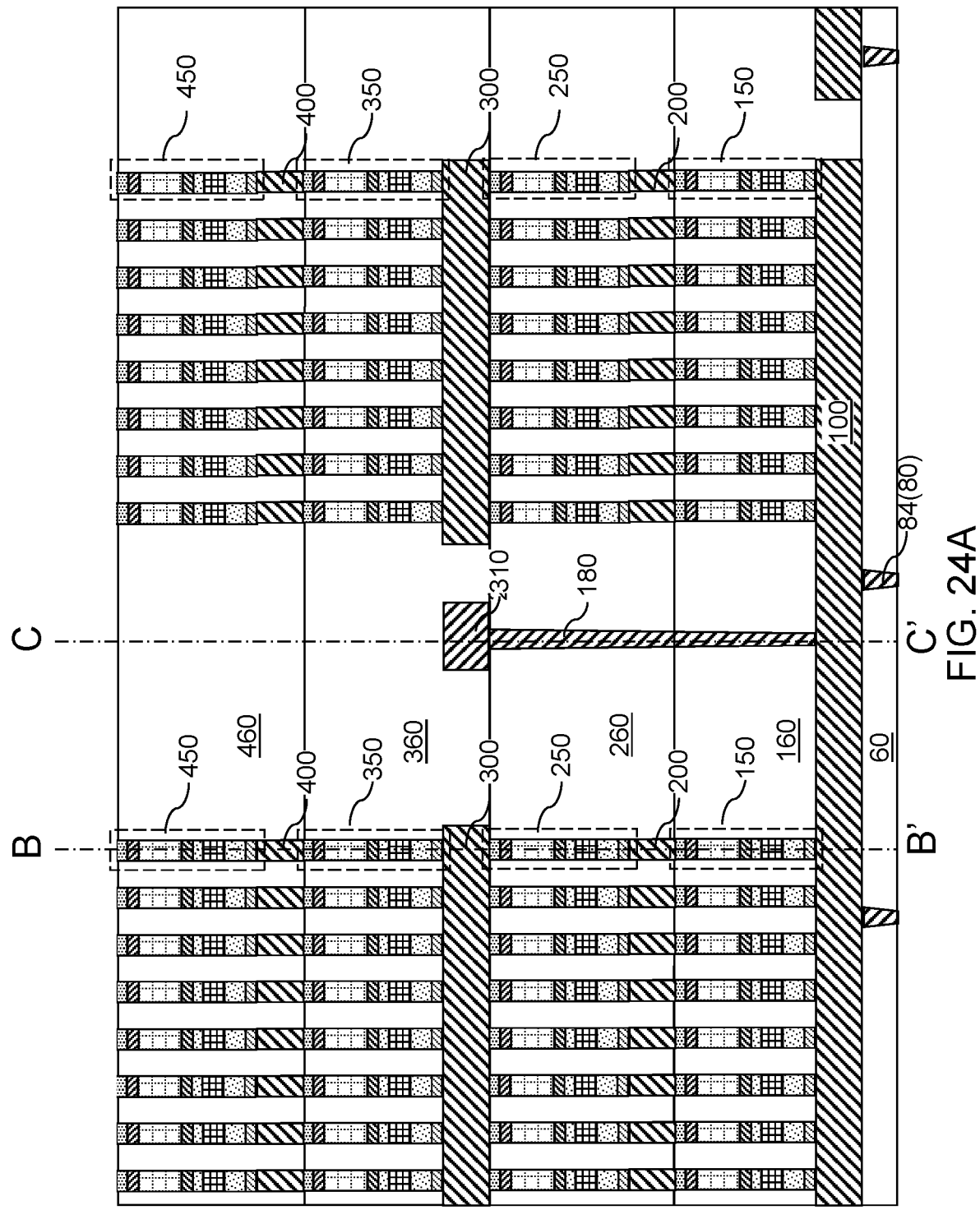
FIG. 24A is a vertical cross-sectional view of the second exemplary structure after formation of a third dielectric material layer, fourth electrically conductive lines, a two-dimensional array of fourth pillar structures, and a fourth dielectric material layer according to the second embodiment of the present disclosure.
Figure 24D:
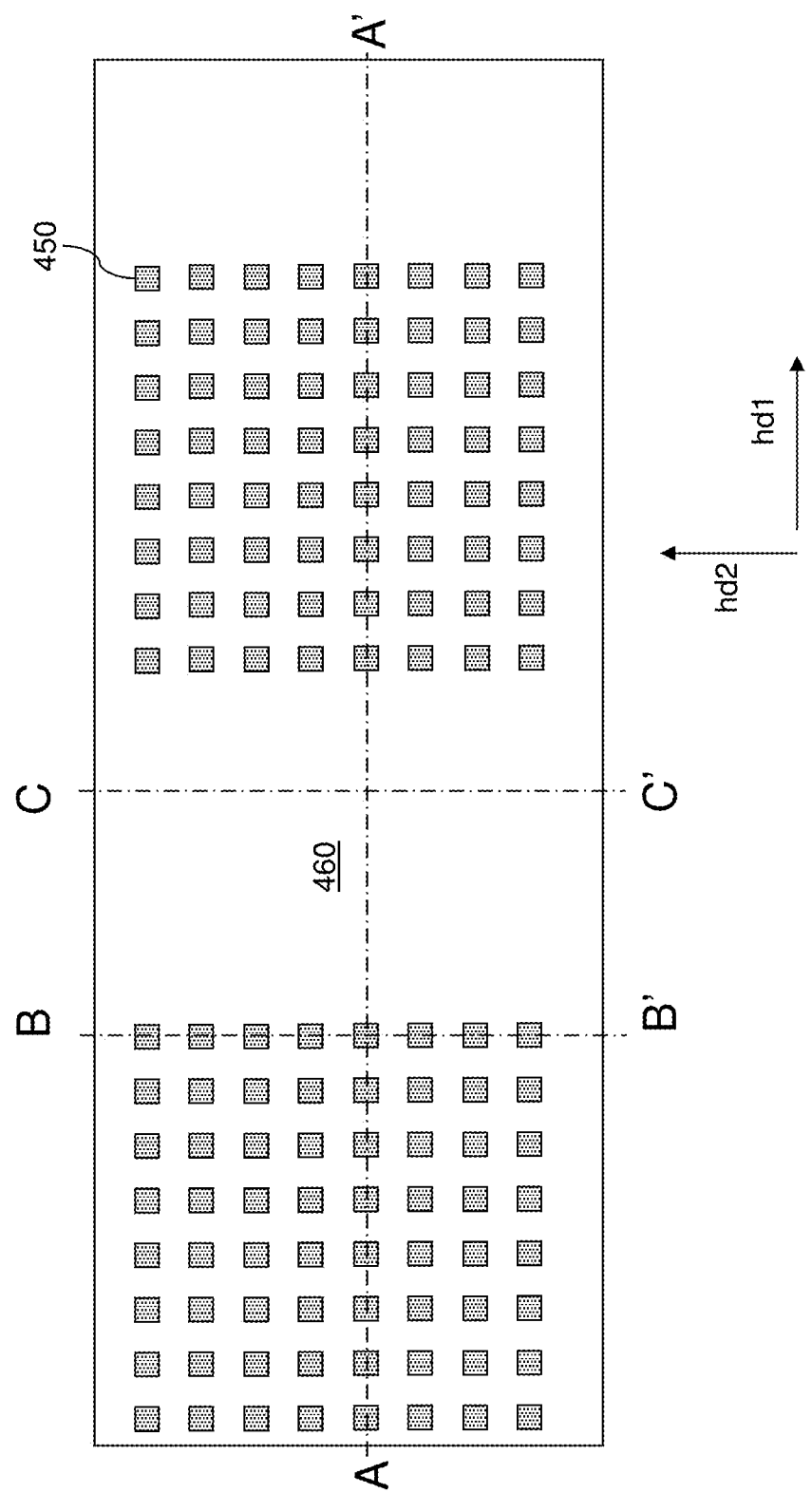
FIG. 24D is a top-down view of the second exemplary structure of FIGS. 24A-24C. The vertical plane A-A' is the plane of the vertical cross-sectional view of FIGS. 24A-24C. The vertical plane B-B' is the plane of the vertical cross-sectional view of FIGS. 24A-24C. The vertical plane C-C' is the plane of the vertical cross-sectional view of FIGS. 24A-24C.
Figure 25A:
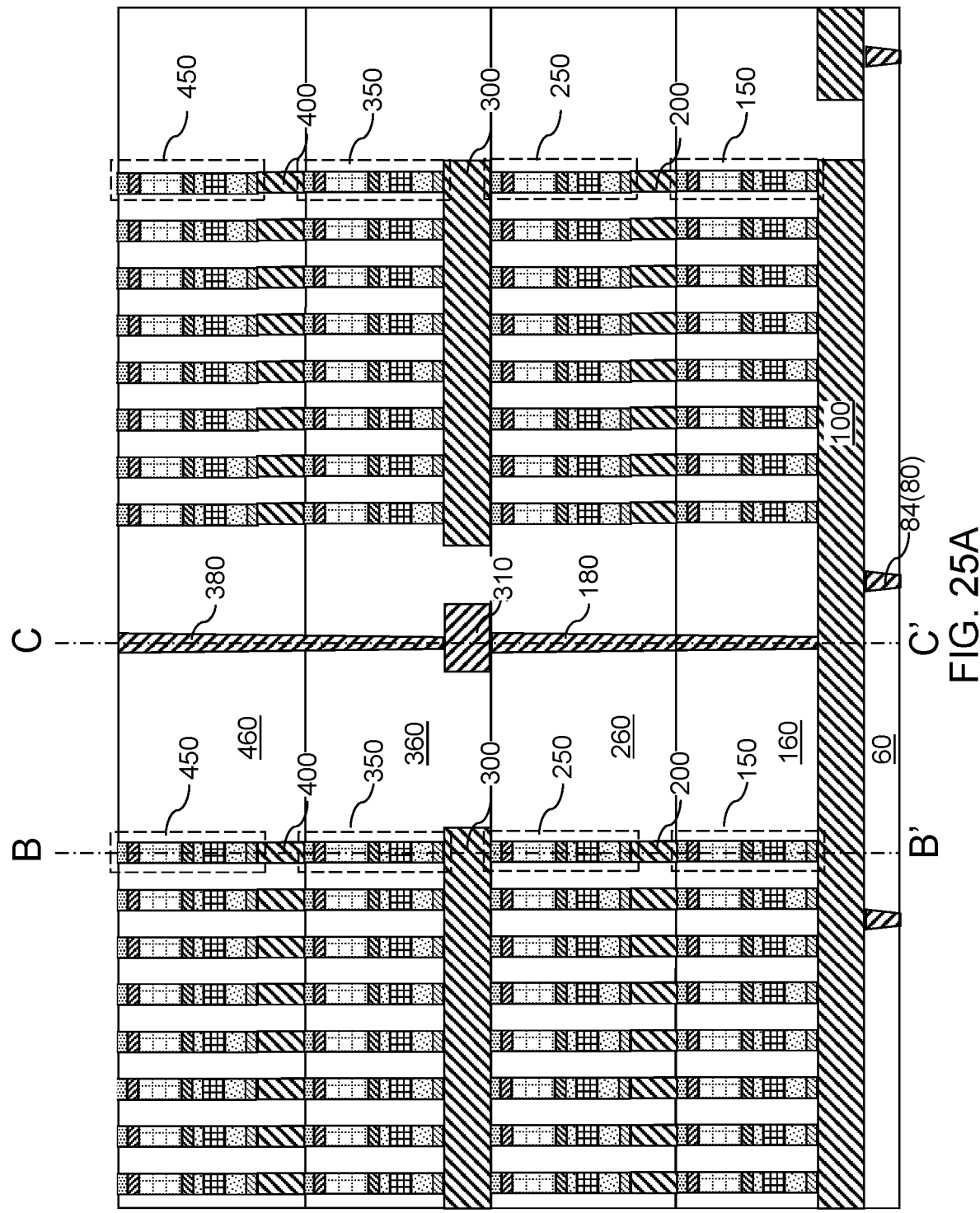
FIG. 25A is a vertical cross-sectional view of the second exemplary structure after formation of second conductive via structures according to the second embodiment of the present disclosure.
Figure 25C:
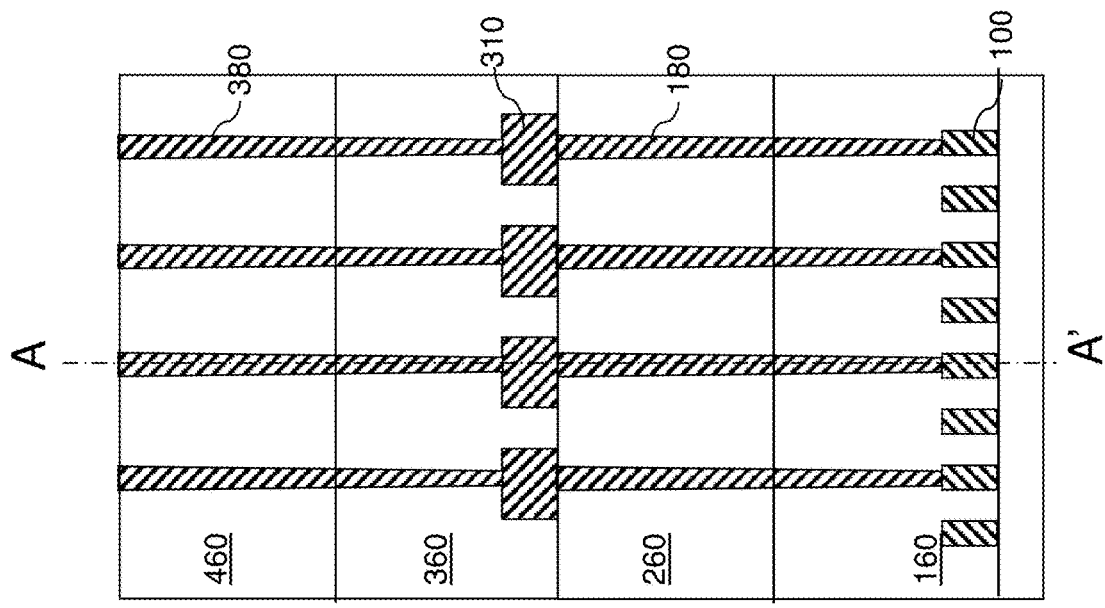
FIG. 25C is a vertical cross-sectional view of the second exemplary structure along the vertical plane C-C' of FIG. 25A.
Figure 25B:
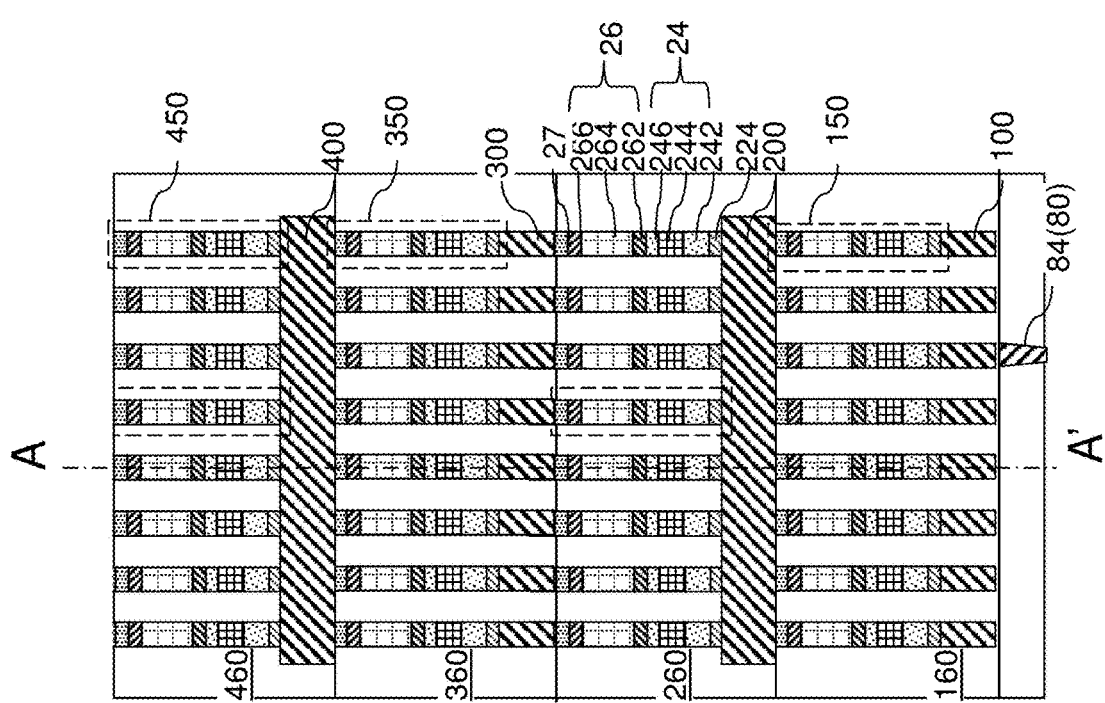
FIG. 25B is a vertical cross-sectional view of the second exemplary structure along the vertical plane B-B' of FIG. 25A.
Figure 25D:
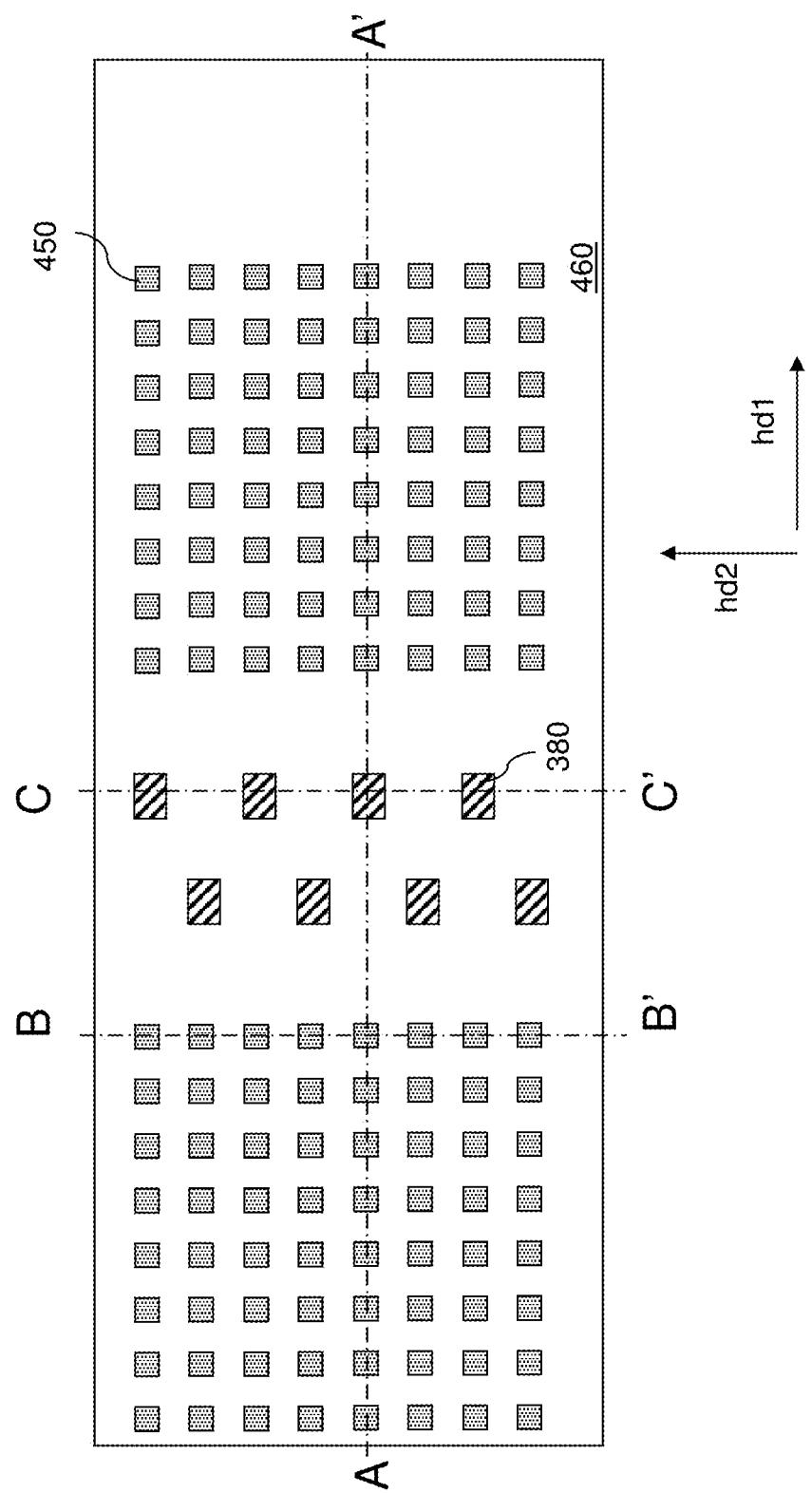
FIG. 25D is a top-down view of the second exemplary structure of FIGS. 25A-25C. The vertical plane A-A' is the plane of the vertical cross-sectional view of FIGS. 25A-25C. The vertical plane B-B' is the plane of the vertical cross-sectional view of FIGS. 25A-25C. The vertical plane C-C' is the plane of the vertical cross-sectional view of FIGS. 25A-25C.
Figure 26A:
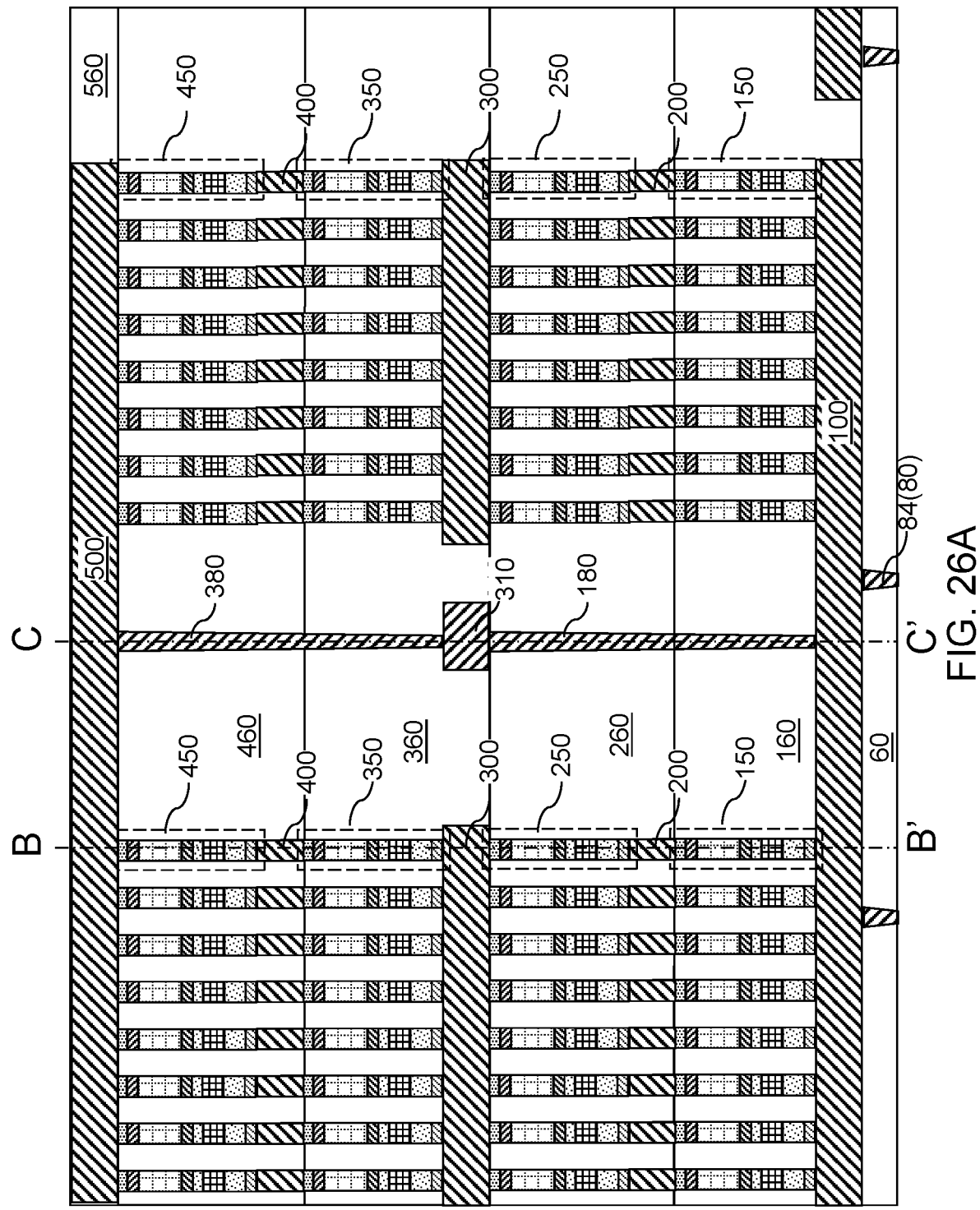
FIG. 26A is a vertical cross-sectional view of the second exemplary structure after formation of fifth electrically conductive lines according to the second embodiment of the present disclosure.
Figure 26C:
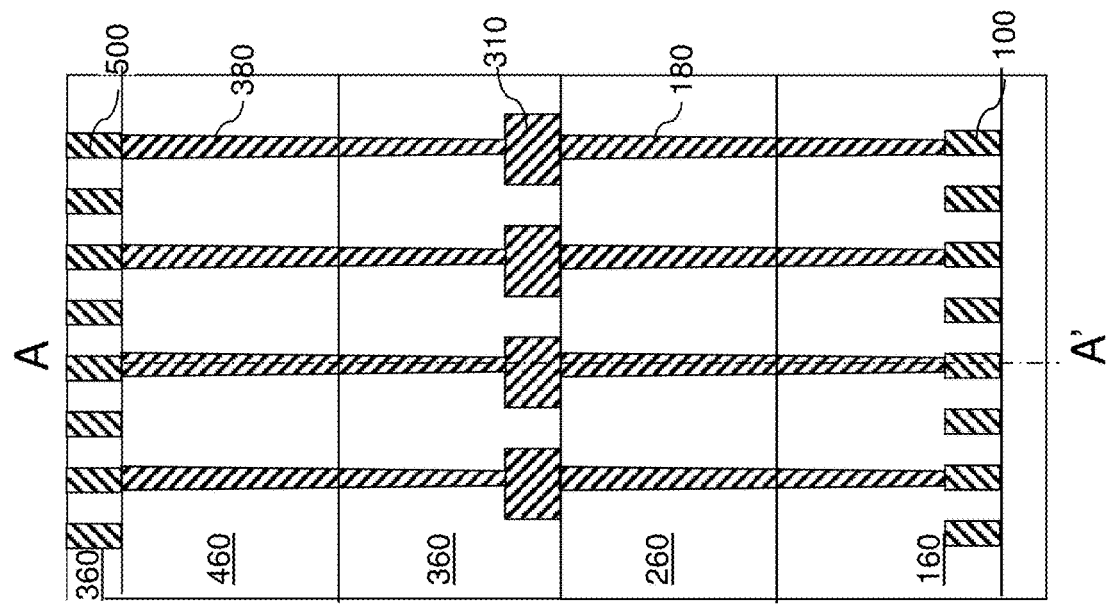
FIG. 26C is a vertical cross-sectional view of the second exemplary structure along the vertical plane C-C' of FIG. 26A.
Figure 26B:
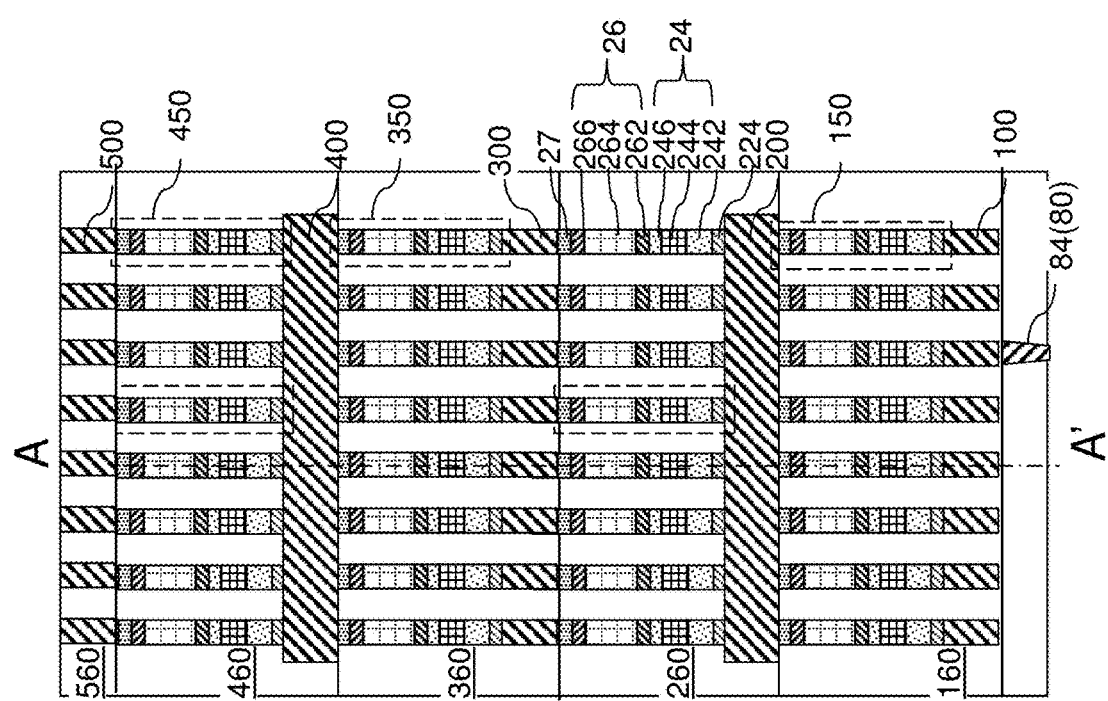
FIG. 26B is a vertical cross-sectional view of the second exemplary structure along the vertical plane B-B' of FIG. 26A.
Figure 26D:
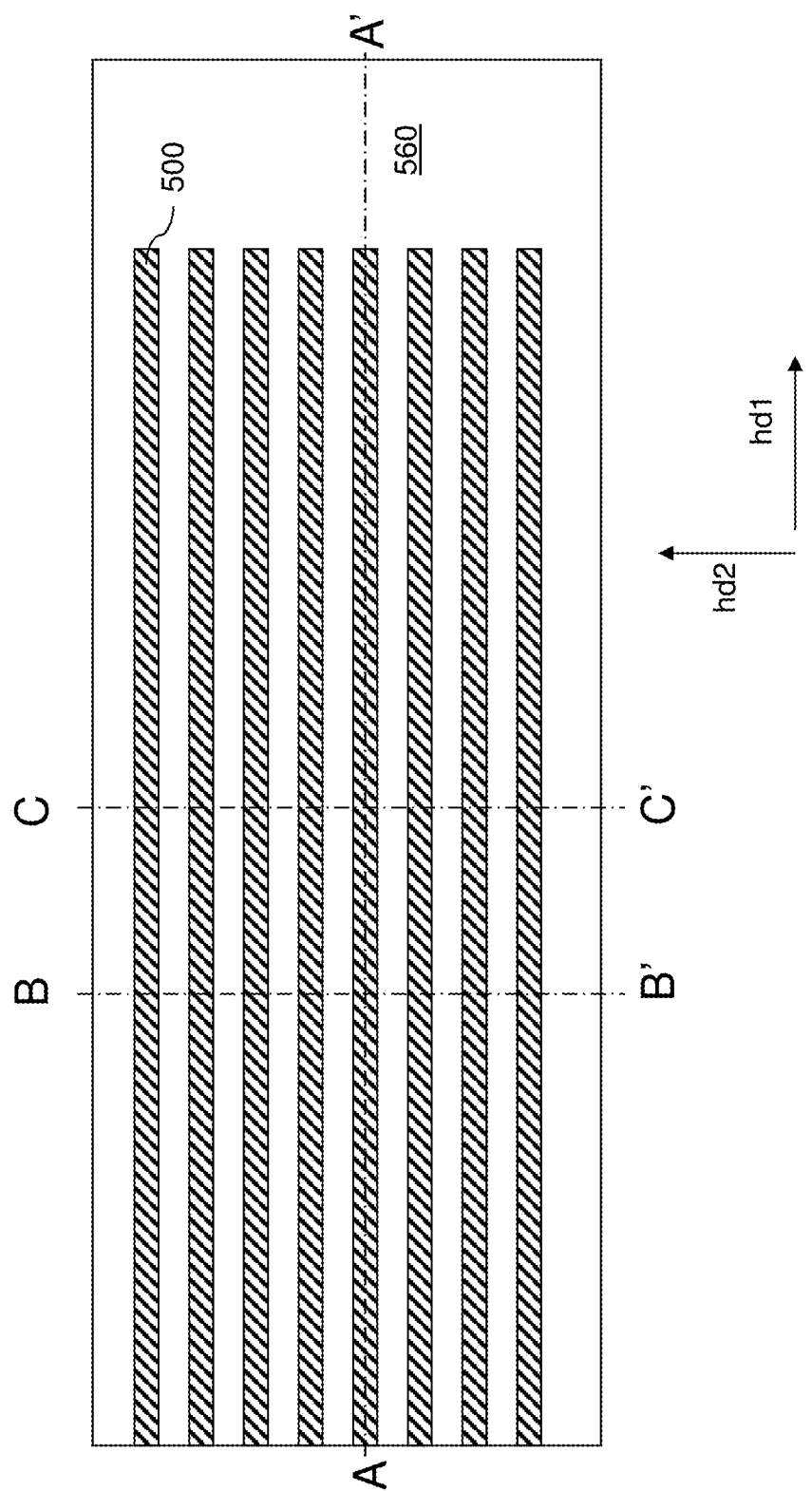
FIG. 26D is a top-down view of the second exemplary structure of FIGS. 26A-26C. The vertical plane A-A' is the plane of the vertical cross-sectional view of FIGS. 26A-26C. The vertical plane B-B' is the plane of the vertical cross-sectional view of FIGS. 26A-26C. The vertical plane C-C' is the plane of the vertical cross-sectional view of FIGS. 26A-26C.

Referring to FIGS. 19A and 19B, a spacer material layer may be conformally deposited over the third hard mask strips 375 and the hard mask plates 373 by a conformal deposition process. The spacer material layer includes a material that is different from the materials of the third hard mask strips 375 and the hard mask plates 373. For example, the third hard mask strips 375 and the hard mask plates 373 may include silicon oxide, and the spacer material layer may include silicon nitride. The thickness of the spacer material layer may be the same as the width of a row of second pillar structures 250 that are arranged along the first horizontal direction hd1.

An anisotropic etch process may be performed to remove horizontal portions of the spacer material layer. Remaining portions of the spacer material layer include first spacer material portions 376 that are formed on sidewalls of the third hard mask strips 375 and second spacer material portions 374 that are formed on sidewalls of the hard mask plates 373. Each first spacer material portion 376 laterally surrounds a respective one of the third hard mask strips 375, and each second spacer material portion 374 laterally surrounds a respective one of the hard mask plates 373. A first spacer material portion 376 may cover the entire area of two rows of second pillar structures 250 that laterally extend along the first horizontal direction hd1. A set of a hard mask plate 373 and a second spacer material portion 374 may cover the entire area of a respective one of the first conductive via structures 180.

Referring to FIGS. 20A-20D, a photoresist layer 379 may be applied over the second exemplary structure, and may be lithographically patterned to cover the hard mask plates 373 and the second spacer material portions 374. An etch process may be performed to etch the third hard mask strips 375 selective to the first spacer material portions 376. For example, if the first spacer material portions 376 include silicon nitride and if the third hard mask strips 375 include silicon oxide, a wet etch process using dilute hydrofluoric acid may be performed to remove the third hard mask strips 375 selective to the first spacer material portions 376. The photoresist layer 379 may be subsequently removed, for example, by ashing.

Referring to FIGS. 21A-21D, another photoresist layer may be applied over the second exemplary structure, and may be lithographically patterned to cover the hard mask plates 373 and the second spacer material portions 374 and to cover a predominant portion of each first spacer material portion 376 without covering the end segments of each first spacer material portion 376. Physically exposed end segments of the first spacer material portions 376 may be removed by an etch process, which may include a wet etch process or a dry etch process. Each first spacer material portion 376 may be divided into a respective pair of first spacer material portions 376 having a rectangular horizontal cross-sectional shape. Each first spacer material portion 376 that remains after the etch process may laterally extend along the first horizontal direction hd1, and may overlie a respective row of second pillar structures 250 that are arranged along the first horizontal direction hd1. The photoresist layer may be subsequently removed, for example, by ashing.

Referring to FIGS. 22A-22D, an anisotropic etch process is performed using the combination of the first spacer material portions 376, the hard mask plates 373, and the second spacer material portions 374 as an etch mask. The anisotropic etch process etches through portions of the optional third barrier layer 37L, the third phase change memory layer 36L, the third selector layer 34L, and the third conductive material layer 32L that are not masked by the combination of the first spacer material portions 376, the hard mask plates 373, and the second spacer material portions 374. The chemistry of the anisotropic etch process may be sequentially modified to sequentially etch through portions of the optional third barrier layer 37L, the third phase change memory layer 36L, the third selector layer 34L, and the third conductive material layer 32L. The anisotropic etch process may stop at, or below, the topmost surface of the second dielectric material layers 260. The patterns of the combination of the first spacer material portions 376, the hard mask plates 373, and the second spacer material portions 374 are transferred through portions of the optional third barrier layer 37L, the third phase change memory layer 36L, the third selector layer 34L, and the third conductive material layer 32L by the anisotropic etch process. Second trenches laterally extending along the first horizontal direction hd1 are formed by the anisotropic etch. The second trenches may be line trenches having a respective uniform width.

Remaining portions of the third material layer stack (32L, 34L, 36L, 37L, 375L) include third stacked rail structures 350L and third electrically conductive lines 300 that underlie the first spacer material portions 376, and plate stack structures 350M and conductive pad structures 310 that underlie combinations of the hard mask plates 373 and the second spacer material portions 374. The third electrically conductive lines 300 include patterned remaining portions of the third metal layer 322L overlying the two-dimensional array of second pillar structures 250. The conductive pad structures 310 include patterned remaining portions of the third metal layer 322L overlying the first conductive via structures 180.

The third stacked rail structures 350L are laterally spaced apart by the third trenches along the first horizontal direction hd1. Each third stacked rail structure 350L includes, from bottom to top, a third selector rail 34' that is a patterned portion of the third selector layer 34L, a third phase change memory rail 36' that is a patterned portion of the third phase change memory layer 36L, and a third barrier rail 37' that is a patterned portion of the third barrier layer 37L. The third stacked rail structures 350L laterally extend along the first horizontal direction hd1, and are laterally spaced from one another by the third trenches along the second horizontal direction hd2.

In one embodiment, each third stacked rail structure 350L may include a third metal nitride strip 324' that is a patterned portion of the third metal nitride layer 324L. In one embodiment, each third selector rail 34' may include a vertical stack of a third lower barrier material strip 342', a third ovonic threshold switch material rail 344', and a third upper barrier material strip 346'. The third lower barrier material strip 342' is a patterned portion of an optional third lower barrier material layer 342L. The third ovonic threshold switch material rail 344' is a patterned portion of the third ovonic threshold switch material layer 344L. The third upper barrier material strip 346' is a patterned portion of the optional third upper barrier material layer 346L. In one embodiment, each third phase change memory rail 36' may include, from bottom to top, a third optional lower conductive liner strip 362', a third phase change memory material rail 364', and a third optional upper conductive liner strip 366'. Each third lower conductive liner strip 362' is a patterned portion of the third lower conductive liner layer 362L, each third phase change memory material rail 364' is a patterned portion of the third phase change memory material layer 364L, and each third upper conductive liner strip 366' is a patterned portion of the third upper conductive liner layer 366L. The third stacked rail structures 350L laterally extend along the third horizontal direction hd2, and are laterally spaced from one another by the third trenches over the first dielectric material layer 160.

Each plate stack structure 350M includes, from bottom to top, a selector material plate 34" that is a patterned portion of the third selector layer 34L, a phase change memory material plate 36" that is a patterned portion of the third phase change memory layer 36L, and a barrier material plate 37" that is a patterned portion of the third barrier layer 37L. In one embodiment, each plate stack structure 350M may include a metal nitride plate 324" that is a patterned portion of the third metal nitride layer 324L.

In one embodiment, each selector material plate 34" may include a vertical stack of a third lower barrier material plate 342", a third ovonic threshold switch material plate 344", and a third upper barrier material plate 346". The third lower barrier material plate 342" is a patterned portion of an optional third lower barrier material layer 342L. The third ovonic threshold switch material plate 344" is a patterned portion of the third ovonic threshold switch material layer 344L. The third upper barrier material plate 346" is a patterned portion of the optional third upper barrier material layer 346L. In one embodiment, each phase change memory material plate 36" may include, from bottom to top, a third optional lower conductive liner plate 362", a third phase change memory material plate 364", and a third optional upper conductive liner plate 366". Each third lower conductive liner plate 362" is a patterned portion of the third lower conductive liner layer 362L, each third phase change memory material plate 364" is a patterned portion of the third phase change memory material layer 364L, and each third upper conductive liner plate 366" is a patterned portion of the third upper conductive liner layer 366L. The plate stack structures 350M laterally extend along the third horizontal direction hd2, and are laterally spaced from one another by the third trenches over the first dielectric material layer 160.

Referring to FIGS. 23A-23D, a photoresist layer may be applied over the second exemplary structure, and may be lithographically patterned to form a line and space pattern covering each area of the two-dimensional array of second pillar structures 250. Each line and space pattern may laterally extend along the second horizontal direction hd2. The plate stack structures 350M are not covered by the photoresist layer, and each second stacked rail structure 350L is covered with a plurality of patterned photoresist portions. An anisotropic etch process is performed to transfer the pattern in the photoresist layer through unmasked portions of first spacer material portions 376 and the third stacked rail structures 350L, and to remove the plate stack structures 350M. The chemistry of the anisotropic etch process may be sequentially changed to etch through the various material portions of the unmasked portions of the third stacked rail structures 350L and the entirety of the plate stack structures 350M. The etch chemistry of a terminal step of the anisotropic etch process may be selective to the material of the third electrically conductive lines 300 and the conductive pad structures 310. The hard mask plates 373, the second spacer material portions 374, and the plate stack structures 350M may be entirely removed by the anisotropic etch process.

The third stacked rail structures 350L are patterned into third pillar structures 350. In an illustrative example, each third pillar structure 350 may include, from bottom to top, a third selector pillar 34 that is a patterned portion of a third selector rail 34', a third phase change pillar 36 that is a patterned portion of a phase change memory rail 36', and an optional third barrier segment 37 that is a patterned portion of a third barrier strip 37'.

Each third selector pillar 34 is a selector element, i.e., an element that provides non-linear voltage-current characteristics such that the element functions as a conductor under third voltage bias conditions and as an insulator under third voltage bias conditions. In one embodiment, each third selector pillar 34 may include a vertical stack of a third lower barrier material portion 342 that is a patterned portion of a third lower barrier material strip 342', a third ovonic threshold switch material portion 344 that is a patterned portion of a third ovonic threshold switch material rail 344', and a third upper barrier material portion 346 that is a patterned portion of a third upper barrier material strip 346'.

Each third phase change pillar 36 is a phase change memory element, i.e., a structure that changes the resistance depending on the phase of a material therein. In one embodiment, each third phase change pillar 36 may include a vertical stack of an optional third lower conductive liner segment 362 that is a patterned portion of a third optional lower conductive liner strip 362', a third phase change memory material pillar 364 that is a patterned portion of a third phase change memory material rail 364', and a third optional upper conductive liner segment 366 that is a patterned portion of a third upper conductive liner strip 366'. The photoresist layer may be removed, for example, by ashing.

Generally, the two-dimensional array of third pillar structures 350 may comprise a third two-dimensional array of memory elements. The third two-dimensional array of memory elements may be formed on top surfaces of the third electrically conductive lines 300. Top surfaces of the third portions of the third electrically conductive lines 300 may be physically exposed between each row of third pillar structures 350 that is arranged along the first horizontal direction.

Each conductive pad structure 310 may be formed on a top surface of a respective one of the first conductive via structures 180. The conductive pad structures 310 may be arranged in multiple rows that extend along the second horizontal direction hd2. In one embodiment, conductive pad structures 310 within each row may be arranged with a regular pitch, which is herein referred to as a second pitch p2. The second pitch p2 may be integer multiples of the first pitch p1, which is the pitch of the first electrically conductive lines 100 along the second horizontal direction hd2. In one embodiment, the conductive pad structures 310 may be arranged as N rows, in which N is an integer greater than 1. In this case, the second pitch p2 may be N times the first pitch p1. Each conductive pad structure 310 may be electrically connected to a respective one of the first electrically conductive lines 100 through a respective one of the first conductive via structures 180. Each conductive pad structures 310 may have a pad width pw along the second horizontal direction hd2, which is less than the second pitch p2 and may be greater than the first pitch p1. Thus, a lateral dimension of each conductive pad structure 310 along the second horizontal direction hd2 may be greater than the pitch of the first electrically conductive lines 100 along the second horizontal direction hd2.

Referring to FIGS. 24A-24D, a third dielectric material layer 360, fourth electrically conductive lines 400, a two-dimensional array of fourth pillar structures 450, and a fourth dielectric material layer 460 may be formed in the same manner as in the first embodiment.

Referring to FIGS. 25A-25D, second via cavities may be formed through the fourth dielectric layer 460 and the third dielectric layer 360 directly on top surfaces of conductive pad structures 310. In one embodiment, the second via cavities may be formed as a plurality of rows of second via cavities such that each row of second via cavities extends along the second horizontal direction hd2 and rows of the second via cavities are laterally spaced apart along the first horizontal direction hd1.

At least one conductive material may be deposited in the second via cavities, and excess portions of the at least one conductive material may be removed from above the horizontal plane including the top surface of the fourth dielectric material layer 460. The at least one conductive material may include, for example, a metallic nitride material such as TiN, TaN, or WN, and a metallic fill material such as W, Cu, Ru, Co, Mo, or alloys thereof. Each remaining portion of the at least one conductive material that fills the second via cavities constitutes a second conductive via structure 380. Each second conductive via structure 380 may contact a top surface of a respective conductive pad structure 310. Each second conductive via structure 380 may have a top surface within the horizontal plane including the top surface of the fourth dielectric material layer 260. The second conductive via structures 380 are formed through the fourth dielectric material layer 460 and the third dielectric material layer 360, and may contact sidewalls of the fourth dielectric material layer 460 and the third dielectric material layer 360.

Interconnection structures (180, 210, 380) are formed through the dielectric material layers (160, 260, 360, 460). The interconnection structures (180, 210, 380) are formed on a top surface of a respective one of the first electrically conductive lines 100. Each interconnection structure (180, 210, 380) may comprise a vertical stack of a first conductive via structure 180 contacting a respective one of the first electrically conductive lines 100, a conductive pad structure 310 contacting a top surface of the first conductive via structure 180, and a second conductive via structure 380 contacting the conductive pad structure 310.

Referring to FIGS. 26A-26D, a metal layer may be deposited over the fourth dielectric material layer 460 and the two-dimensional array of the fourth pillar structures 450.

The metal layer may be patterned to form fifth electrically conductive lines 500. The fifth electrically conductive lines 500 may have the same pattern as the first electrically conductive lines 300. A fifth dielectric material layer 560 may be formed around the fifth electrically conductive lines 500.

In one embodiment, the fifth electrically conductive lines 500 and the fifth dielectric material layer 560 may be formed by repeating the processing steps described above. The fifth electrically conductive lines 500 may laterally extend along the first horizontal direction hd1.

Referring collectively to FIGS. 12A-26D, a memory device is provided, which comprises: a vertical stack including first electrically conductive lines 100, a two-dimensional array of first pillar structures 150, second electrically conductive lines 200, a two-dimensional array of second pillar structures 250, third electrically conductive lines 300, a two-dimensional array of third pillar structures 350, fourth electrically conductive lines 400, a two-dimensional array of fourth pillar structures 450, and fifth electrically conductive lines 500, wherein each of the first pillar structures 150, the second pillar structures 250, the third pillar structures 250, and the fourth pillar structures 450 comprises a respective memory element (such as a phase change memory material pillar); and interconnection structures (180, 310, 380) providing electrically conductive paths between the fifth electrically conductive lines 500 and the first electrically conductive lines 100, wherein each of the interconnection structures (180, 310, 380) comprises a vertical stack of a first conductive via structure 180 contacting a respective one of the first electrically conductive lines 100, a conductive pad structure 310 contacting a top surface of the first conductive via structure 180, and a second conductive via structure 380 contacting the conductive pad structure 310 and a respective one of the fifth electrically conductive lines 500.

In one embodiment, the first electrically conductive lines 100, the third electrically conductive lines 300, and the fifth electrically conductive lines 500 laterally extend along the first horizontal direction hd1; and the second electrically conductive lines 200 and the fourth electrically conductive lines 400 laterally extend along a second horizontal direction hd2 that is perpendicular to the first horizontal direction hd1.

In one embodiment, the first electrically conductive lines 100 have a first pitch p1 along a second horizontal direction hd2 that is perpendicular to the first horizontal direction hd1; and the conductive pad structures 310 have a second pitch p2 along the second horizontal direction hd2; and the second pitch p2 is the first pitch p1 times an integer N that is greater than 1. In one embodiment, of the conductive pad structures 310 has a pad width pw along the second horizontal direction hd2, wherein the pad width pw is greater than the first pitch p1.

In one embodiment, the first conductive via structures 180 are arranged in N rows that extend along the second horizontal direction hd2 and laterally spaced apart along the first horizontal direction hd1; and the second conductive via structures 380 are arranged in N rows that extend along the second horizontal direction hd2 and laterally spaced apart along the first horizontal direction hd1. In one embodiment, each row of first conductive via structures 180 includes a respective subset of the first conductive via structures 180 that are arranged along the second horizontal direction hd2 with the second pitch p2; and each row of second conductive via structures 29—includes a respective subset of the second conducive via structures 380 that are arranged along the second horizontal direction hd2 with the second pitch p2.

In one embodiment, top surfaces of the conductive pad structures 310 are located within a horizontal plane including the top surfaces of the third electrically conductive lines 300; and bottom surfaces of the conducive pad structures 310 are located within a horizontal plane including bottom surfaces of the third electrically conductive lines 300.

In one embodiment, the two-dimensional array of first pillar structures 150 is formed in a first dielectric material layer 160 that laterally surrounds a bottom portion of each of the first conductive via structures 180; and the two-dimensional array of second pillar structures 250 is formed in a second dielectric material layer 260 that laterally surrounds a bottom portion of each of the first conductive via structures 180.

In one embodiment, the two-dimensional array of first pillar structures 150 comprises a first periodic rectangular two-dimensional array of first memory elements; and the two-dimensional array of second pillar structures 250 comprises a second periodic rectangular two-dimensional array of second memory elements having a same two-dimensional periodicity as the two-dimensional array of first pillar structures 150.

In one embodiment, each pillar structure (150, 250, 350, 450) can have at least one vertical or tapered sidewall that vertically extends from a topmost surface thereof to a bottommost surface thereof. In one embodiment, each pillar structure (150, 250, 350, 450) comprises a series connection of a memory material portion and a selector material portion. In one embodiment, the memory material portion includes a phase change material; and the selector material portion includes an ovonic threshold switch material.

While a phase change memory (PCM) device was described as an exemplary memory device above, it should be understood that any other type of memory device, such as a magnetic random access memory (MRAM) or a metal oxide resistive random access memory (ReRAM) may be formed instead in lieu of the PCM device. Thus, in alternative embodiments, the series connection of a phase change memory element (such as a first phase change memory element 16) and a selector element (such as a first selector element 14) and the optional barrier plate 17 may be replaced with any other type of memory element such as a magnetic memory element or a metal oxide (e.g., titanium oxide or nickel oxide) resistive memory element with or without a selector element (e.g., a diode steering element). As such, each rectangular array of pillar structures formed at each memory level may include any type of pillar structures known in the art. All such variations are expressly contemplated herein.

The various embodiments of the present disclosure may provide interconnection structures that are less prone to electrical shorts to adjacent conductive line structures and reduces parasitic capacitance. Thus, the interconnection structures of the present disclosure are less sensitive to overlay variations during manufacturing steps, and thus, may increase the device yield during manufacturing and enhance reliability of memory devices during usage.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
a vertical stack including first electrically conductive lines, a two-dimensional array of first pillar structures, second electrically conductive lines, a two-dimensional array of second pillar structures, third electrically conductive lines, a two-dimensional array of third pillar structures, fourth electrically conductive lines, a two-dimensional array of fourth pillar structures, and fifth electrically conductive lines, wherein each of the first pillar structures, the second pillar structures, the third pillar structures, and the fourth pillar structures comprises a respective memory element; and
interconnection structures providing electrically conductive paths between the fifth electrically conductive lines and the first electrically conductive lines, wherein each of the interconnection structures comprises a vertical stack of a first conductive via structure contacting a respective one of the first electrically conductive lines, a conductive pad structure contacting a top surface of the first conductive via structure, and a second conductive via structure contacting the conductive pad structure and a respective one of the fifth electrically conductive lines,
wherein:
the first electrically conductive lines, the third electrically conductive lines, and the fifth electrically conductive lines laterally extend along the first horizontal direction;
the second electrically conductive lines and the fourth electrically conductive lines laterally extend along a second horizontal direction;
the first electrically conductive lines have a first pitch along the second horizontal direction that is perpendicular to the first horizontal direction;
the conductive pad structures have a second pitch along the second horizontal direction;
the second pitch is the first pitch times an integer N that is greater than 1; and
each of the conductive pad structures has a pad width along the second horizontal direction, wherein the pad width is greater than the first pitch.

2. The memory device of claim 1, wherein:
top surfaces of the conductive pad structures are located within a horizontal plane including the top surfaces of the third electrically conductive lines; and
bottom surfaces of the conducive pad structures are located within a horizontal plane including bottom surfaces of the third electrically conductive lines.

3. The memory device of claim 1, wherein:
the two-dimensional array of first pillar structures is formed in a first dielectric material layer that laterally surrounds a lower portion of each of the first conductive via structures; and
the two-dimensional array of second pillar structures is formed in a second dielectric material layer that laterally surrounds an upper portion of each of the first conductive via structures.

4. The memory device of claim 1, wherein:
the two-dimensional array of first pillar structures comprises a first periodic rectangular two-dimensional array of first memory elements; and
the two-dimensional array of second pillar structures comprises a second periodic rectangular two-dimensional array of second memory elements having a same two-dimensional periodicity as the two-dimensional array of first pillar structures.

5. The memory device of claim 1, wherein each first pillar structure within the two-dimensional array of first pillar structures and each second pillar structure within the two-dimensional array of second pillar structures have at least one vertical or tapered sidewall that vertically extends from a topmost surface thereof to a bottommost surface thereof.

6. The memory device of claim 5, wherein each of the first pillar structures and the second pillar structures comprises a series connection of a memory material portion and a selector material portion.

7. The memory device of claim 6, wherein:
the memory material portion includes a phase change material; and
the selector material portion includes an ovonic threshold switch material.

* * * * *